US012715890B2

(12) United States Patent
Yan et al.

(10) Patent No.: US 12,715,890 B2
(45) Date of Patent: Aug. 25, 2026

(54) TETRADENTATE METAL COMPLEX AND USE THEREOF

(71) Applicant: GUANGDONG AGLAIA OPTOELECTRONIC MATERIALS CO., LTD, Foshan (CN)

(72) Inventors: Liangliang Yan, Foshan (CN); Shaofu Chen, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 922 days.

(21) Appl. No.: 17/927,331

(22) PCT Filed: May 9, 2021

(86) PCT No.: PCT/CN2021/092526

§ 371 (c)(1), (2) Date: Nov. 22, 2022

(87) PCT Pub. No.: WO2021/254026

PCT Pub. Date: Dec. 23, 2021

(65) Prior Publication Data

US 2023/0348512 A1 Nov. 2, 2023

(30) Foreign Application Priority Data

Jun. 16, 2020 (CN) ........................ 202010549739.3

(51) Int. Cl.

| | |
|---|---|
| ***C07F 15/00*** | (2006.01) |
| ***C09K 11/06*** | (2006.01) |
| ***H10K 50/12*** | (2023.01) |
| ***H10K 50/17*** | (2023.01) |
| ***H10K 85/00*** | (2023.01) |
| ***H10K 85/30*** | (2023.01) |

(52) U.S. Cl.

CPC .......... *C07F 15/0086* (2013.01); *C09K 11/06* (2013.01); *H10K 50/12* (2023.02); *H10K 85/00* (2023.02); *H10K 85/346* (2023.02); *C09K 2211/185* (2013.01); *H10K 50/17* (2023.02)

(58) Field of Classification Search

CPC .... C07F 15/00; C07F 15/006; C07F 15/0086; C09K 11/06; C09K 2211/185; H10K 50/11; H10K 50/12; H10K 50/17; H10K 85/00; H10K 85/341; H10K 85/346; H10K 85/631; H10K 85/654; H10K 85/6572; H10K 2101/10; H10K 2101/90

See application file for complete search history.

(56) References Cited

U.S. PATENT DOCUMENTS

| | | | | |
|---|---|---|---|---|
| 11,450,813 | B2 | 9/2022 | Cho et al. | |
| 12,428,437 | B2 * | 9/2025 | Li | C07D 401/10 |
| 2016/0240800 | A1 | 8/2016 | Ma et al. | |
| 2018/0130964 | A1 * | 5/2018 | Kim | H10K 85/346 |
| 2018/0233679 | A1 | 8/2018 | Baik et al. | |
| 2019/0100546 | A1 | 4/2019 | Baik et al. | |
| 2020/0194693 | A1 | 6/2020 | Kim et al. | |
| 2020/0308207 | A1 | 10/2020 | Kim et al. | |
| 2022/0411452 | A1 * | 12/2022 | Li | C07D 471/04 |

FOREIGN PATENT DOCUMENTS

| | | | |
|---|---|---|---|
| CN | 109810106 | A | 5/2019 |
| CN | 109970811 | A | 7/2019 |
| CN | 110785863 | A | 2/2020 |

* cited by examiner

*Primary Examiner* — Elizabeth M. Dahlburg
(74) *Attorney, Agent, or Firm* — Maschoff Brennan

(57) ABSTRACT

The present invention relates to a quadridentate metal complex and application thereof. The quadridentate metal complex has a structure as shown in the following formula (1). The quadridentate metal complex provided in the present invention has the advantages of great optical, electrical, and thermal stability, high luminescence efficiency, long service life, and high color saturation, and can be used in organic light-emitting devices. In particular, the metal complex has the potential for application in the AMOLED industry as a green light-emitting phosphorescent material.

Formula (1)

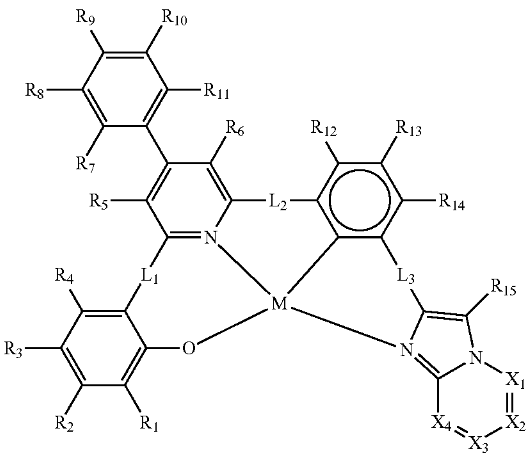

20 Claims, No Drawings

TETRADENTATE METAL COMPLEX AND USE THEREOF

TECHNICAL FIELD

The present invention relates to the technical field of organic electroluminescence, in particular to an organic light-emitting material, and specially in particular to a quadridentate metal complex and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminescence efficiency, driving voltage, and service life of OLED devices still need to be strengthened and improved.

In generally, the OLED devices include various organic functional material films with different functions between metal electrodes as basic structures, which are similar to sandwich structures. Under the driving of a current, holes and electrons are injected from a cathode and an anode, respectively. After moving a certain distance, the holes and the electrons are compounded in a light-emitting layer, and then released in the form of light or heat to achieve luminescence of the OLED. However, organic functional materials are core components of the OLED devices, and the thermal stability, photochemical stability, electrochemical stability, quantum yield, film forming stability, crystallinity, and color saturation of the materials are main factors affecting properties of the devices. In general, the organic functional materials include fluorescent materials and phosphorescent materials. The fluorescent materials are usually organic small-molecule materials, which can only use 25% of singlet luminescence, thus having low luminescence efficiency. Meanwhile, due to a spin-orbit coupling effect caused by a heavy atom effect, the phosphorescent materials can use 25% of a singlet state, and can also use 75% of energy of a triplet exciton, so that the luminescence efficiency can be improved. However, compared with the fluorescent materials, the phosphorescent materials are started later, and the thermal stability, service life, and color saturation of the materials need to be improved. Thus, the phosphorescent materials are a challenging topic. Various organometallic compounds have been developed to serve as the phosphorescent materials. For example, according to an invention patent document US20180130964, a Pt(ONCN) complex connected with a pyridinimidazole as a red phosphorescent material is disclosed. However, a novel material capable of further improving properties of organic electroluminescent devices is still expected to be developed.

SUMMARY

The present invention provides a metal complex including a structure as shown in the following formula (1) as a quadridentate ligand. An organic electroluminescent device with high properties can be obtained.

The metal complex has the advantages of high optical and electrochemical stability, high color saturation, high luminescence efficiency, and long device service life, and can be used in organic electroluminescent devices. In particular, the metal complex has the potential for application in the OLED industry as a green light-emitting dopant.

In order to achieve the above objectives, the present invention adopts the following technical solutions.

A quadridentate metal complex has a structure as shown in the following formula (1):

Formula (1)

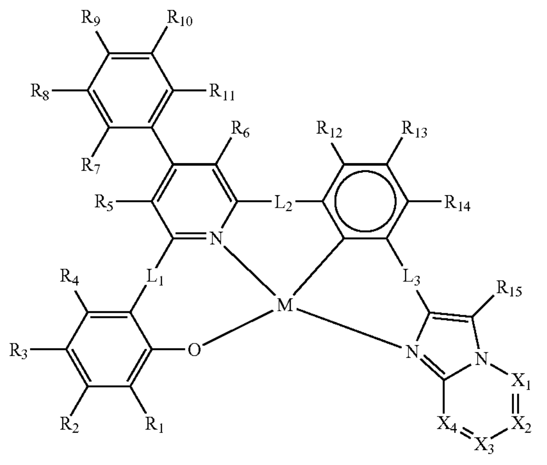

where

M is independently Pt or Pd;

each of $X_1$-$X_4$ is independently selected from N or $CR_0$;

each of $L_1$-$L_3$ is independently selected from a directly bonded single bond, O, S, Se, NRa, CRbRc, SO, $SO_2$, PO(Rd)(Re), SiRfRg, and GeRhRi;

each of $R_0$, $R_1$-$R_{15}$, and Ra-Ri is independently selected from hydrogen, deuterium, halogen, substituted or unsubstituted $C_1$-$C_{20}$ alkyl, substituted or unsubstituted $C_3$-$C_{30}$cycloalkyl, substituted or unsubstituted $C_1$-$C_{20}$heteroalkyl, substituted or unsubstituted $C_7$-$C_{30}$aralkyl, substituted or unsubstituted $C_1$-$C_{20}$alkoxy, substituted or unsubstituted $C_6$-$C_{30}$aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$heteroaryl, substituted or unsubstituted $C_3$-$C_{30}$arylsilyl, substituted or unsubstituted $C_0$-$C_{20}$ amino, cyano, nitrile, isonitrile, and phosphino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl includes any one or more of S, O, and N.

Preferably, the quadridentate metal complex has a structure as shown in the following formula (2):

Formula (2)

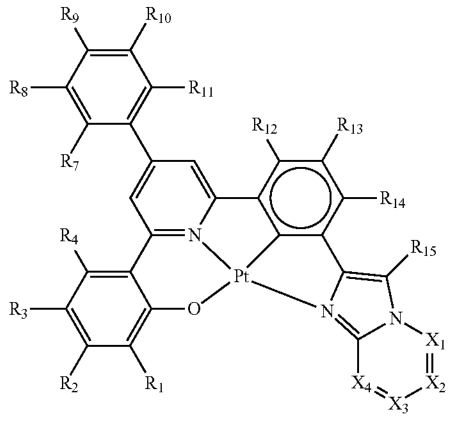

where $X_1$-$X_4$, $R_1$-$R_4$, and $R_7$-$R_{15}$ are defined the same as above.

More preferably, the quadridentate metal complex has a structure as shown in the following formula (3).

Formula (3)

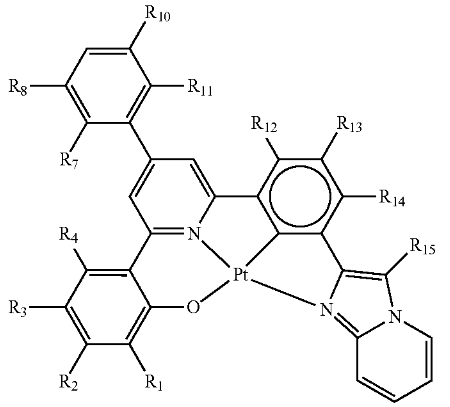

where $R_1$-$R_4$, $R_7$, $R_8$, and $R_{10}$-$R_{15}$ are defined the same as above.

Further preferably, the $R_7$, the $R_8$, the $R_{10}$, and the $R_{11}$ are independently selected from hydrogen, deuterium, halogen, substituted or unsubstituted $C_1$-$C_8$ alkyl, substituted or unsubstituted $C_3$-$C_{10}$cycloalkyl, substituted or unsubstituted $C_1$-$C_8$heteroalkyl, substituted or unsubstituted $C_7$-$C_{10}$aralkyl, substituted or unsubstituted $C_6$-$C_{10}$ aryl, or substituted or unsubstituted $C_3$-$C_{10}$heteroaryl.

Further preferably, at least one of the $R_7$, the $R_8$, the $R_{10}$, and the $R_{11}$ is not hydrogen.

Further preferably, the $R_{15}$ is independently selected from substituted or unsubstituted $C_6$-$C_{30}$ aryl, or substituted or unsubstituted $C_3$-$C_{30}$heteroaryl.

Further preferably, the $R_{15}$ is benzene, or is as shown in the following structural formula (9) or formula (10):

Formula (9)

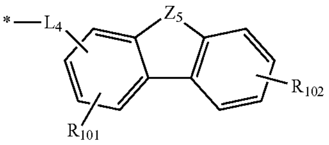

Formula (10)

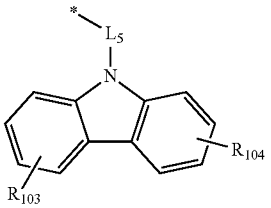

where

* refers to a connection position;

$Z_5$ is O, S, Se, $NR_{105}$, $CR_{106}R_{107}$, SO, $SO_2$, $PO(R_{108})(R_{109})$, $SiR_{110}R_{111}$, or $GeR_{112}R_{113}$;

the number of $R_{101}$-$R_{104}$ is a maximum substitution number;

$L_4$ and $L_5$ are a single bond, substituted or unsubstituted $C_1$-$C_{20}$alkylene, substituted or unsubstituted $C_3$-$C_{30}$cycloalkylene, substituted or unsubstituted $C_1$-$C_{20}$heteroalkylene, substituted or unsubstituted $C_7$-$C_{30}$aralkylene, substituted or unsubstituted $C_2$-$C_{20}$alkenylene, substituted or unsubstituted $C_3$-$C_{30}$alkylene silyl, substituted or unsubstituted $C_6$-$C_{30}$arylidene, substituted or unsubstituted $C_3$-$C_{30}$heteroarylidene, substituted or unsubstituted $C_3$-$C_{30}$arylidene silyl, and substituted or unsubstituted $C_0$-$C_{20}$imino;

each of $R_{101}$-$R_{113}$ is independently selected from hydrogen, deuterium, halogen, substituted or unsubstituted $C_1$-$C_{20}$ alkyl, substituted or unsubstituted $C_3$-$C_{30}$cycloalkyl, substituted or unsubstituted $C_1$-$C_{20}$heteroalkyl, substituted or unsubstituted $C_7$-$C_{30}$aralkyl, substituted or unsubstituted $C_1$-$C_{20}$alkoxy, substituted or unsubstituted $C_6$-$C_{30}$aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$heteroaryl, substituted or unsubstituted $C_3$-$C_{30}$arylsilyl, substituted or unsubstituted $C_0$-$C_{20}$ amino, cyano, nitrile, isonitrile, and phosphino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl includes any one or more of S, O, and N.

Further preferably, the $Z_5$ is O, $NR_{105}$, or $CR_{106}R_{107}$;

the $L_4$ and the $L_5$ are a single bond;

and each of the $R_{101}$-$R_{107}$ is independently selected from hydrogen, deuterium, halogen, substituted or unsubstituted $C_1$-$C_8$ alkyl, substituted or unsubstituted $C_3$-$C_{10}$cycloalkyl, substituted or unsubstituted $C_1$-$C_8$heteroalkyl, substituted or unsubstituted $C_7$-$C_{10}$aralkyl, substituted or unsubstituted $C_6$-$C_{10}$ aryl, and substituted or unsubstituted $C_3$-$C_{10}$heteroaryl.

Further preferably, the $R_{12}$ and the $R_{13}$, or the $R_{13}$ and the $R_{14}$ are connected to form one of fused ring structures as shown in the following formula (4) to formula (7):

Formula (4)

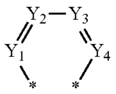

Formula (5)

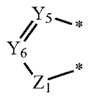

Formula (6)

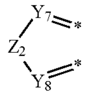

Formula (7)

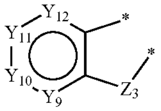

where

* refers to a connection position;

$Z_1$-$Z_3$ are selected from O, S, Se, NRx, or CRyRz;

$Y_1$-$Y_{12}$ are, identically or differently on each occurrence, $CR_0$ or N;

each of $R_0$, Rx, Ry, and Rz is independently selected from hydrogen, deuterium, halogen, substituted or unsubstituted $C_1$-$C_{20}$ alkyl, substituted or unsubstituted $C_3$-$C_{30}$cycloalkyl, substituted or unsubstituted $C_1$-$C_{20}$heteroalkyl, substituted or unsubstituted $C_7$-$C_{30}$aralkyl, substituted or unsubstituted $C_1$-$C_{20}$alkoxy, substituted or unsubstituted $C_6$-$C_{30}$aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$heteroaryl, substituted or unsubstituted $C_3$-$C_{30}$arylsilyl, substituted or unsubstituted $C_0$-$C_{20}$ amino, cyano, nitrile, isonitrile, and phosphino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl includes any one or more of S, O, and N.

Further preferably, the $Z_1$-$Z_3$ are selected from O, NRx, or CRyRz;

the $Y_1$-$Y_{12}$ are, identically or differently on each occurrence, $CR_0$ or N;

and each of the $R_0$, the Rx, the Ry, and the Rz is independently selected from hydrogen, halogen, substituted or unsubstituted $C_1$-$C_8$ alkyl, substituted or unsubstituted $C_3$-$C_{10}$cycloalkyl, substituted or unsubstituted $C_1$-$C_5$heteroalkyl, substituted or unsubstituted $C_7$-$C_{10}$aralkyl, substituted or unsubstituted $C_6$-$C_{10}$ aryl, and substituted or unsubstituted $C_3$-$C_{10}$heteroaryl.

Further preferably, at least one of the $R_1$ and the $R_2$ is not hydrogen.

Further preferably, the $R_1$ and the $R_2$, or the $R_2$ and the $R_3$, or the $R_3$ and the $R_4$ are connected to form a fused ring structure as shown in the following formula (8):

Formula (8)

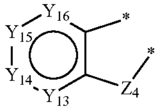

where

* refers to a connection position;

$Z_4$ refers to O, S, Se, $NR_{201}$, $CR_{202}R_{203}$, SO, $SO_2$, $PO(R_{204})(R_{205})$, $SiR_{206}R_{207}$, or $GeR_{208}R_{209}$;

$Y_{13}$-$Y_{16}$ are, identically or differently on each occurrence, $CR_0$ or N;

each of $R_0$ and $R_{201}$-$R_{209}$ is independently selected from hydrogen, deuterium, halogen, substituted or unsubstituted $C_1$-$C_{20}$ alkyl, substituted or unsubstituted $C_3$-$C_{30}$cycloalkyl, substituted or unsubstituted $C_1$-$C_{20}$heteroalkyl, substituted or unsubstituted $C_7$-$C_{30}$aralkyl, substituted or unsubstituted $C_1$-$C_{20}$alkoxy, substituted or unsubstituted $C_6$-$C_{30}$aryloxy, substituted or unsubstituted $C_2$-$C_{20}$alkenyl, substituted or unsubstituted $C_3$-$C_{30}$ silyl, substituted or unsubstituted $C_6$-$C_{30}$ aryl, substituted or unsubstituted $C_3$-$C_{30}$heteroaryl, substituted or unsubstituted $C_3$-$C_{30}$arylsilyl, substituted or unsubstituted $C_0$-$C_{20}$ amino, cyano, nitrile, isonitrile, and phosphino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl includes any one or more of S, O, and N.

Further preferably, the $Z_4$ refers to O, $NR_{201}$, or $CR_{202}R_{203}$;

the $Y_{13}$-$Y_{16}$ are, identically or differently on each occurrence, $CR_0$ or N;

and each of the $R_0$ and the $R_{201}$-$R_{209}$ is independently selected from hydrogen, deuterium, halogen, substituted or unsubstituted $C_1$-$C_8$ alkyl, substituted or unsubstituted $C_3$-$C_{10}$cycloalkyl, substituted or unsubstituted $C_1$-$C_8$heteroalkyl, substituted or unsubstituted $C_7$-$C_{10}$aralkyl, substituted or unsubstituted $C_1$-$C_8$alkoxy, substituted or unsubstituted $C_6$-$C_{10}$aryloxy, substituted or unsubstituted $C_6$-$C_{10}$ aryl, and substituted or unsubstituted $C_3$-$C_{10}$heteroaryl.

As a preferred metal complex, the "preferred" refers to having the following structural formulas:

CPD 1

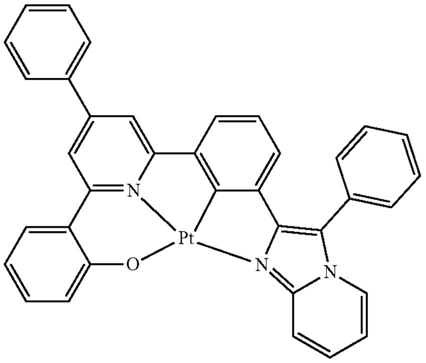

-continued
CPD 2
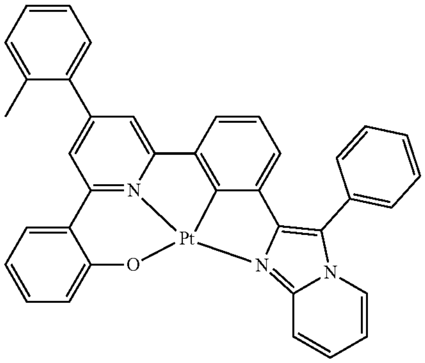
CPD 3
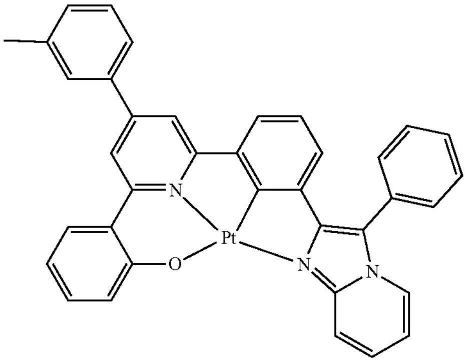
CPD 4
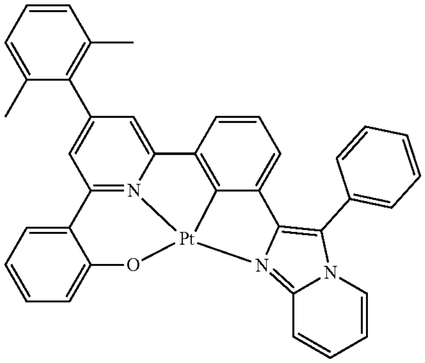
CPD 5
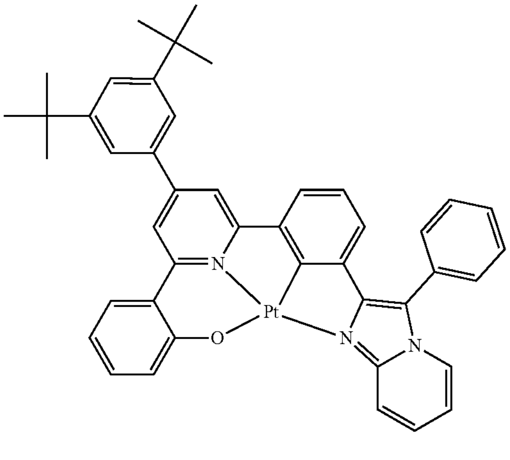
-continued
CPD 6
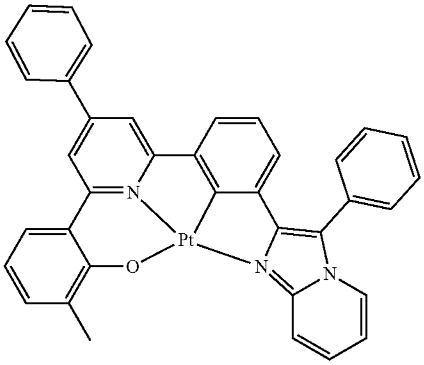
CPD 7
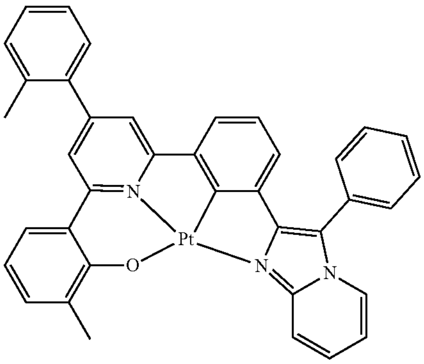
CPD 8
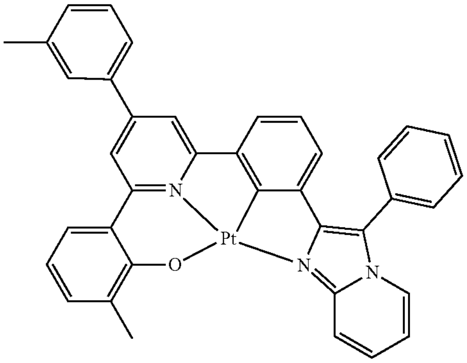
CPD 9
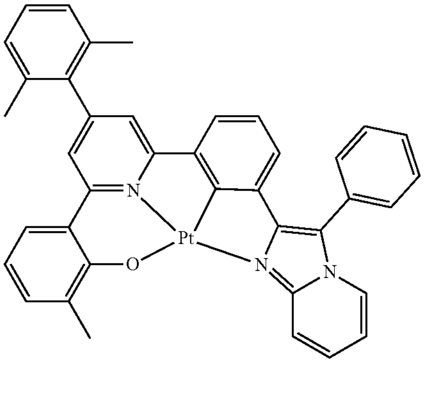

-continued
CPD 10
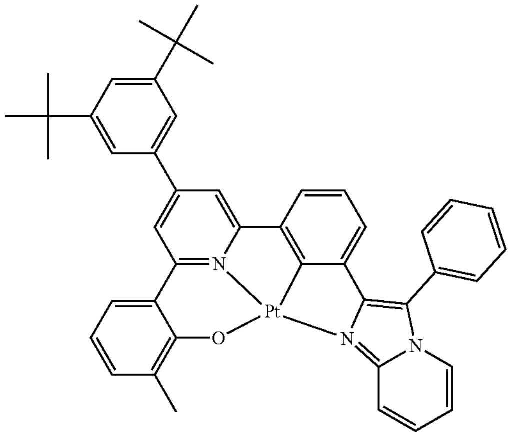
CPD 11
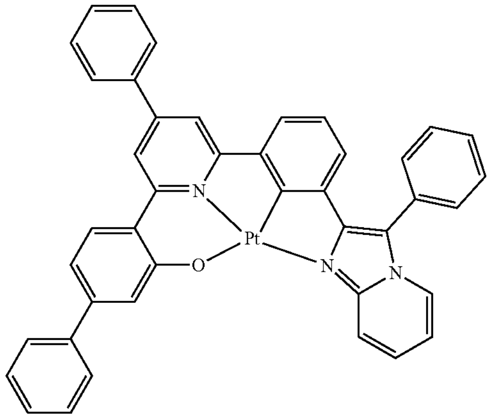
CPD 12
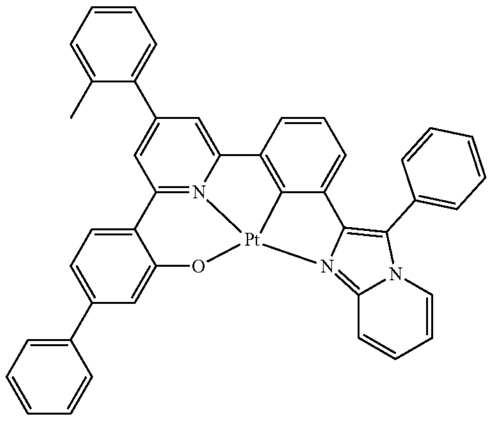
-continued
CPD 13
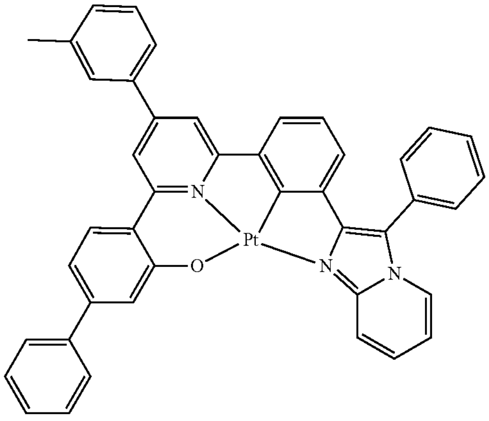
CPD 14
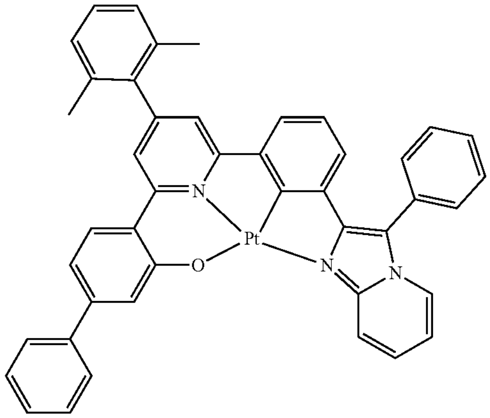
CPD 15
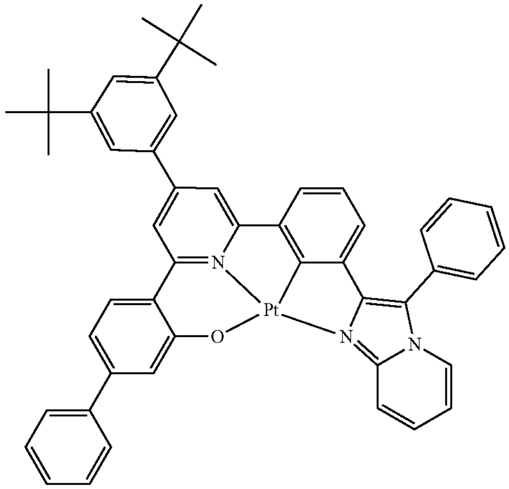

CPD 16
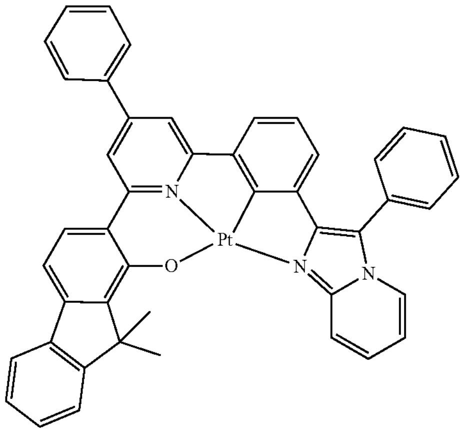
CPD 17
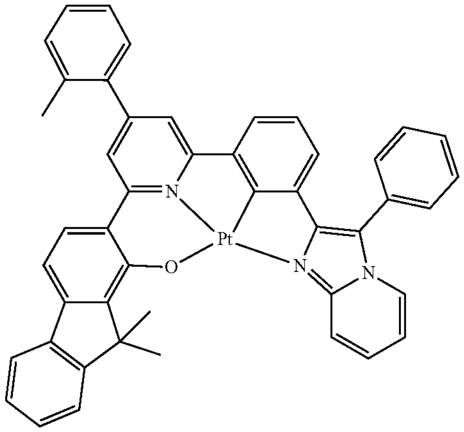
CPD 18
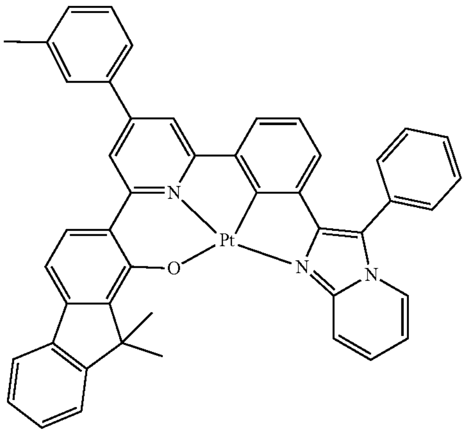
CPD 19
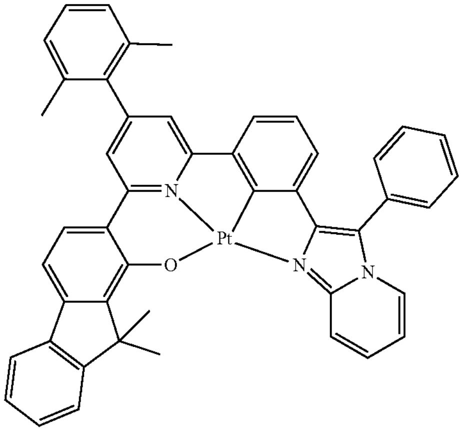
CPD 20
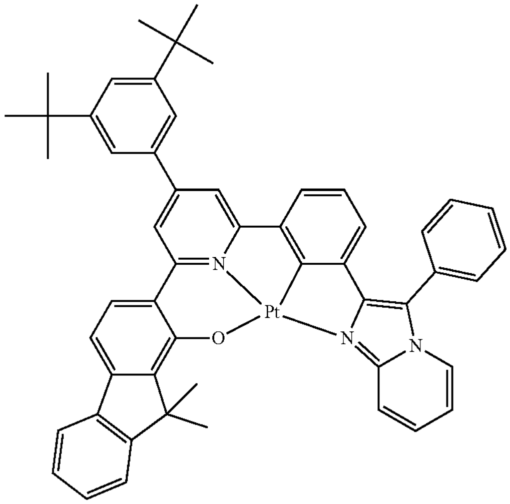
CPD 21
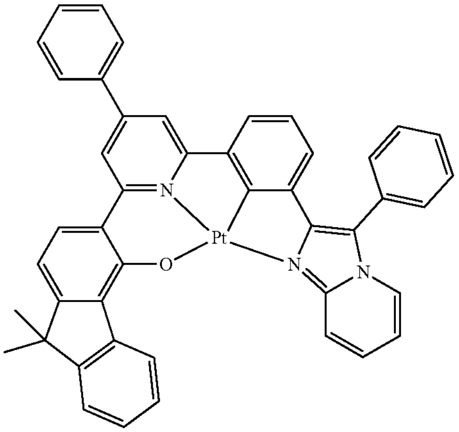

-continued
CPD 22
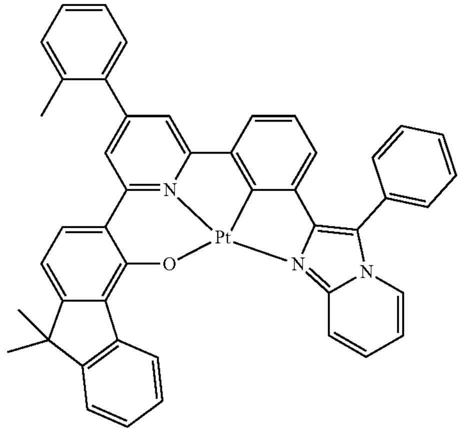
CPD 23
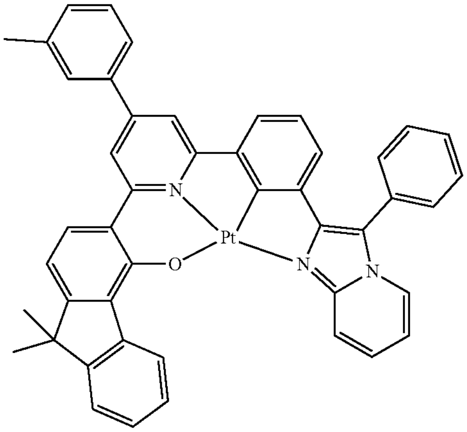
CPD 24
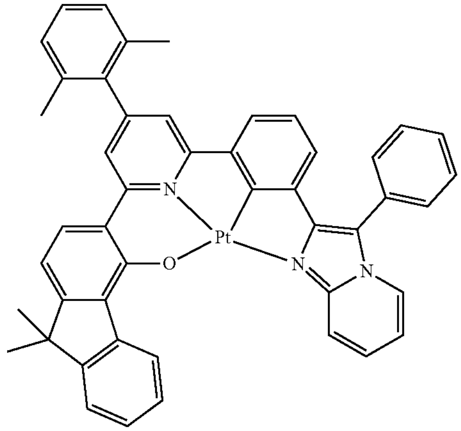
-continued
CPD 25
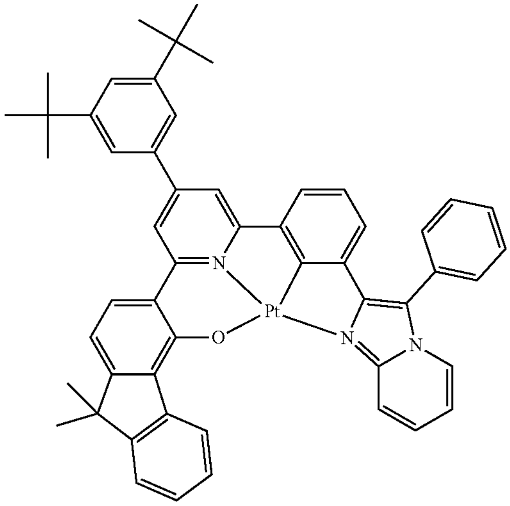
CPD 26
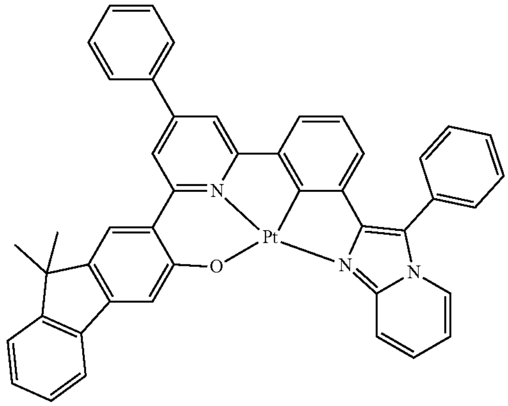
CPD 27
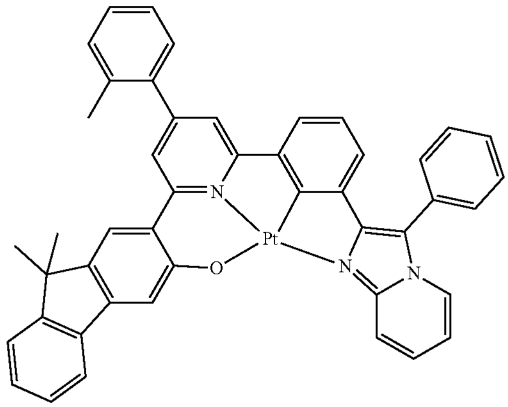

-continued
CPD 28
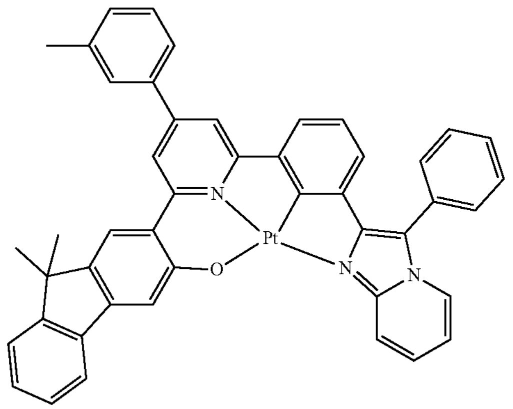
CPD 29
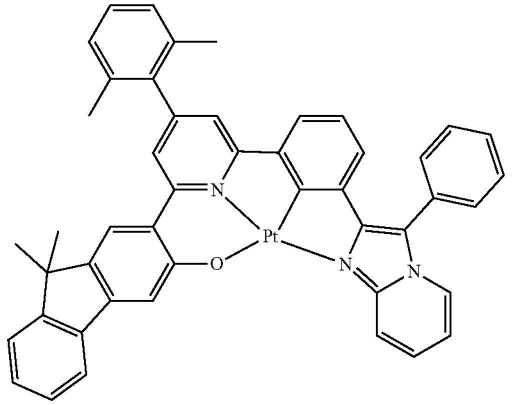
CPD 30
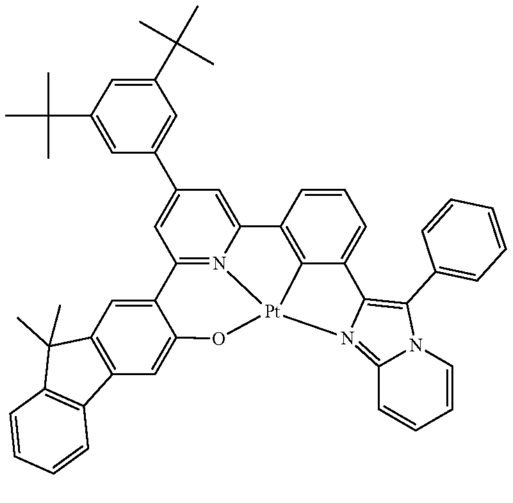
-continued
CPD 31
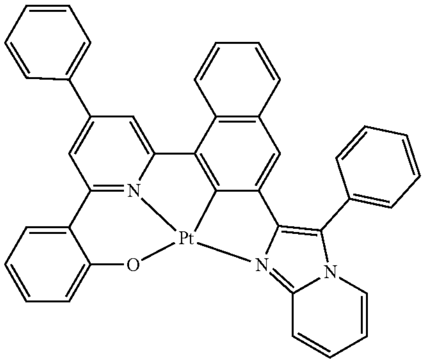
CPD 32
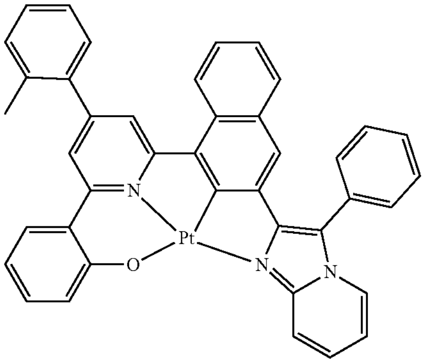
CPD 33
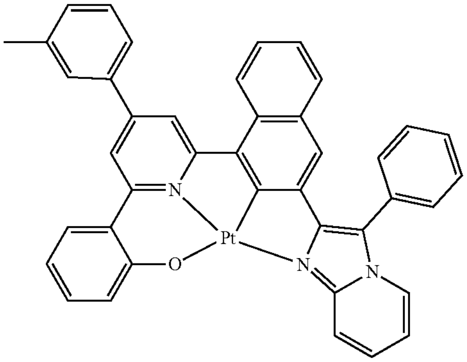
CPD 34
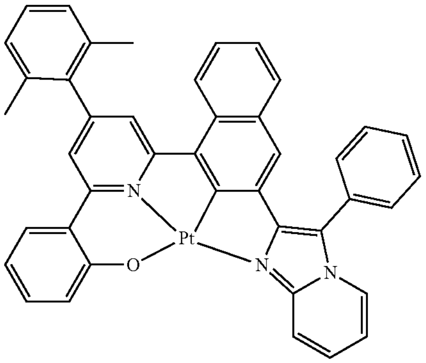

-continued
CPD 35
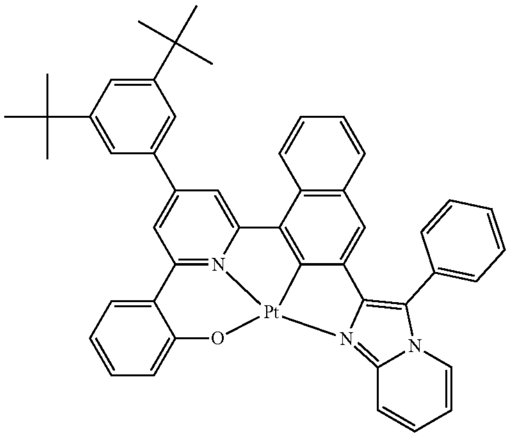
CPD 36
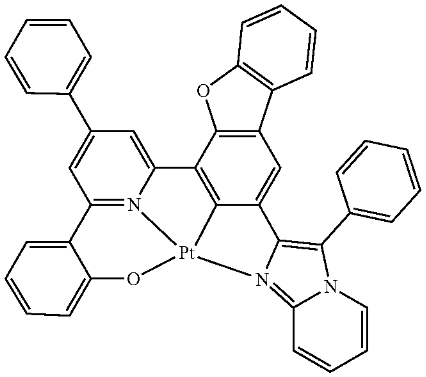
CPD 37
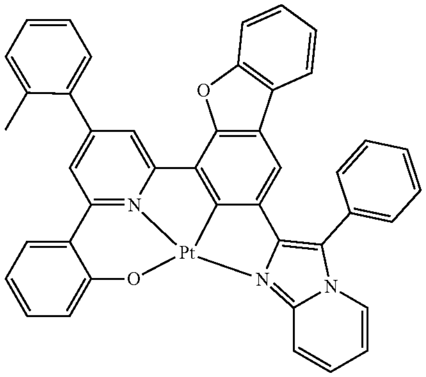
CPD 38
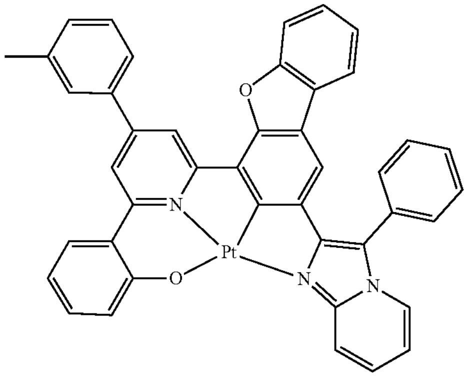
-continued
CPD 39
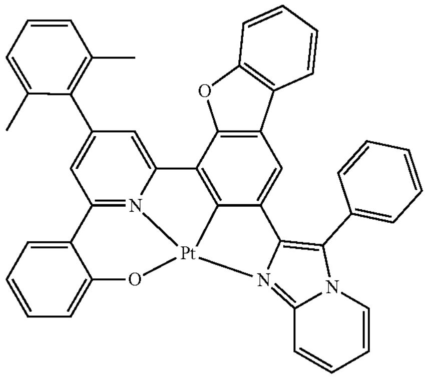
CPD 40
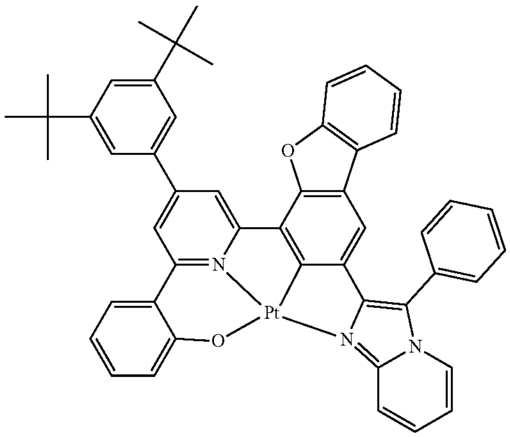
CPD 41
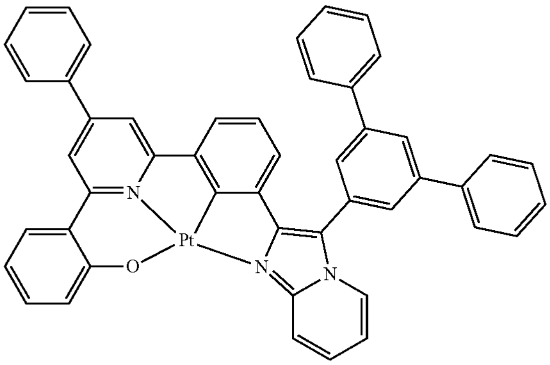
CPD 42
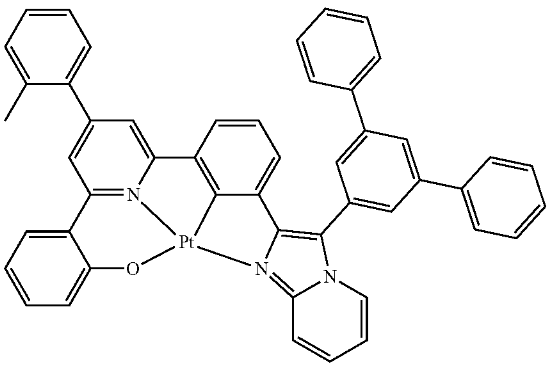

-continued
CPD 43
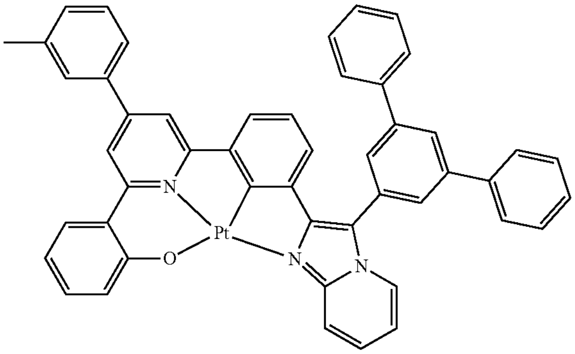
CPD 44
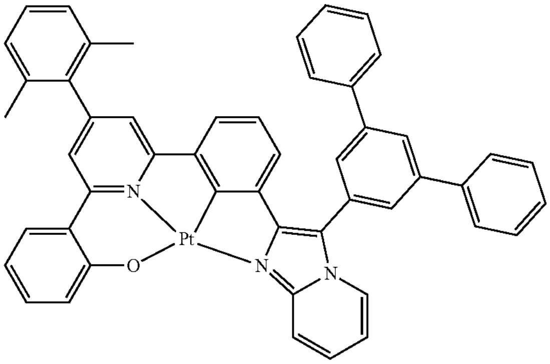
CPD 45
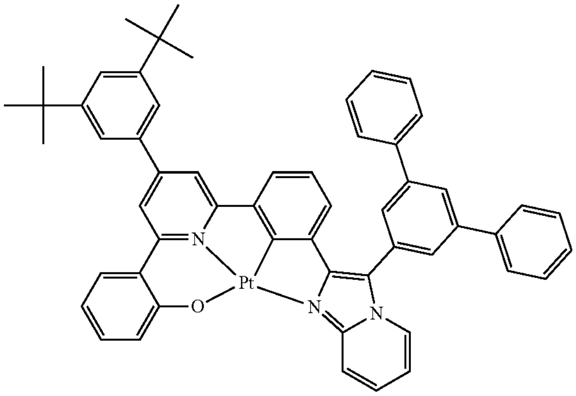
CPD 46
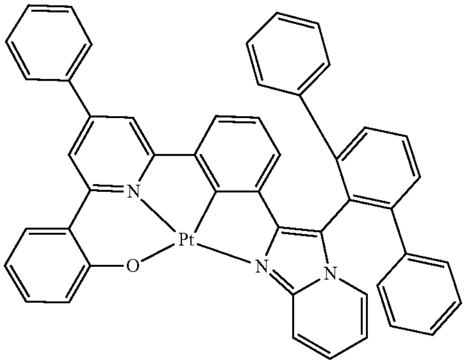
-continued
CPD 47
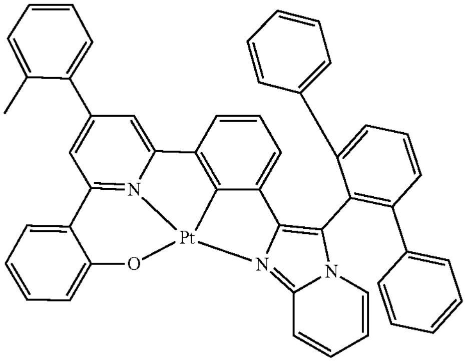
CPD 48
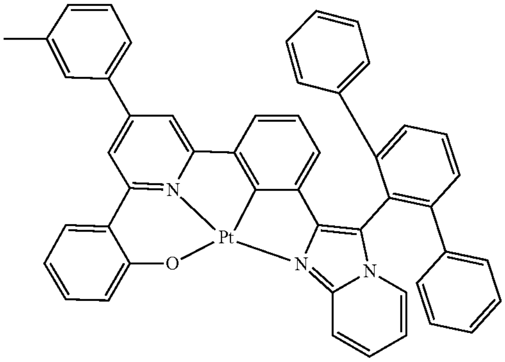
CPD 49
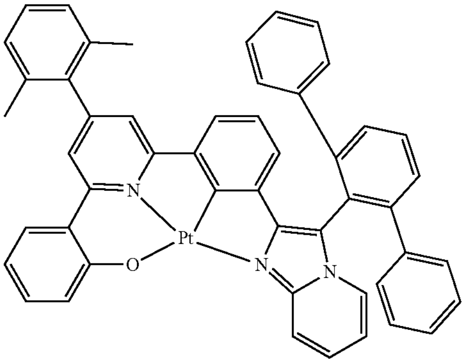
CPD 50
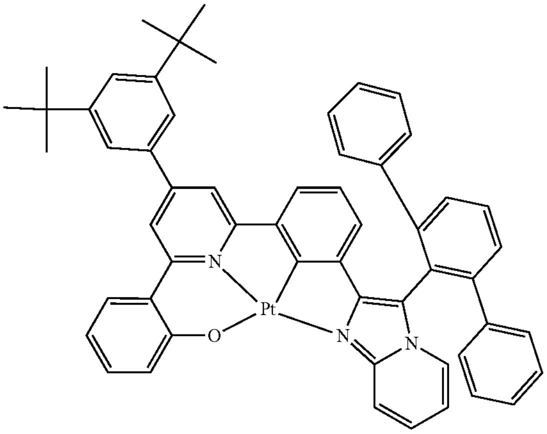

-continued
CPD 51
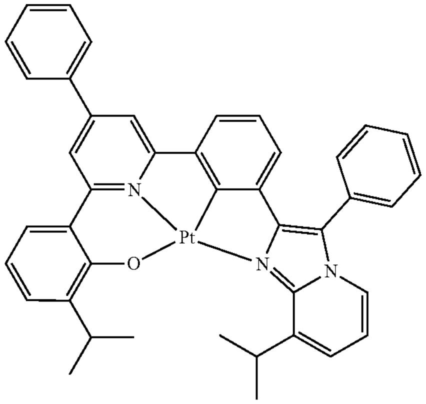
CPD 52
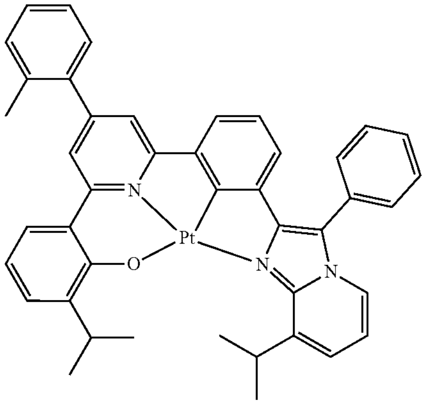
CPD 53
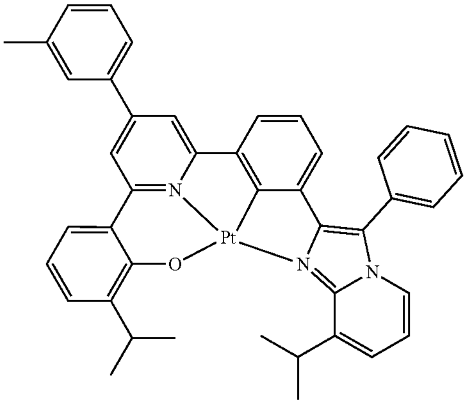
CPD 54
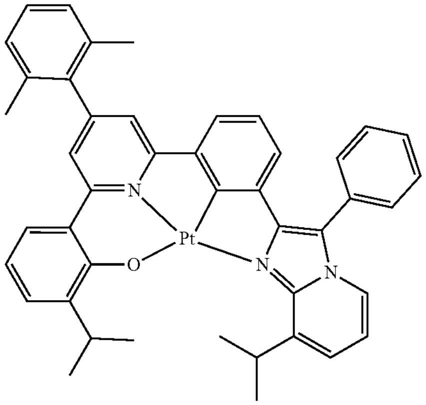
-continued
CPD 55
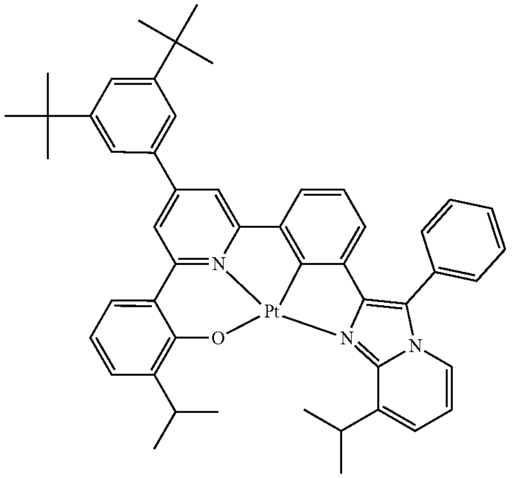
CPD 56
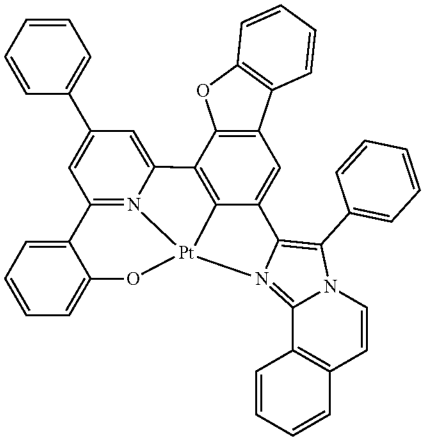
CPD 57
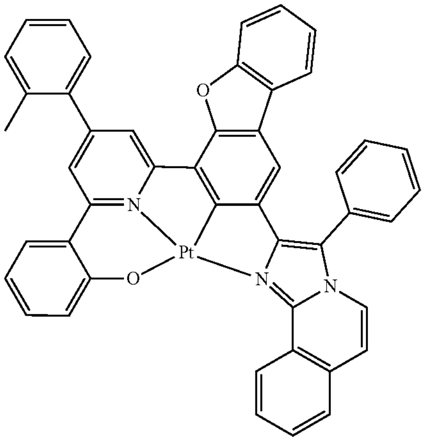

-continued
CPD 58
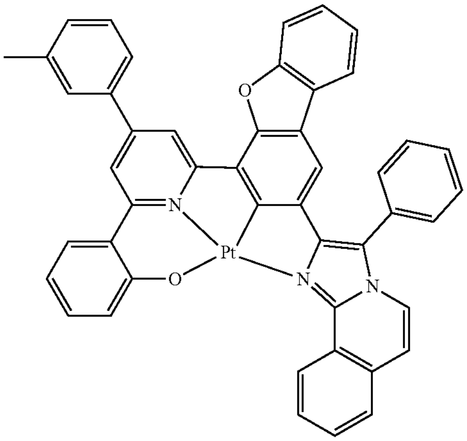
CPD 59
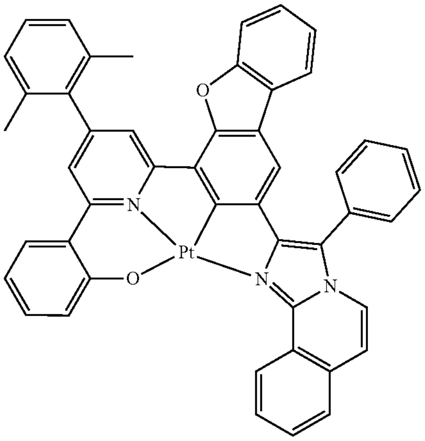
CPD 60
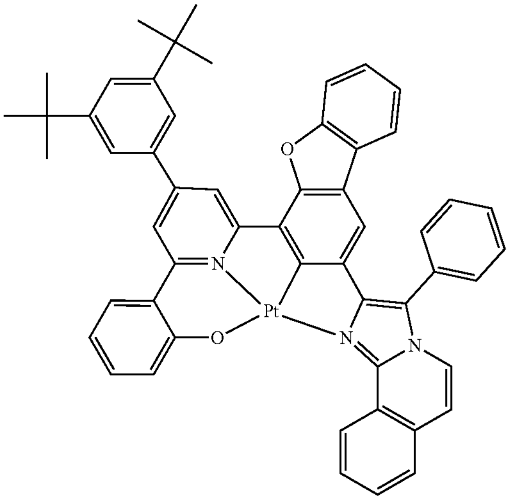
-continued
CPD 61
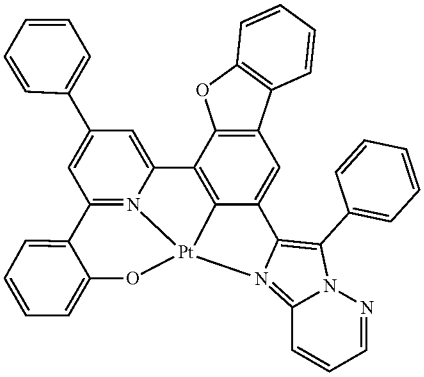
CPD 62
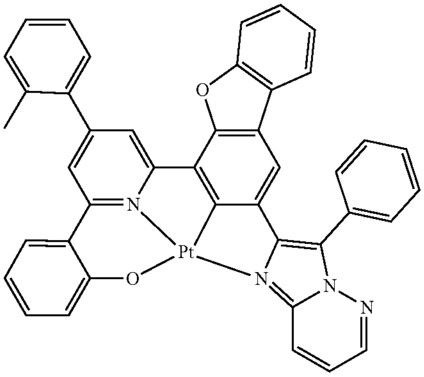
CPD 63
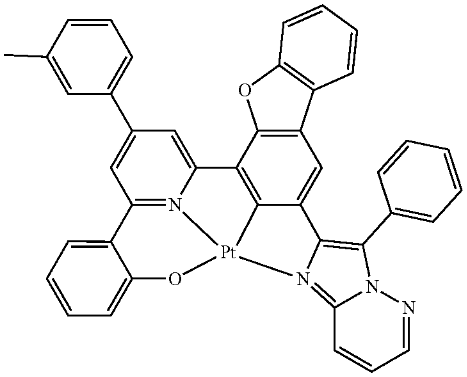
CPD 64
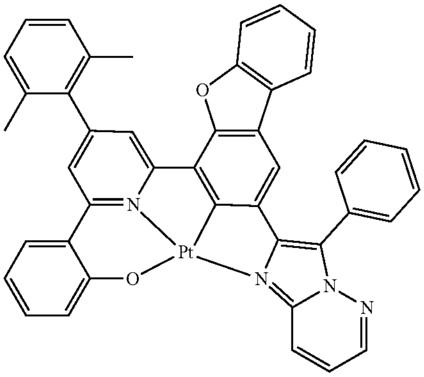

-continued
CPD 65
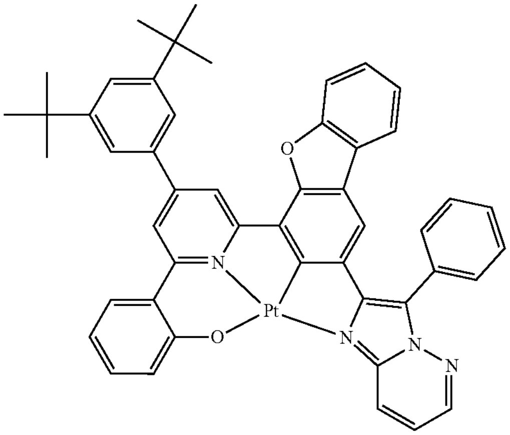
CPD 66
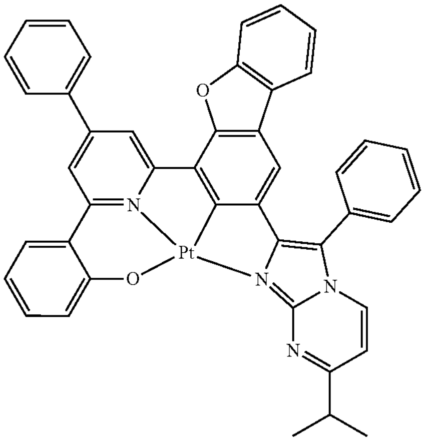
CPD 67
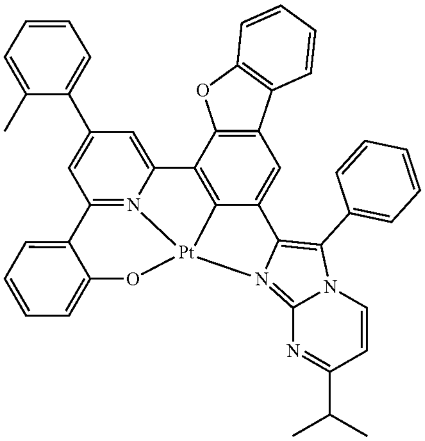
-continued
CPD 68
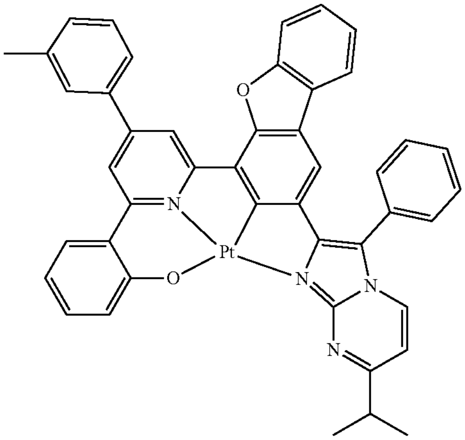
CPD 69
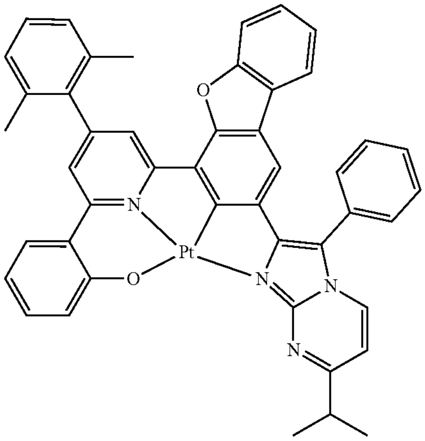
CPD 70
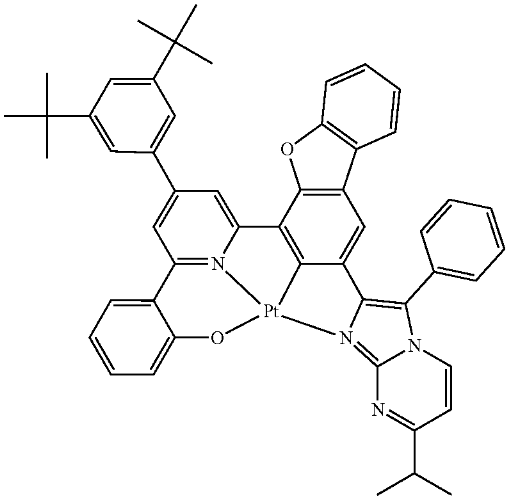

-continued
CPD 71
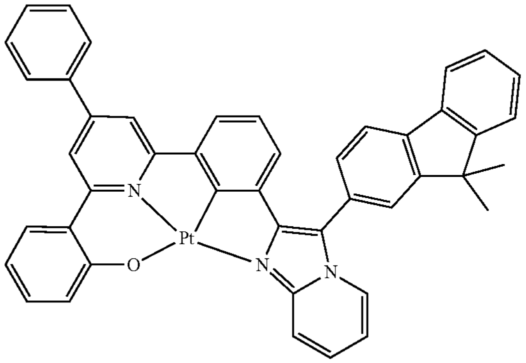
CPD 72
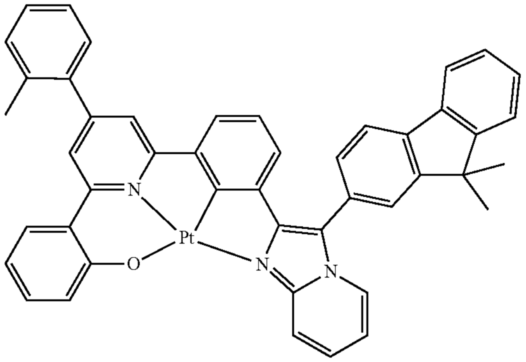
CPD 73
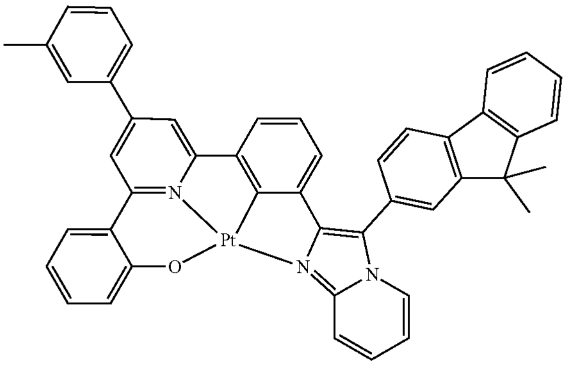
CPD 74
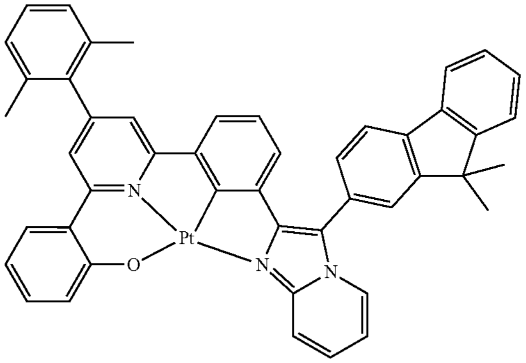
-continued
CPD 75
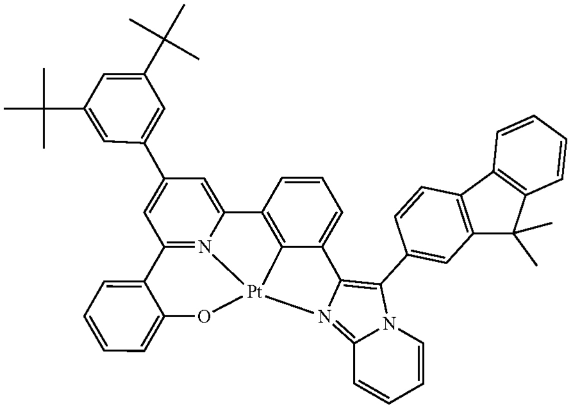
CPD 76
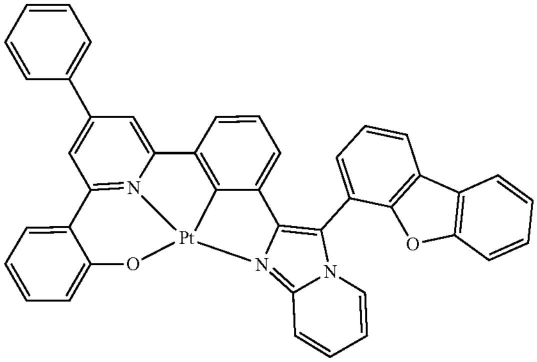
CPD 77
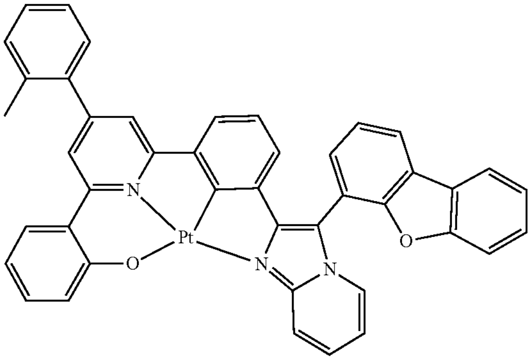
CPD 78
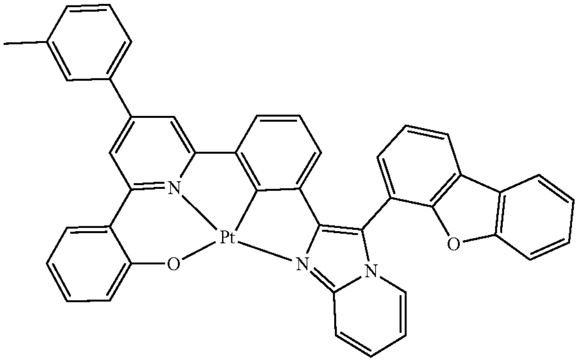

-continued
CPD 79
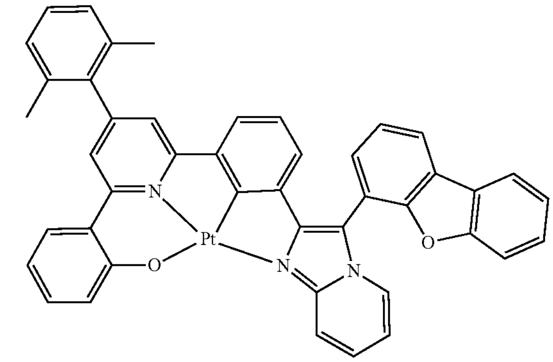
CPD 80
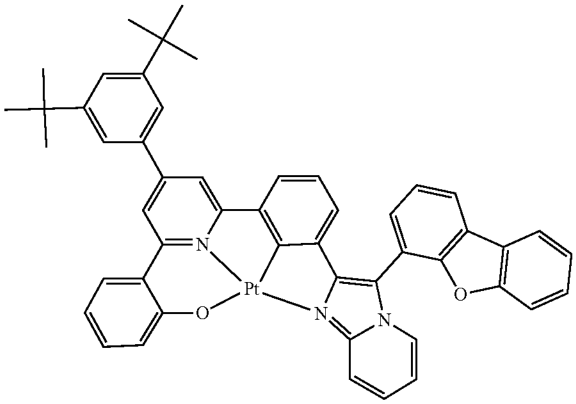
CPD 81
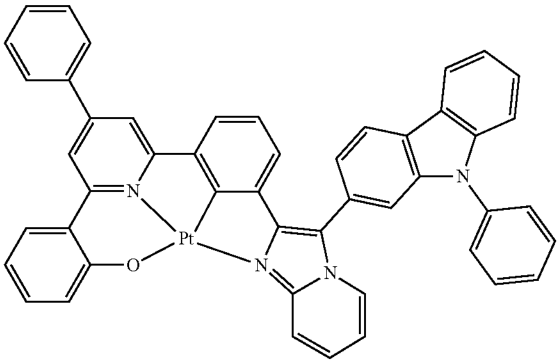
CPD 82
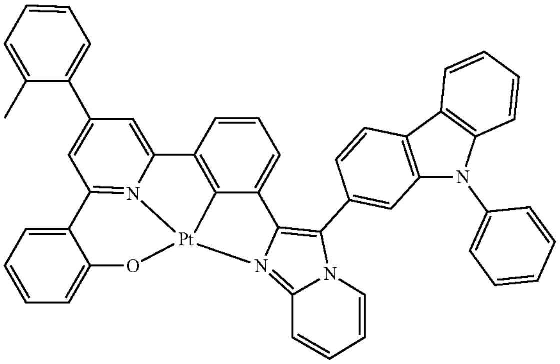
-continued
CPD 83
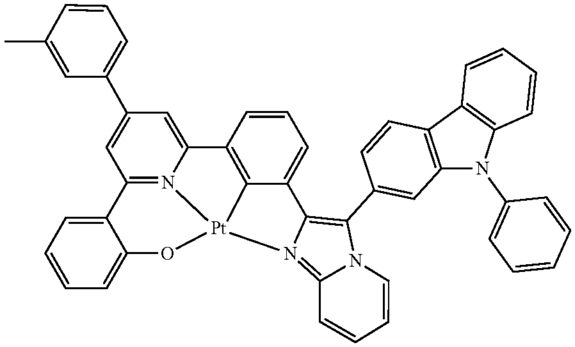
CPD 84
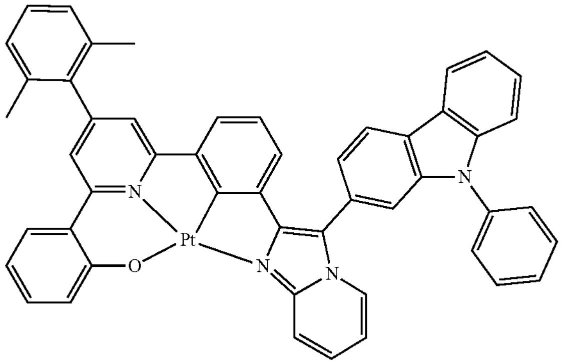
CPD 85
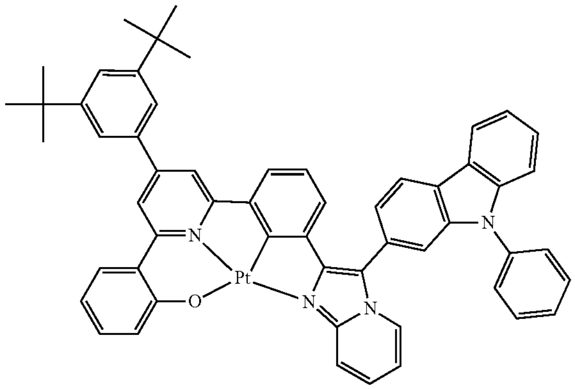
CPD 86
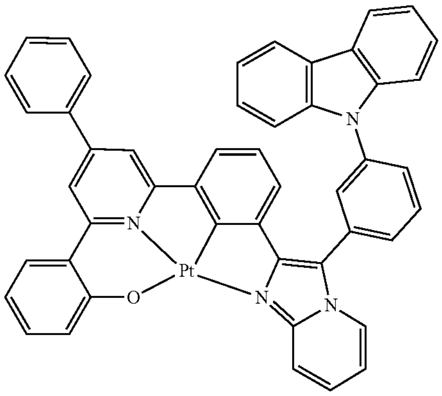

-continued
CPD 87
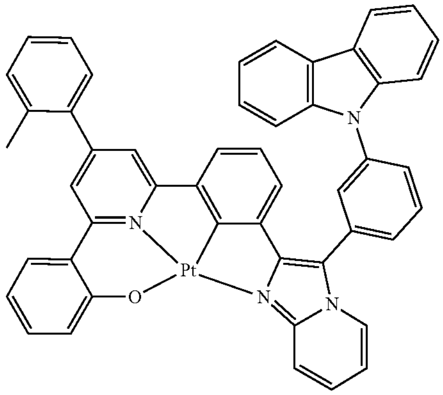
CPD 88
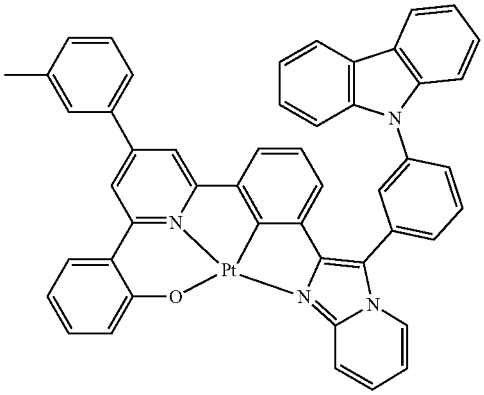
CPD 89
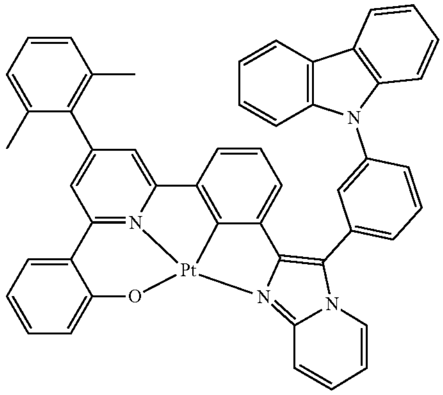
CPD 90
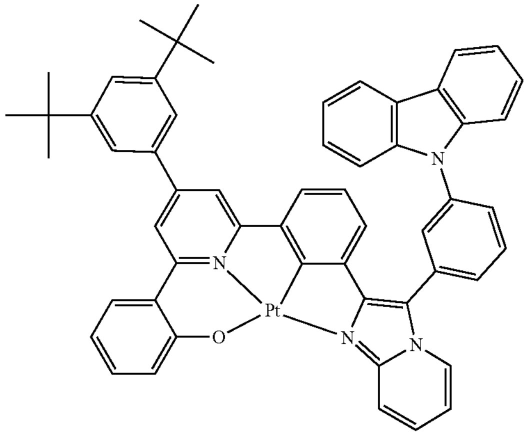
-continued
CPD 91
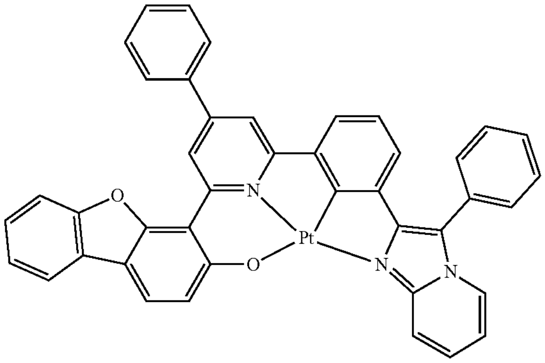
CPD 92
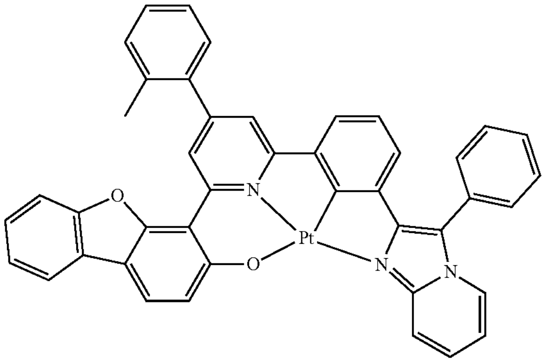
CPD 93
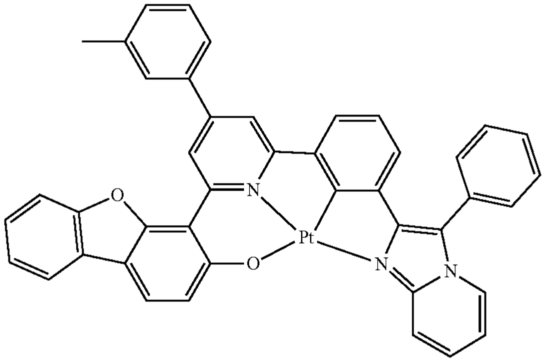
CPD 94
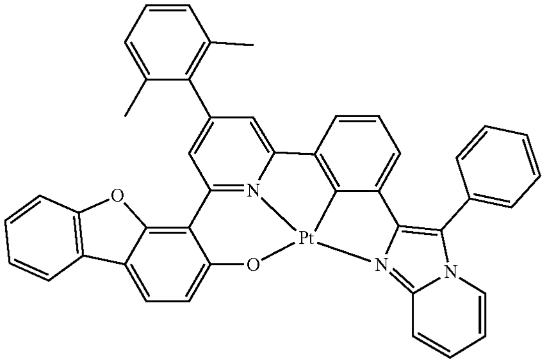

-continued
CPD 95
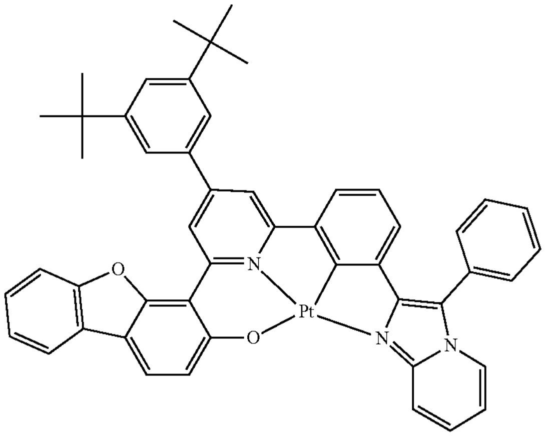
CPD 96
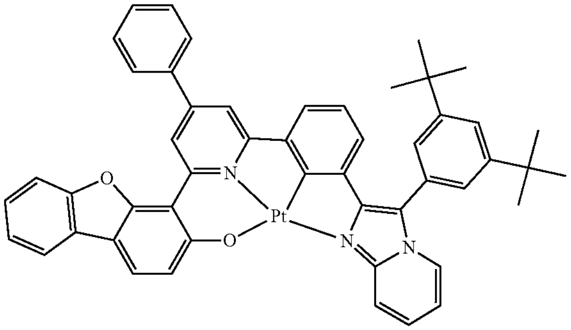
CPD 97
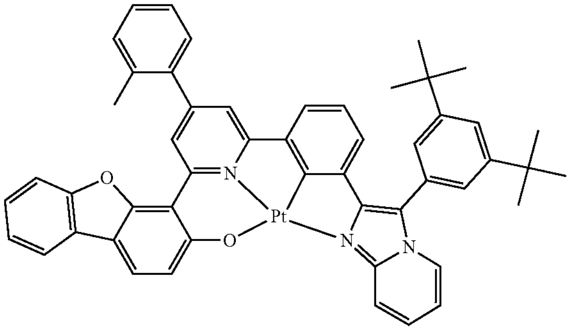
CPD 98
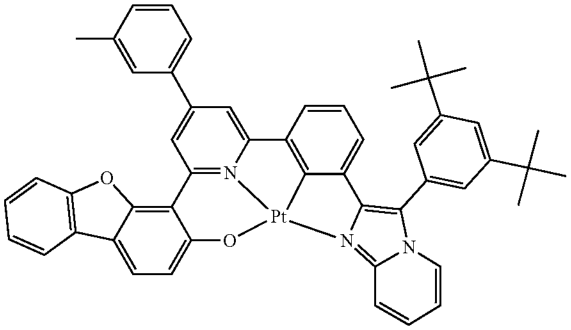
-continued
CPD 99
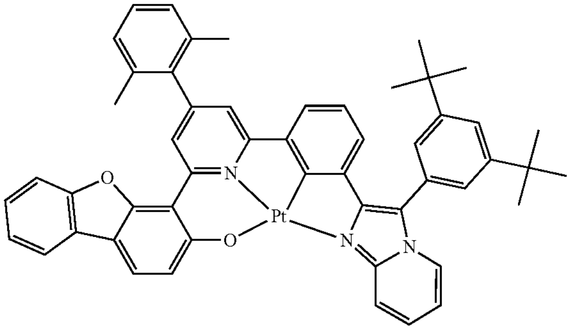
CPD 100
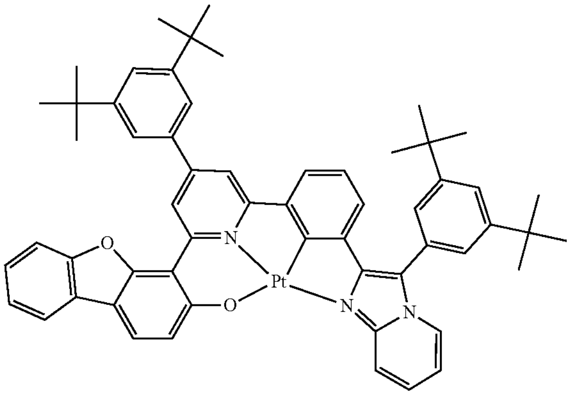
CPD 101
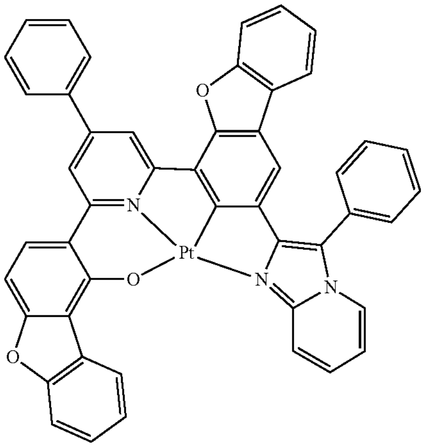

-continued
CPD 102
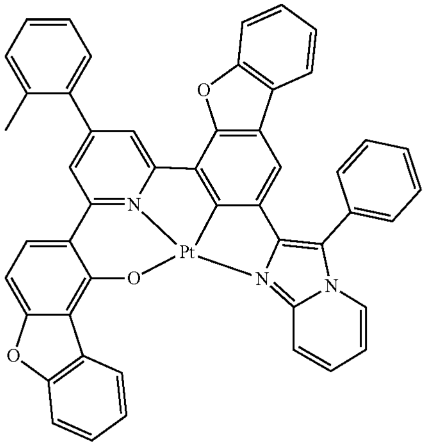
CPD 103
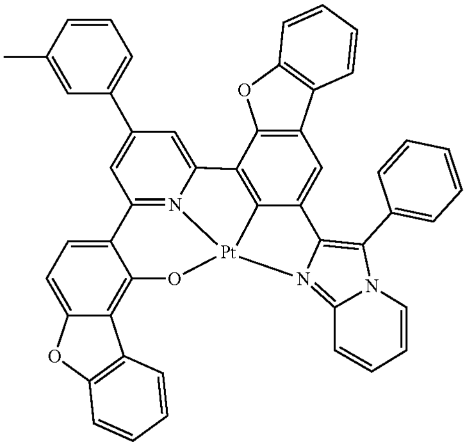
CPD 104
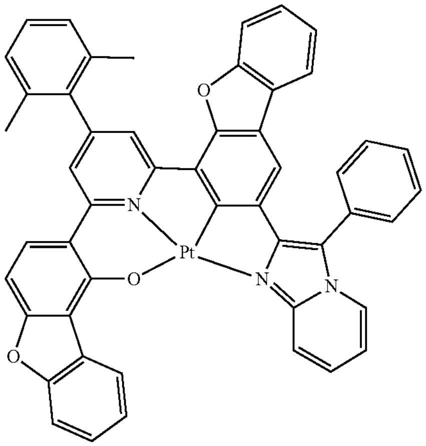
-continued
CPD 105
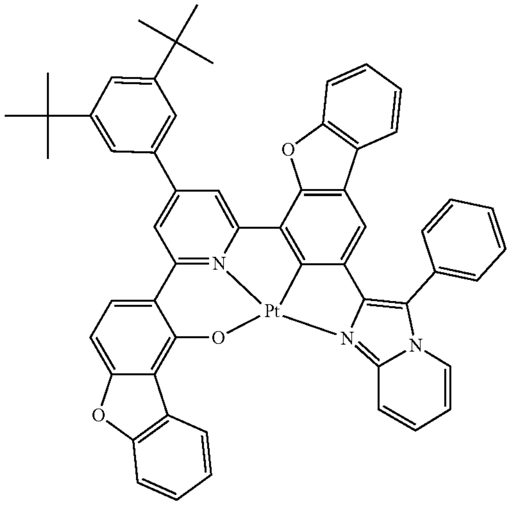
CPD 106
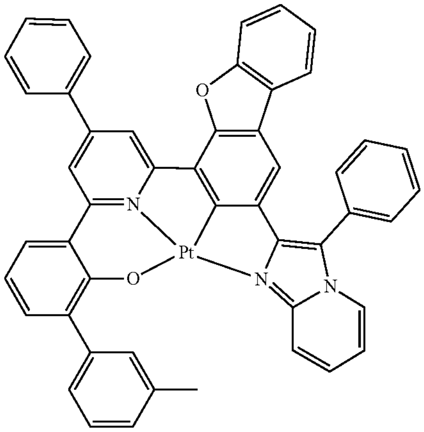
CPD 107
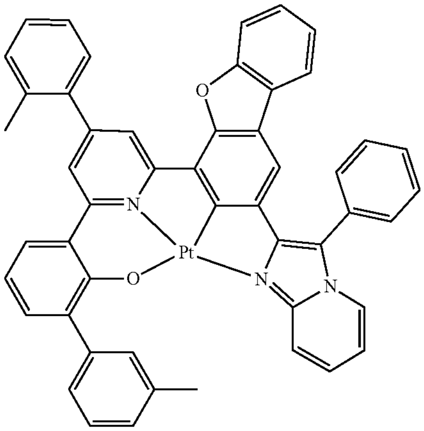

-continued

CPD 108

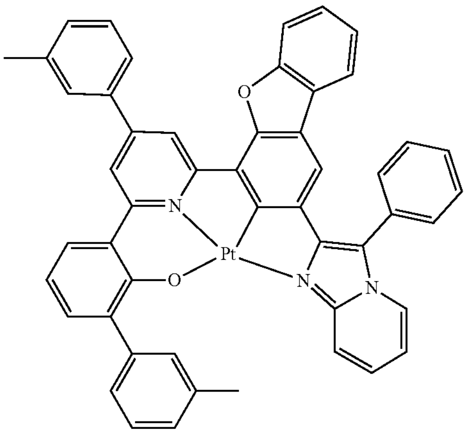

CPD 109

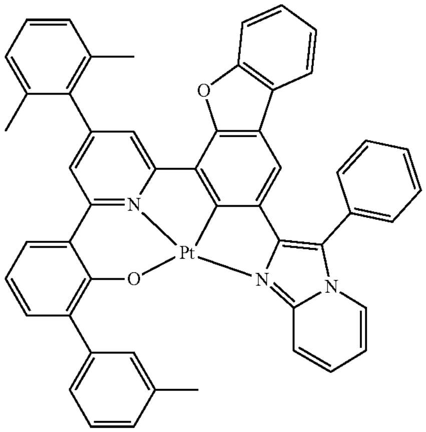

CPD 110

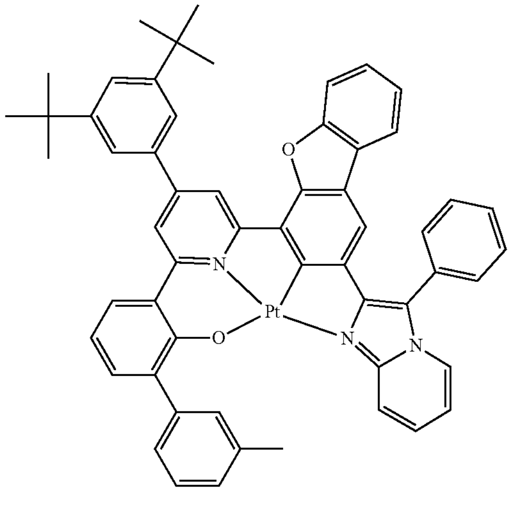

One of the objectives of the present invention is to provide an electroluminescent device. The electroluminescent device includes a cathode, an anode, and organic layers arranged between the cathode and the anode. At least one of the organic layers includes the quadridentate metal complex.

Another one of the objectives of the present invention is to provide an electroluminescent device, in which the organic layers include a light-emitting layer, and the metal complex is used as a doping material for a light-emitting material, especially as a doping material for a green light-emitting material.

Another one of the objectives of the present invention is to provide an electroluminescent device, in which the organic layers include a light-emitting layer, and the metal complex is used as a doping material for a light-emitting material, especially as a doping material for a yellow light-emitting material.

Another one of the objectives of the present invention is to provide an electroluminescent device, in which the organic layers include a light-emitting layer, and the metal complex is used as a doping material for a light-emitting material, especially as a doping material for a red light-emitting material.

Another one of the objectives of the present invention is to provide an electroluminescent device, in which the organic layers include a hole injection layer, and the metal complex is used as a hole injection material.

DETAILED DESCRIPTION OF EMBODIMENTS

The following embodiments are merely described to facilitate the understanding of the technical invention, and should not be considered as specific limitations of the present invention.

All raw materials, solvents and the like involved in the synthesis of compounds in the present invention were purchased from Alfa, Acros, and other suppliers known to persons skilled in the art.

Example 1 Synthesis of a Compound CPD 1

Synthesis of an Intermediate A1:

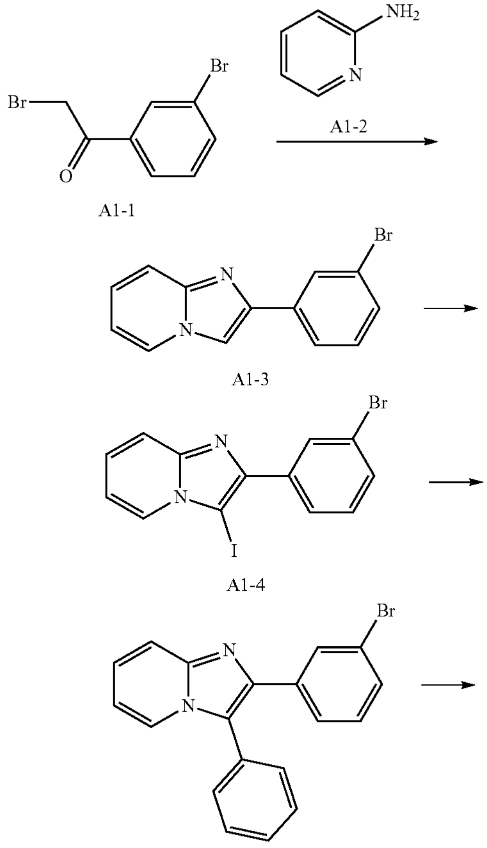

-continued

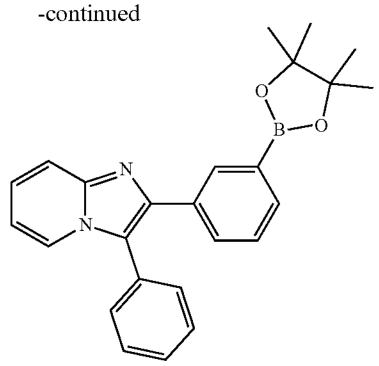

A1

Synthesis of a Compound A1-3:

A compound A1-1 (100.0 g, 0.36 mol, 1.0 eq), a compound A1-2 (137.7 g, 0.72 mol, 2.0 eq), sodium bicarbonate (45.3 g, 0.54 mol, 1.5 eq), and ethanol (1 L) were sequentially added into a 3 L three-mouth flask, and stirred under the replacement of vacuum and nitrogen for three times. A mixture obtained was heated until reflux for a reaction for 2 hours. According to monitoring by TLC (with a mixture of ethyl acetate and n-hexane at a ratio of 1:10 as a developing agent), the raw material A1-1 was almost consumed completely. A reaction solution was cooled to room temperature, slowly poured into 1 L of stirred water, and stirred at room temperature for 2 hours. After filtration was conducted, a filter cake was rinsed with a mixture of acetonitrile and n-hexane at a ratio of 1:4 for 3 times in a total of 0.5 L. Then, drainage and drying were conducted, and 83.5 g of a light yellow solid A1-3 with a yield of 85.0% was obtained. Mass spectrometry was as follows: 274.3 (M+H)

Synthesis of a Compound A1-4:

The compound A1-3 (83.5 g, 0.30 mol, 1.0 eq) and acetonitrile (1.6 L) were sequentially added into a 3 L three-mouth flask, and stirred. N-iodosuccimide (72.2 g, 0.32 mol, 1.06 eq) was added in batches at room temperature, and stirred at room temperature for 30 minutes. With the proceeding of a reaction, a reaction solution was gradually changed from light yellow to white. According to monitoring by TLC (with a mixture of ethyl acetate and n-hexane at a ratio of 1:15 as a developing agent), the raw material A1-3 was almost consumed completely. Deionized water (330 ml) was added into the reaction solution, and stirred for 1 hour. After filtration was conducted, a filter cake was rinsed with a mixture of acetonitrile and water at a ratio of 4:1 for two times in a total of 200 ml. Then, drainage and drying were conducted, and 110 g of a white solid A1-4 with a yield of 90.2% was obtained. Mass spectrometry was as follows: 400.2 (M+H)

Synthesis of a Compound A1-5:

The compound A1-4 (110 g, 0.27 mol, 1.0 eq), phenylboric acid (35.2 g, 0.28 mol, 1.03), dioxane (1.7 L), KOH (30.9 g, 0.55 mol, 2.0 eq), and deionized water (300 ml) were sequentially added into a 5 L three-mouth flask under the replacement of nitrogen for 3 times, and then $Pd(PPh_3)_4$ (3.19 g, 2.76 mmol, 0.01 eq) was added under the replacement of nitrogen for three times. A mixture obtained was heated to 85° C. for a reaction. With the proceeding of the reaction, a reaction solution was changed from turbid to clear. According to monitoring by TLC (with a mixture of ethyl acetate and n-hexane at a ratio of 1:20 as a developing agent), the raw material A1-4 was basically consumed completely. The reaction solution was cooled to 60-70° C., slowly poured into stirred ice water (2 L), and stirred for 1.5 hours. After filtration was conducted, a yellow solid precipitated out was collected, dissolved in dichloromethane (1.2 L), treated with silica gel, and rinsed with a small amount of dichloromethane. A filtrate was concentrated until 100 ml of a solvent was remained, and then n-hexane (500 ml) was added, and stirred at room temperature for 1 hour. After filtration was conducted, a yellow solid obtained was beaten and stirred with toluene (100 ml) and n-hexane (500 ml) for 1 hour. Then, filtration and drying were conducted, and 70.3 g of a white solid A1-5 with a yield of 73.1% was obtained. Mass spectrometry was as follows: 350.2 (M+H)

Synthesis of a Compound A1:

The compound A1-5 (70.0 g, 0.20 mol, 1.0 eq), bis(pinacolato)diboron (61.0 g, 0.24 mol, 1.2 eq), [1,1'-bis(diphenylphosphino)ferrocene]dichloropalladium (2.93 g, 4.01 mmol, 0.02 eq), potassium acetate (39.3 g, 0.4 mol, 2.0 eq), and dioxane (560 ml) were sequentially added into a 1 L one-mouth flask under the replacement of nitrogen for three times. A mixture obtained was heated to 100° C., subjected to heat preservation, and stirred for 6 hours. According to monitoring by TLC (with a mixture of ethyl acetate and n-hexane at a ratio of 1:10 as a developing agent), the raw material A1-5 was basically consumed completely. A reaction solution was cooled to 40° C., and filtered with diatomite. A filter cake was rinsed with a small amount of dioxane. A filtrate was concentrated to 200 ml under reduced pressure, and then methanol (400 ml) was added, and stirred at room temperature for 2 hours. After filtration was conducted, a solid was obtained. N-hexane (400 ml) was added, and beaten at 50° C. for 2 hours. Then, filtration and drying were conducted, and 57.4 g of a creamy white solid compound A1 with a yield of 72.3% was obtained. Mass spectrometry was as follows: 397.2 (M+H).

Synthesis of a Compound CPD 1:

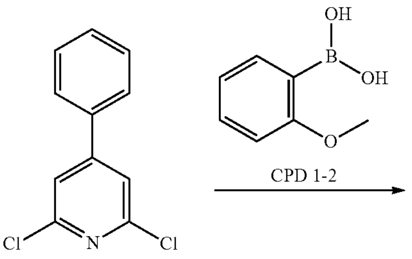

CPD 1-2

CPD 1-1

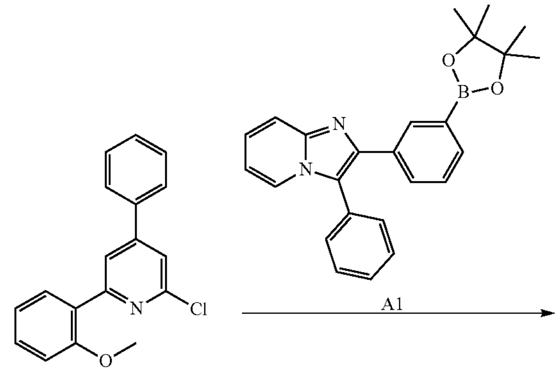

A1

CPD 1-3

-continued

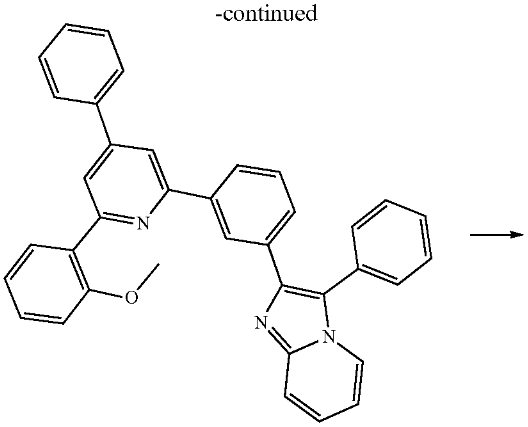

CPD 1-4

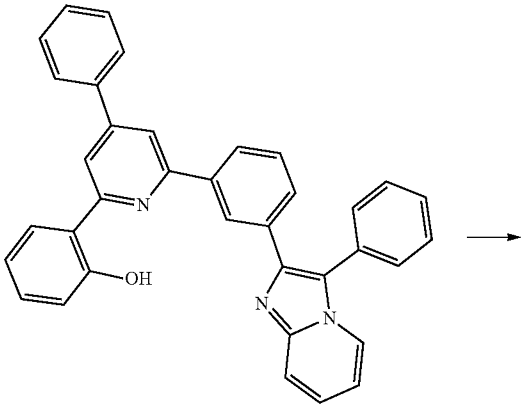

CPD 1-5

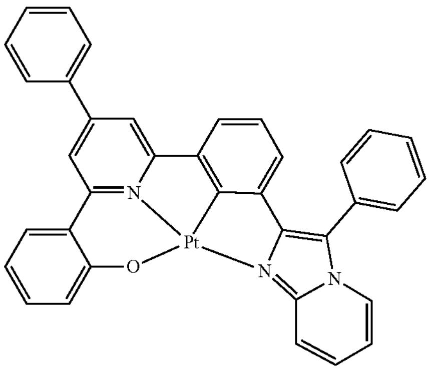

CPD 1

Synthesis of a Compound CPD1-3:

A compound CPD1-1 (14.5 g, 64.71 mmol, 1.0 eq), a compound CPD1-2 (8.36 g, 55.0 mmol, 0.85 eq), [1,1'-bis (diphenylphosphino)ferrocene]dichloropalladium (2.37 g, 3.24 mmol, 0.05 eq), sodium carbonate (13.72 g, 129.4 mmol, 2.0 eq), acetonitrile (218 ml), and deionized water (55 ml) were sequentially added into a 500 ml three-mouth flask. Deoxidization was conducted on the device for 3 times, and nitrogen was introduced for protection. A mixture obtained was heated to 85° C. for a reaction for 2 hours. According to plate pointing by TLC (with a mixture of ethyl acetate and n-hexane at a ratio of 1:15 as a developing agent), the reaction was stopped when a small amount of the CPD1-1 was remained. A reaction solution was subjected to rotary evaporation to remove an organic solvent. Dichloromethane (300 mL) was added, and stirred for dissolved clarification. Deionized water (150 mL) was added for extraction and liquid separation. An aqueous phase was extracted with dichloromethane (100 mL) for 1 time, and organic phases were combined. A spin-dried black crude product was purified by column chromatography (with a mixture of ethyl acetate and n-hexane at a ratio of 1:30 as an eluent) to obtain 12.48 g of a white solid CPD1-3 with a yield of 65.2%. Mass spectrometry was as follows: 296.8 (M+H).

Synthesis of a Compound CPD1-4:

The compound CPD1-3 (12.2 g, 41.2 mmol, 1.0 eq), the compound A1 (17.16 g, 43.3 mmol, 1.0 eq), [1,1'-bis(diphenylphosphino)ferrocene]dichloropalladium (1.51 g, 2.06 mmol, 0.05 eq), cesium carbonate (26.88 g, 82.5 mmol, 2.0 eq), dioxane (120 ml), and deionized water (24 ml) were sequentially added into a 500 ml three-mouth flask. Deoxidization was conducted on the device for 3 times, and nitrogen was introduced for protection. A mixture obtained was heated to 70° C. for a reaction for 5 hours. According to plate pointing by TLC (with a mixture of ethyl acetate and n-hexane at a ratio of 1:3 as a developing agent), the reaction was stopped when the CPD1-3 was basically consumed completely. A reaction solution was cooled to room temperature. Deionized water (60 ml) and toluene (100 ml) were added, and stirred for liquid separation. An organic phase was collected, and filtered with silica gel. A filter cake was rinsed with a small amount of toluene. A filtrate was spin-dried to obtain a brown crude product. The crude product was recrystallized with toluene (80 ml)/methanol (240 ml) for 2 times. Then, filtration and drying were conducted, and 14.09 g of a white solid CPD1-4 with a yield of 64.5% was obtained. Mass spectrometry was as follows: 530.6 (M+H).

Synthesis of a Compound CPD1-5:

The compound CPD1-4 (14 g, 26.43 mmol, 1.0 eq) and pyridine hydrochloride (146 g, 1.27 mol, 48 eq) were added into a 500 mL one-mouth flask, and then dichlorobenzene (32 ml) was added, and stirred under the replacement of nitrogen for four times. A mixture obtained was heated to 190° C. for a reaction for 2.5 hours. According to monitoring by TLC (with a mixture of ethyl acetate and n-hexane at a ratio of 1:3 as a developing agent), the raw materials were completely reacted, and a reaction solution was cooled to room temperature. A saturated sodium bicarbonate solution (150 ml) and toluene (150 ml) were added into the reaction solution, and stirred for dissolved clarification and liquid separation. An organic phase was washed with water for 2 times (150 ml/time), collected, and spin-dried. A crude product was recrystallized with toluene (60 ml)/n-hexane (180 ml) for 2 times. Then, filtration and drying were conducted, and 11.7 g of a light yellow solid CPD1-5 with a yield of 86.2% was obtained. Mass spectrometry was as follows: 515.6 (M+H).

Synthesis of a Compound CPD1:

The compound CPD1-5 (6.5 g, 12.61 mmol, 1.0 eq), potassium tetrachloroplatinate (8.11 g, 19.54 mmol, 1.55 eq), tetrabutylammonium bromide (280 mg, 1.9 mmol, 0.15 eq), and acetic acid (650 ml) were put into a 1 L one-mouth flask. A mixture obtained was treated under the replacement of vacuum and nitrogen for three times, and heated to 125° C. for a reaction for 72 hours under the protection of nitrogen. According to monitoring by TLC (with a mixture of dichloromethane and n-hexane at a ratio of 1:2 as a developing agent), the raw material CPD1-5 was completely reacted, and a reaction solution was cooled to room temperature. The reaction solution was added into a beaker containing 650 ml of deionized water, and stirred until a solid was precipitated out. After filtration was conducted, a solid was collected. A crude product was separated by column chromatography with silica gel (with a mixture of dichloromethane and n-hexane at a ratio of 1:5 as an eluent) to obtain an orange yellow solid. The orange yellow solid was recrystallized with dichloromethane (50 ml)/methanol (75 ml) for 1 time to obtain 5.5 g of an orange yellow compound CPD1 with a yield of 62.1%. 5.5 g of the crude product CPD1 was sublimated and purified to obtain 3.61 g of a sublimated pure product CPD1 with a yield of 65.6%. Mass spectrometry was as follows: 708.7 (M+H). $^1$HNMR (400 MHz, $CDCl_3$) δ 8.65 (m, 1H), 8.48 (dd, 1H), 8.26 (dd, 1H), 8.20 (s, 2H), 7.86 (m, J=15.0 Hz, 3H), 7.73 (m, J=25.0 Hz, 3H), 7.62-7.35 (m, 7H), 7.29 (m, J=5.0 Hz, 2H), 7.21 (m, 1H), 6.97 (m, 1H), 6.86 (m, 1H).

Example 2 Synthesis of a Compound CPD 5

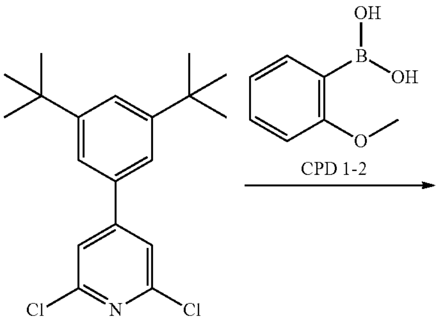

CPD 1-2

CPD 5-1

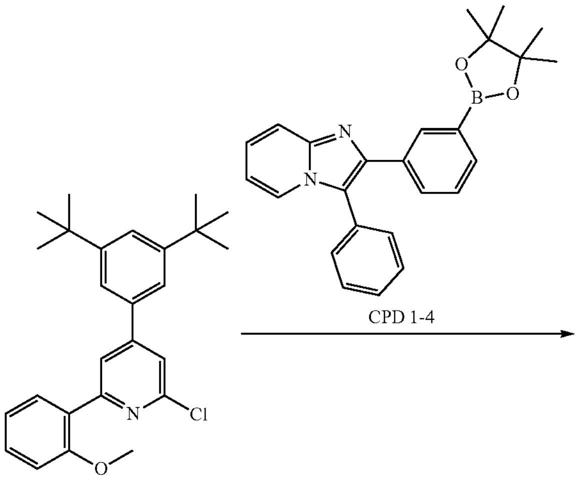

CPD 1-4

CPD 5-2

-continued

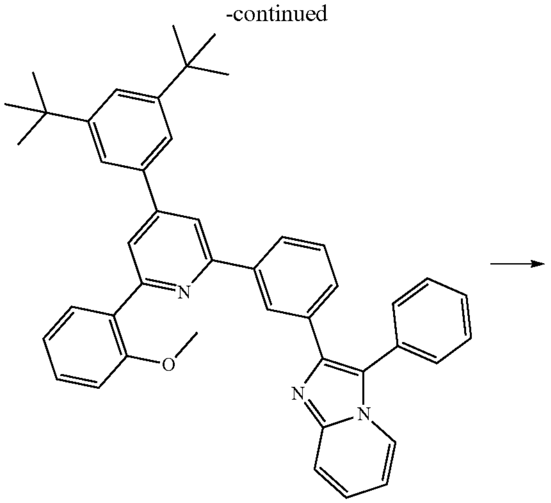

CPD 5-3

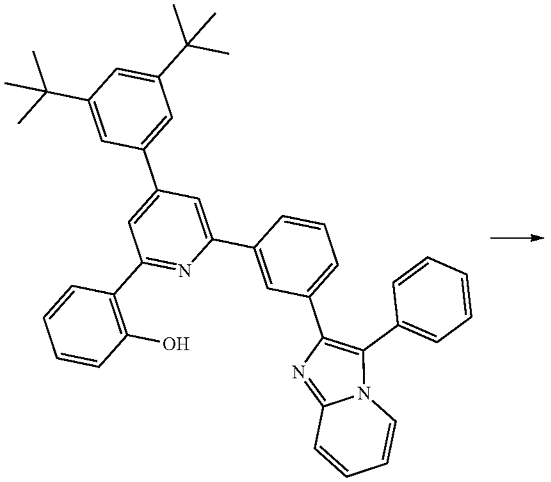

CPD 5-4

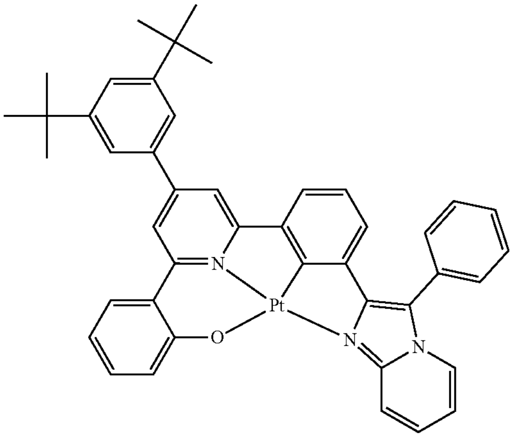

CPD 5

Synthesis of a Compound CPD5-2:

With reference to the synthesis process and post-treatment and purification methods of the compound CPD1-3, only the corresponding raw materials were required to be changed. Mass spectrometry was as follows: 409.1 (M+H).

Synthesis of a Compound CPD5-3:

With reference to the synthesis process and post-treatment and purification methods of the compound CPD1-4, only the corresponding raw materials were required to be changed. Mass spectrometry was as follows: 642.8 (M+H).

Synthesis of a Compound CPD5-4:

With reference to the synthesis process and post-treatment and purification methods of the compound CPD1-5, only the corresponding raw materials were required to be changed. Mass spectrometry was as follows: 628.8 (M+H).

Synthesis of a Compound CPD5:

With reference to the synthesis process and post-treatment and purification methods of the compound CPD1, only the corresponding raw materials were required to be changed, and 4.31 g of an orange yellow compound CPD5 with a yield of 58.8% was obtained. 4.31 g of the crude product CPD5 was sublimated and purified to obtain 2.85 g of a sublimated pure product CPD5 with a yield of 66.1%. Mass spectrometry was as follows: 821.8 (M+H). $^{1}$HNMR (400 MHz, $CDCl_3$) δ 8.68 (m, 1H), 8.46 (dd, 1H), 8.28 (dd, 1H), 8.22 (s, 2H), 7.87 (m, J=15.0 Hz, 3H), 7.72 (dd, J=15.0 Hz, 3H), 7.52 (m, J=22.5, 7.5 Hz, 5H), 7.29 (d, J=5.0 Hz, 2H), 7.21 (t, 1H), 6.97 (m, 1H), 6.86 (t, 1H), 1.32 (s, 18H).

Example 3 Synthesis of a Compound CPD 10

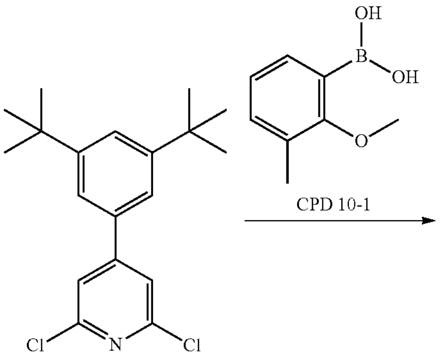

CPD 5-1

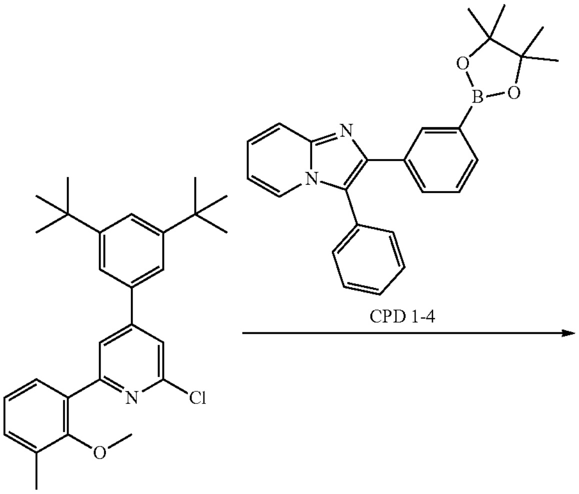

CPD 10-2

-continued

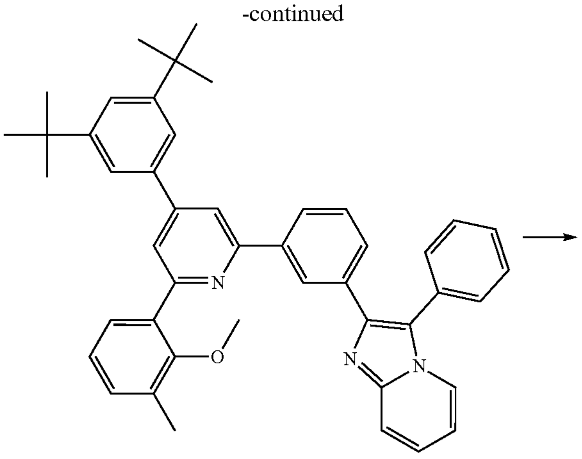
CPD 10-3

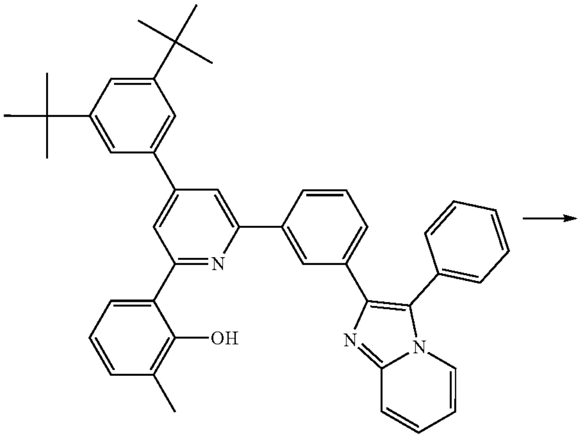
CPD 10-4

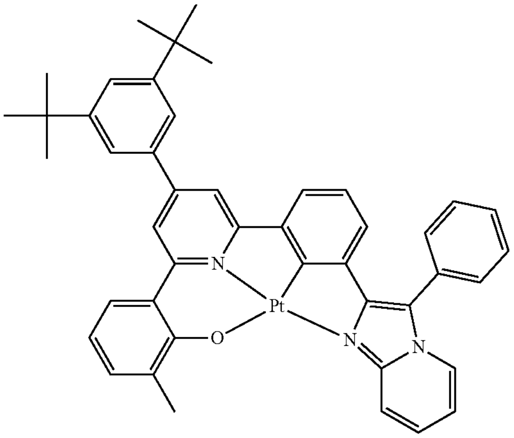
CPD 10

Synthesis of a Compound CPD10-2:

With reference to the synthesis process and post-treatment and purification methods of the compound CPD1-3, only the corresponding raw materials were required to be changed. Mass spectrometry was as follows: 423.0 (M+H).

Synthesis of a Compound CPD10-3:

With reference to the synthesis process and post-treatment and purification methods of the compound CPD1-4, only the corresponding raw materials were required to be changed. Mass spectrometry was as follows: 656.9 (M+H).

Synthesis of a Compound CPD10-4:

With reference to the synthesis process and post-treatment and purification methods of the compound CPD1-5, only the corresponding raw materials were required to be changed. Mass spectrometry was as follows: 642.8 (M+H).

Synthesis of a Compound CPD10:

With reference to the synthesis process and post-treatment and purification methods of the compound CPD1, only the corresponding raw materials were required to be changed, and 4.87 g of an orange yellow compound CPD10 with a yield of 60.1% was obtained. 4.87 g of the crude product CPD10 was sublimated and purified to obtain 2.77 g of a sublimated pure product CPD10 with a yield of 56.8%. Mass spectrometry was as follows: 835.9 (M+H). $^{1}$HNMR (400 MHz, $CDCl_3$) δ 8.55 (dd, 1H), 8.48 (dd, 1H), 8.26 (dd, 1H), 8.20 (s, 2H), 7.86 (m, J=15.0 Hz, 3H), 7.71 (m, J=15.0 Hz, 3H), 7.52 (m, J=22.5, 7.5 Hz, 5H), 7.21 (t, 1H), 7.15 (d, 1H), 7.02 (t, 1H), 6.86 (m, 1H), 2.15 (s, 3H), 1.32 (s, 18H).

Example 4 Synthesis of a Compound CPD 20

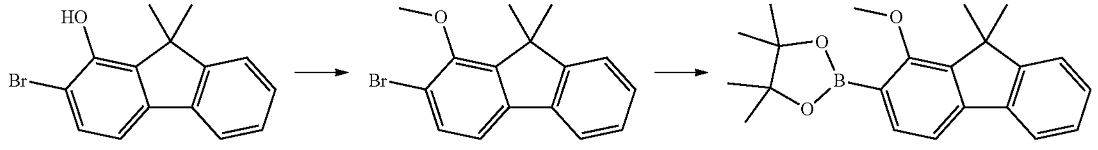

CPD 20-1 CPD 20-2 CPD 20-3

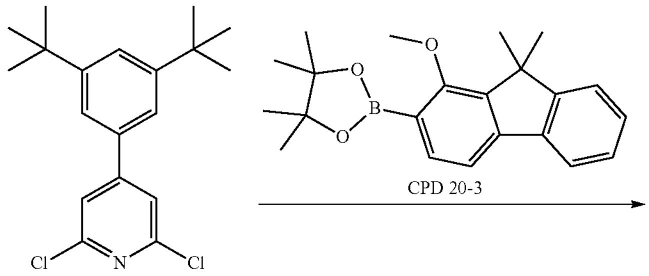

CPD 20-3

CPD 5-1

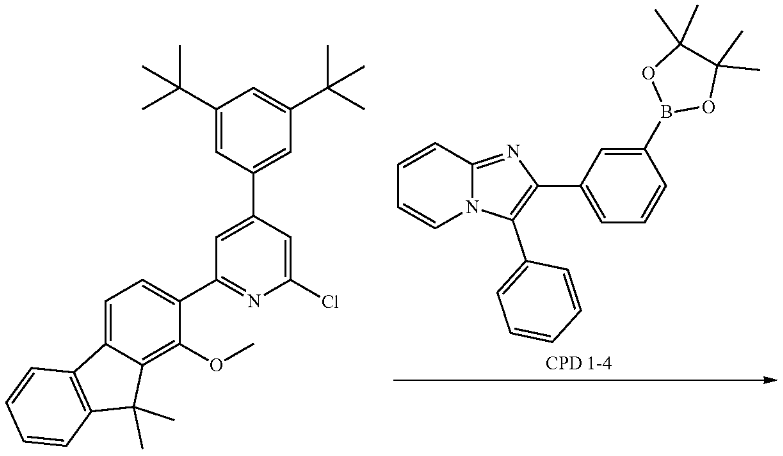

CPD 1-4

CPD 20-4

-continued

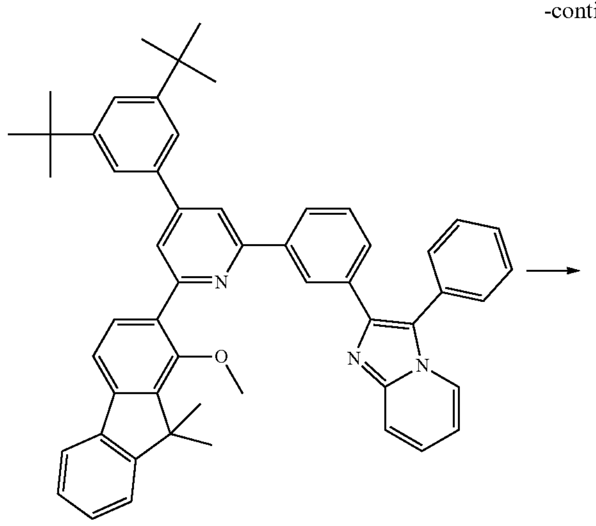

CPD 20-5

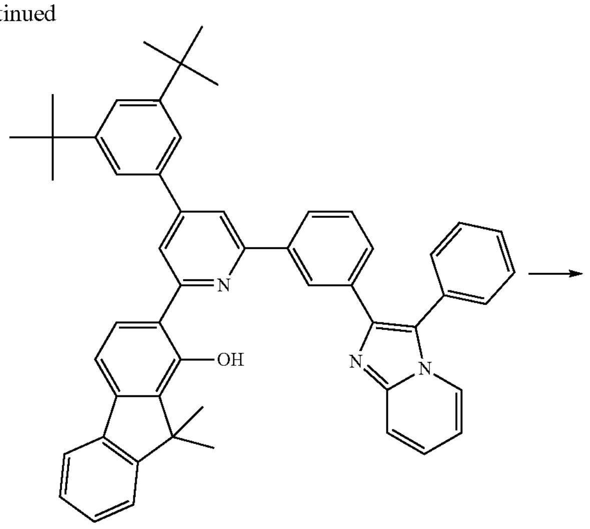

CPD 20-6

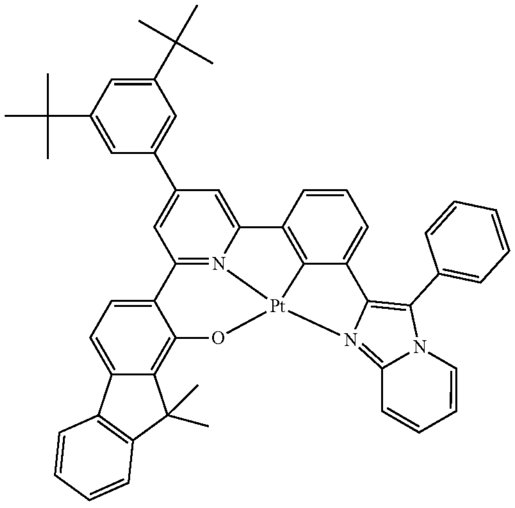

CPD 20

Synthesis of a Compound CPD20-2:

A compound CPD20-1 (15.6 g, 53.95 mmol, 1.0 eq), N,N-dimethylformamide (160 ml), and potassium carbonate (11.18 g, 80.92 mmol, 1.5 eq) were added into a 500 ml three-mouth flask. Deoxidization was conducted on the device for 3 times, and nitrogen was introduced for protection. A mixture obtained was stirred at room temperature for 30 minutes, and then iodomethane (9.19 g, 64.74 mmol, 1.2 eq) was added in batches, and stirred at room temperature for a reaction overnight. According to plate pointing by TLC (with a mixture of dichloromethane and n-hexane at a ratio of 1:15 as a developing agent), the CPD20-1 was basically consumed completely. Deionized water (200 ml) was added into a reaction solution, and stirred for 1 hour. After filtration was conducted, a solid was collected. The solid obtained was recrystallized with dichloromethane (90 ml)/methanol (180 ml) for 2 times to obtain 12.86 g of a white-like solid CPD20-2 with a yield of 78.6%. Mass spectrometry was as follows: 304.2 (M+H).

Synthesis of a Compound CPD20-3:

With reference to the synthesis process and post-treatment and purification methods of the compound A1, only the corresponding raw materials were required to be changed. Mass spectrometry was as follows: 351.3 (M+H).

Synthesis of a Compound CPD20-4:

With reference to the synthesis process and post-treatment and purification methods of the compound CPD1-3, only the corresponding raw materials were required to be changed. Mass spectrometry was as follows: 525.1 (M+H).

Synthesis of a Compound CPD20-5:

With reference to the synthesis process and post-treatment and purification methods of the compound CPD1-4, only the corresponding raw materials were required to be changed. Mass spectrometry was as follows: 759.0 (M+H).

Synthesis of a Compound CPD20-6:

With reference to the synthesis process and post-treatment and purification methods of the compound CPD1-5, only the corresponding raw materials were required to be changed. Mass spectrometry was as follows: 744.0 (M+H).

Synthesis of a Compound CPD20:

With reference to the synthesis process and post-treatment and purification methods of the compound CPD1, only the corresponding raw materials were required to be changed, and 4.32 g of an orange yellow compound CPD20 with a yield of 63.2% was obtained. 4.32 g of the crude product CPD20 was sublimated and purified to obtain 2.68 g of a sublimated pure product CPD20 with a yield of 62.0%. Mass spectrometry was as follows: 936.3 (M+H). $^1$HNMR (400 MHz, $CDCl_3$) δ 8.48 (dd, 1H), 8.26 (dd, 1H), 8.20 (s, 2H), 8.00 (d, 1H), 7.96-7.80 (m, 4H), 7.76-7.60 (m, 4H), 7.52 (m, J=22.5, 7.5 Hz, 5H), 7.34 (dd, 2H), 7.23 (m, J=16.4 Hz, 2H), 6.86 (m, 1H), 1.69 (s, 6H), 1.32 (s, 18H).

Example 5 Synthesis of a Compound CPD 35

Synthesis of an Intermediate A2:

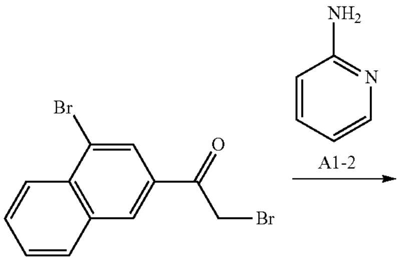

A2-1

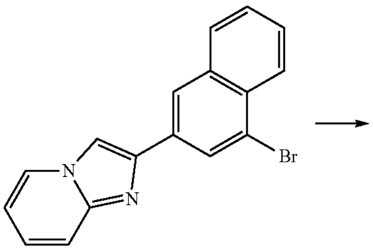

A2-2

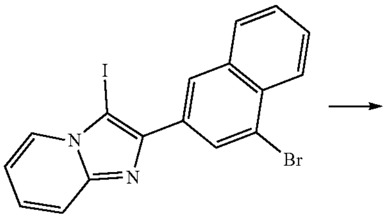

A2-3

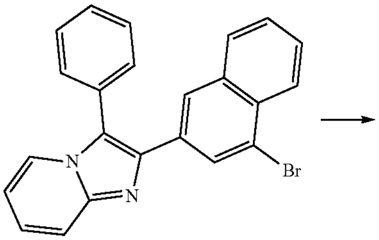

A2-4

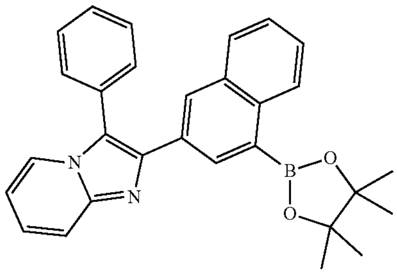

A2

Synthesis of a Compound A2-2:

With reference to the synthesis process and post-treatment and purification methods of the compound A1-3, only the corresponding raw materials were required to be changed. Mass spectrometry was as follows: 324.2 (M+H).

Synthesis of a Compound A2-3:

With reference to the synthesis process and post-treatment and purification methods of the compound A1-4, only the corresponding raw materials were required to be changed. Mass spectrometry was as follows: 450.1 (M+H).

Synthesis of a Compound A2-4:

With reference to the synthesis process and post-treatment and purification methods of the compound A1-5, only the corresponding raw materials were required to be changed. Mass spectrometry was as follows: 400.3 (M+H).

Synthesis of a Compound A2:

With reference to the synthesis process and post-treatment and purification methods of the compound A1, only the corresponding raw materials were required to be changed. Mass spectrometry was as follows: 447.3 (M+H).

Synthesis of a Compound CPD 35:

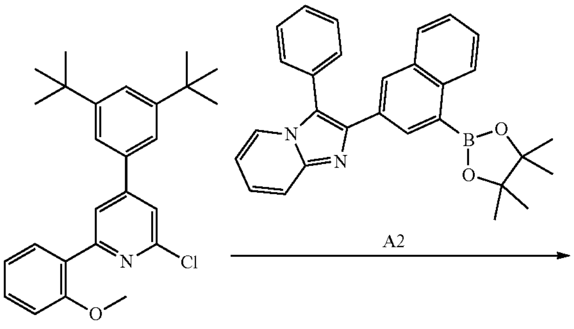

CPD 5-2

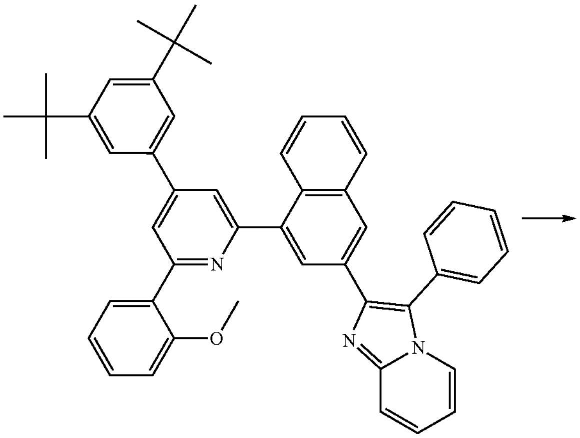

CPD 35-1

-continued

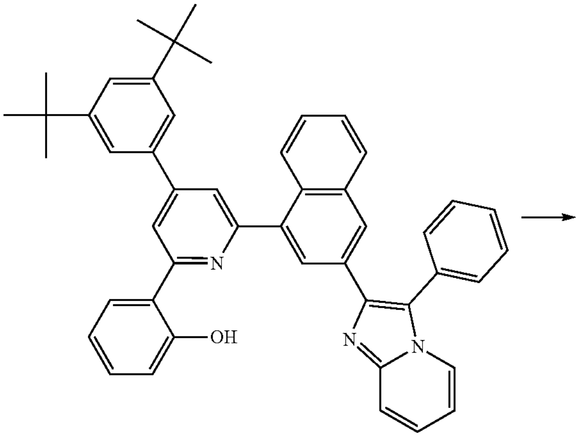

CPD 35-2

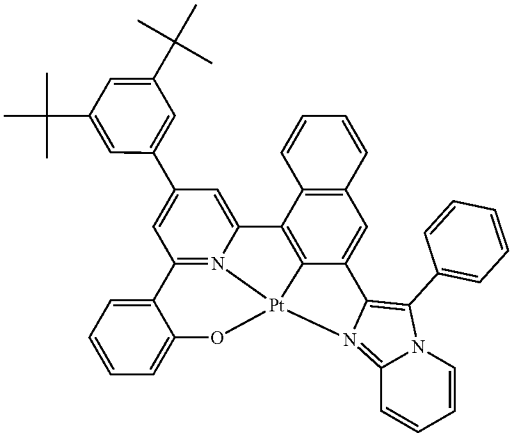

CPD 35

Synthesis of a Compound CPD35-1:

With reference to the synthesis process and post-treatment and purification methods of the compound CPD1-4, only the corresponding raw materials were required to be changed. Mass spectrometry was as follows: 692.9 (M+H).

Synthesis of a Compound CPD35-2:

With reference to the synthesis process and post-treatment and purification methods of the compound CPD1-5, only the corresponding raw materials were required to be changed. Mass spectrometry was as follows: 678.9 (M+H).

Synthesis of a Compound CPD35:

With reference to the synthesis process and post-treatment and purification methods of the compound CPD1, only the corresponding raw materials were required to be changed, and 5.1 g of an orange yellow compound CPD35 with a yield of 65.1% was obtained. 5.1 g of the crude product CPD35 was sublimated and purified to obtain 3.02 g of a sublimated pure product CPD35 with a yield of 59.2%. Mass spectrometry was as follows: 871.9 (M+H). $^1$HNMR (400 MHz, $CDCl_3$) δ8.97 (m, 1H), 8.65 (m, 1H), 8.48 (dd, 1H), 8.20 (s, 2H), 7.84 (m, 3H), 7.73 (d, 2H), 7.60-7.43 (m, 7H), 7.34-7.15 (m, 3H), 6.97 (m, 2H), 6.86 (m, 1H), 1.32 (s, 18H).

Example 6 Synthesis of a Compound CPD 40

Synthesis of an Intermediate A3:

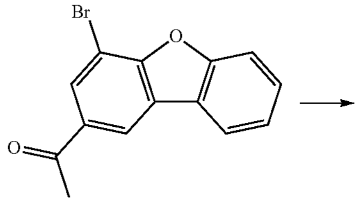

A3-1

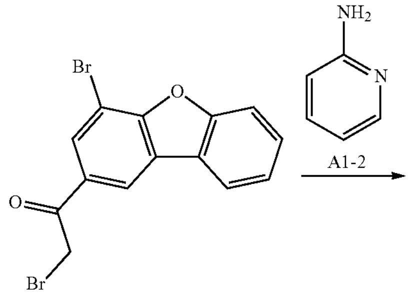

A3-2

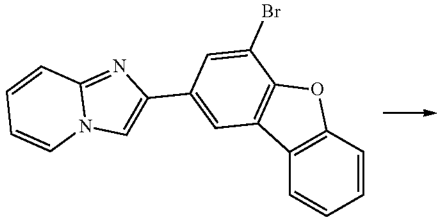

A3-3

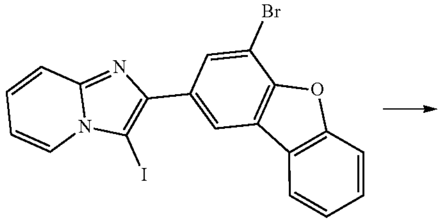

A3-4

-continued

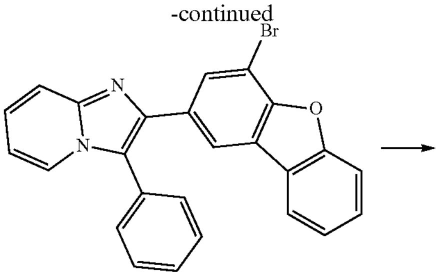

A3-5

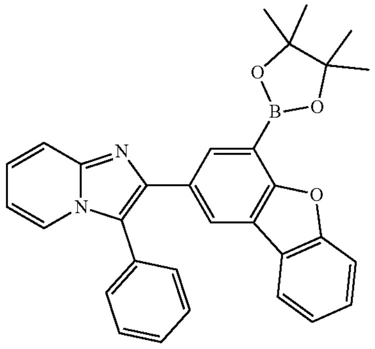

A3

Synthesis of a Compound A3-2:

A compound A3-1 (13.2 g, 45.66 mmol, 1.0 eq) and dichloromethane (105 ml) were sequentially added into a 500 ml three-mouth flask, and stirred for thorough dissolution. Then, acetic acid (14 ml) was added at room temperature, and bromine (7.66 g, 47.94 mmol, 1.05 eq) was slowly dropped with a dropping funnel for a reaction for 3 hours. According to plate pointing by TLC (with a mixture of DCM and Hex at a ratio of 1:5 as a developing agent), the A3-1 was basically consumed completely. A 10% sodium bisulfite (150 ml) solution was slowly added, and stirred for 0.5 hour for liquid separation. An organic phase was collected, washed with deionized water for 3 times (100 ml/time) until an aqueous phase was nearly neutral, and then concentrated to obtain a solid. The solid was beaten with n-hexane (250 ml) for 2 hours. After filtration was conducted, a solid was rinsed with a small amount of n-hexane, and dried to obtain 13.64 g of a white solid with a yield of 81.2%. Mass spectrometry was as follows: 369.0 (M+H).

Synthesis of a Compound A3-3:

With reference to the synthesis process and post-treatment and purification methods of the compound A1-3, only the corresponding raw materials were required to be changed. Mass spectrometry was as follows: 364.2 (M+H).

Synthesis of a Compound A3-4:

With reference to the synthesis process and post-treatment and purification methods of the compound A1-4, only the corresponding raw materials were required to be changed. Mass spectrometry was as follows: 490.1 (M+H).

Synthesis of a Compound A3-5:

With reference to the synthesis process and post-treatment and purification methods of the compound A1-5, only the corresponding raw materials were required to be changed. Mass spectrometry was as follows: 440.3 (M+H).

Synthesis of a Compound A3:

With reference to the synthesis process and post-treatment and purification methods of the compound A1, only the corresponding raw materials were required to be changed. Mass spectrometry was as follows: 487.4 (M+H).

Synthesis of a Compound CPD 40:

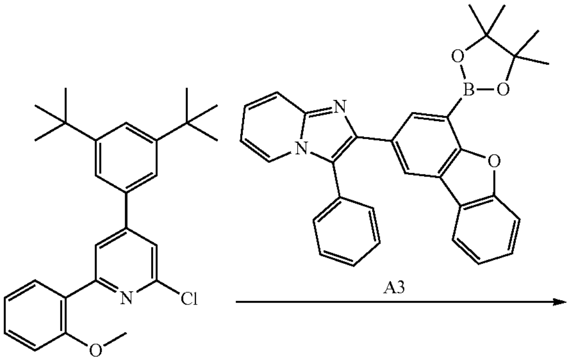

CPD 5-2

A3

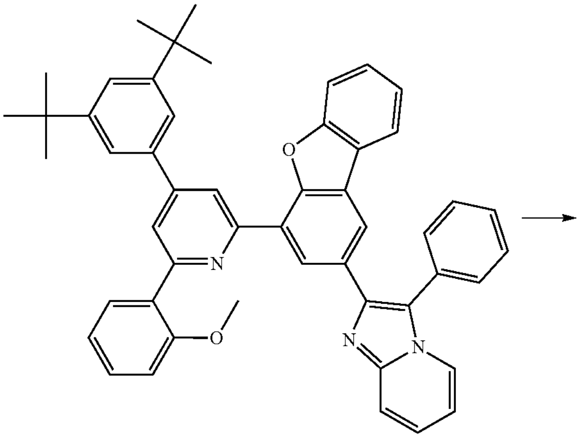

CPD 40-1

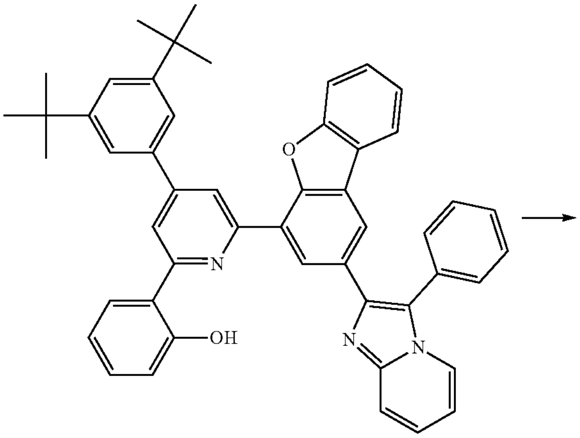

CPD 40-2

-continued

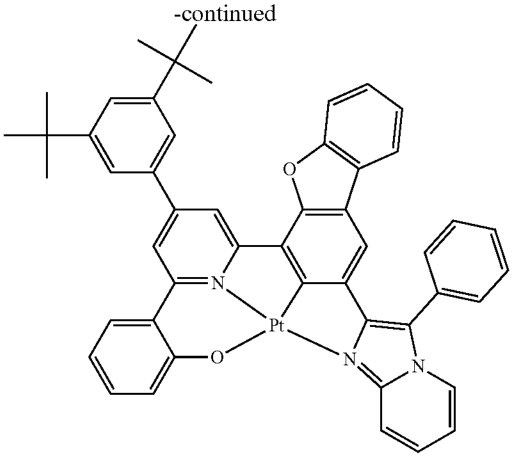

CPD 40

Synthesis of a Compound CPD40-1:

With reference to the synthesis process and post-treatment and purification methods of the compound CPD1-4, only the corresponding raw materials were required to be changed. Mass spectrometry was as follows: 732.9 (M+H).

Synthesis of a Compound CPD40-2:

With reference to the synthesis process and post-treatment and purification methods of the compound CPD1-5, only the corresponding raw materials were required to be changed. Mass spectrometry was as follows: 718.9 (M+H).

Synthesis of a Compound CPD40:

With reference to the synthesis process and post-treatment and purification methods of the compound CPD1, only the corresponding raw materials were required to be changed, and 4.69 g of an orange yellow compound CPD40 with a yield of 59.1% was obtained. 4.69 g of the crude product CPD40 was sublimated and purified to obtain 2.84 g of a sublimated pure product CPD40 with a yield of 60.6%. Mass spectrometry was as follows: 912.0 (M+H). $^{1}$HNMR (400 MHz, $CDCl_3$) δ 8.65 (m, 1H), 8.48 (dd, 1H), 8.20 (s, 2H), 7.98 (dd, 1H), 7.84 (m, 2H), 7.73 (d, 2H), 7.63-7.45 (m, 6H), 7.44-7.15 (m, 5H), 6.97 (m, 2H), 6.86 (m, 1H), 1.32 (s, 18H).

Example 7 Synthesis of a Compound CPD 55

Synthesis of an Intermediate A4:

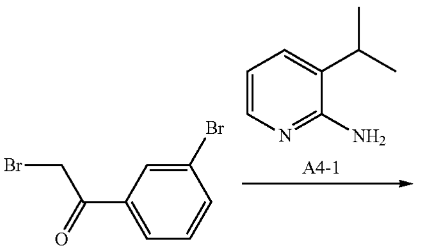

A4-1

A1-1

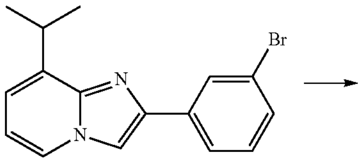

A4-2

-continued

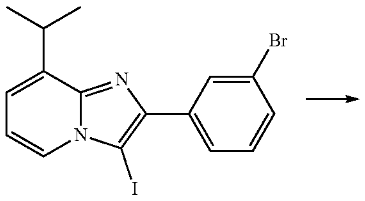

A4-3

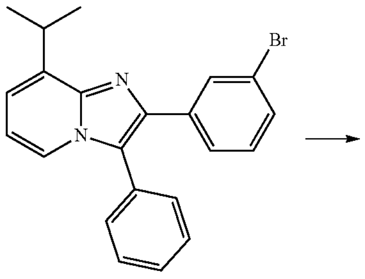

A4-4

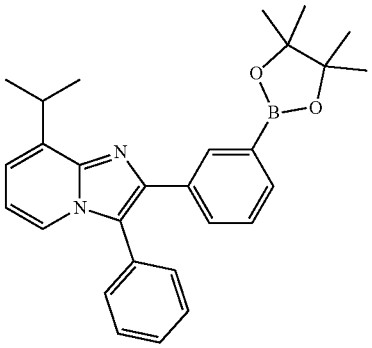

A4

Synthesis of a Compound A4-2:

With reference to the synthesis process and post-treatment and purification methods of the compound A1-3, only the corresponding raw materials were required to be changed. Mass spectrometry was as follows: 316.2 (M+H).

Synthesis of a Compound A4-3:

With reference to the synthesis process and post-treatment and purification methods of the compound A1-4, only the corresponding raw materials were required to be changed. Mass spectrometry was as follows: 442.1 (M+H).

Synthesis of a Compound A4-4:

With reference to the synthesis process and post-treatment and purification methods of the compound A1-5, only the corresponding raw materials were required to be changed. Mass spectrometry was as follows: 392.3 (M+H).

Synthesis of a Compound A4:

With reference to the synthesis process and post-treatment and purification methods of the compound A1, only the corresponding raw materials were required to be changed. Mass spectrometry was as follows: 438.4 (M+H).

Synthesis of a Compound CPD 55:

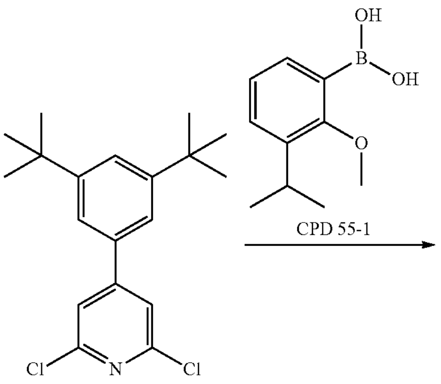

CPD 55-1

CPD 5-1

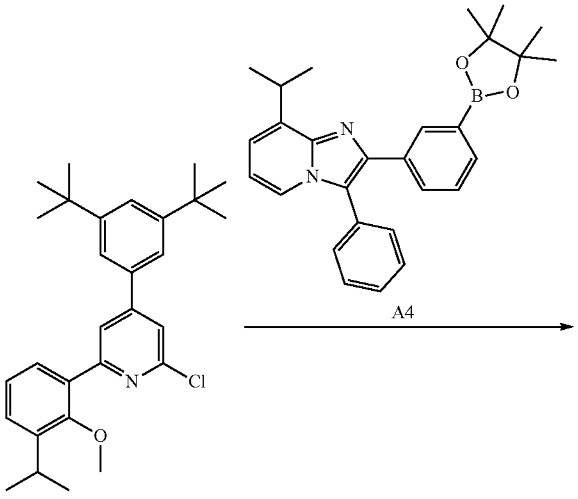

A4

CPD 55-2

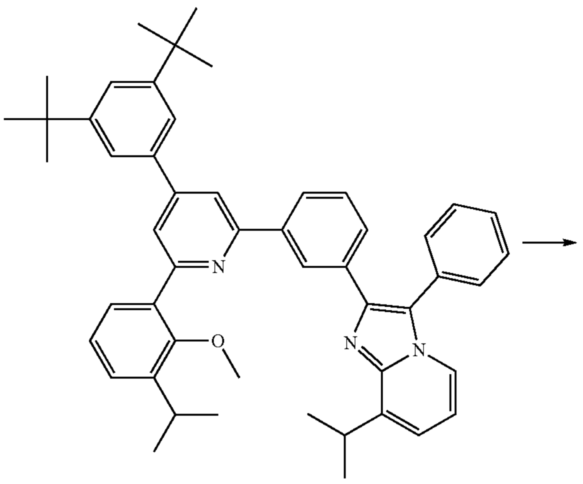

CPD 55-3

-continued

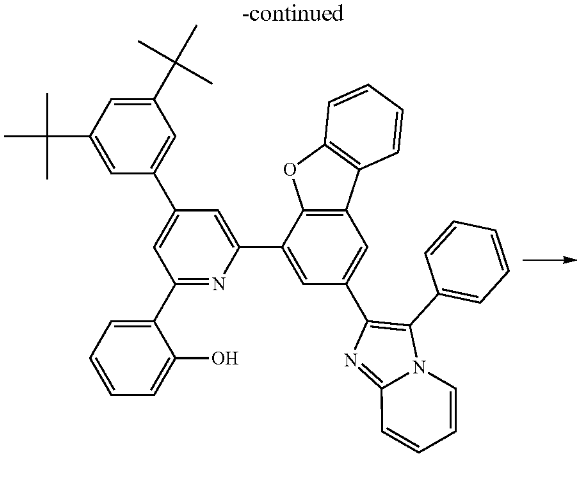

CPD 55-4

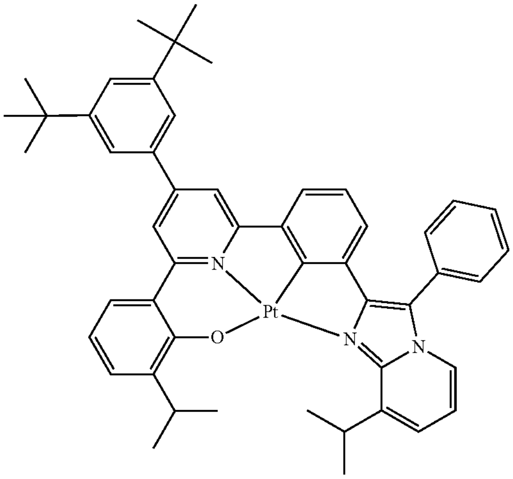

CPD 55

Synthesis of a Compound CPD55-2:

With reference to the synthesis process and post-treatment and purification methods of the compound CPD1-3, only the corresponding raw materials were required to be changed. Mass spectrometry was as follows: 451.1 (M+H).

Synthesis of a Compound CPD55-3:

With reference to the synthesis process and post-treatment and purification methods of the compound CPD1-4, only the corresponding raw materials were required to be changed. Mass spectrometry was as follows: 727.0 (M+H).

Synthesis of a Compound CPD55-4:

With reference to the synthesis process and post-treatment and purification methods of the compound CPD1-5, only the corresponding raw materials were required to be changed. Mass spectrometry was as follows: 718.9 (M+H).

Synthesis of a Compound CPD55:

With reference to the synthesis process and post-treatment and purification methods of the compound CPD1, only the corresponding raw materials were required to be changed, and 5.11 g of an orange yellow compound CPD55 with a yield of 67.2% was obtained. 5.11 g of the crude product CPD55 was sublimated and purified to obtain 3.21 g of a sublimated pure product CPD55 with a yield of 62.8%. Mass spectrometry was as follows: 906.0 (M+H). $^1$HNMR (400 MHz, $CDCl_3$) δ 8.55 (dd, 1H), 8.46 (dd, 1H), 8.26 (dd, 1H), 8.20 (s, 2H), 7.86 (m, J=15.0 Hz, 3H), 7.71 (m, J=15.0 Hz, 3H), 7.60-7.39 (m, 5H), 7.22 (dd, 1H), 7.07 (t, 1H), 6.77 (t, 1H), 3.05 (tq, 1H), 2.87 (tq, 1H), 1.32 (s, 18H), 1.15 (t, J=15.0 Hz, 12H).

Example 8 Synthesis of a Compound CPD 60

Synthesis of an intermediate A5:

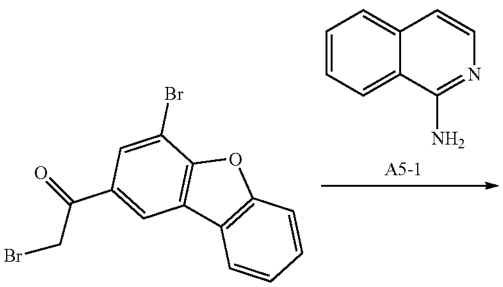

A5-1

A3-2

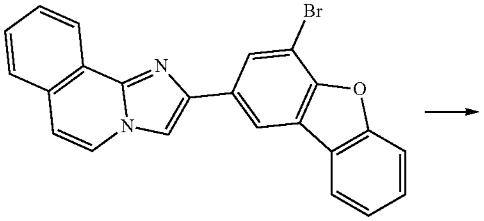

A5-2

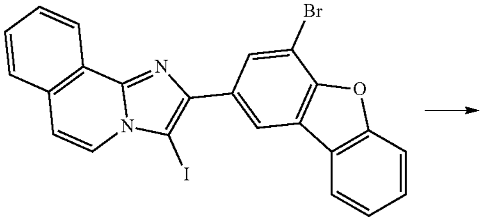

A5-3

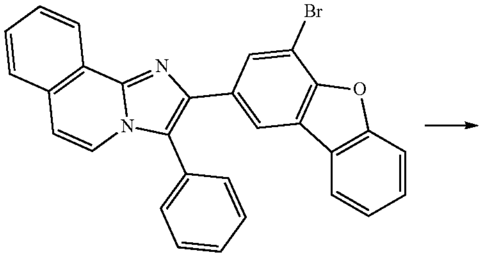

A5-4

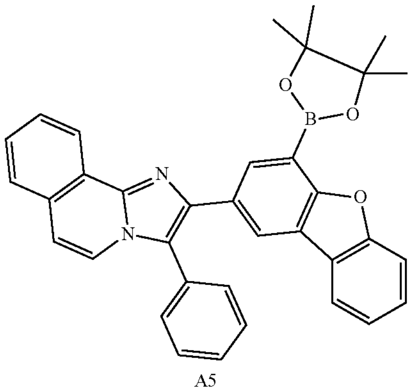

A5

Synthesis of a Compound A5-2:

With reference to the synthesis process and post-treatment and purification methods of the compound A1-3, only the corresponding raw materials were required to be changed. Mass spectrometry was as follows: 414.3 (M+H).

Synthesis of a Compound A5-3:

With reference to the synthesis process and post-treatment and purification methods of the compound A1-4, only the corresponding raw materials were required to be changed. Mass spectrometry was as follows: 540.2 (M+H).

Synthesis of a Compound A5-4:

With reference to the synthesis process and post-treatment and purification methods of the compound A1-5, only the corresponding raw materials were required to be changed. Mass spectrometry was as follows: 490.4 (M+H).

Synthesis of a Compound A5:

With reference to the synthesis process and post-treatment and purification methods of the compound A1, only the corresponding raw materials were required to be changed. Mass spectrometry was as follows: 537.4 (M+H).

Synthesis of a Compound CPD 60:

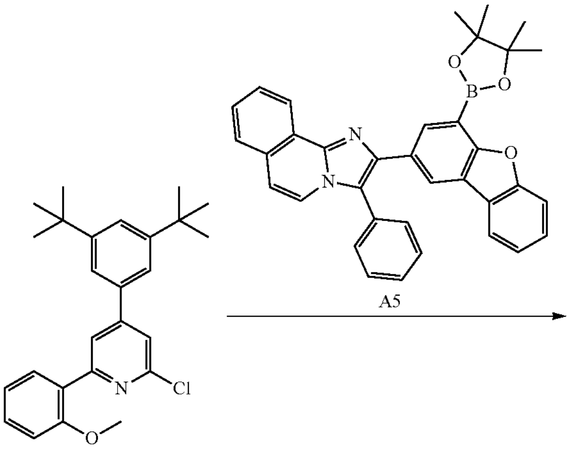

A5

CPD 5-2

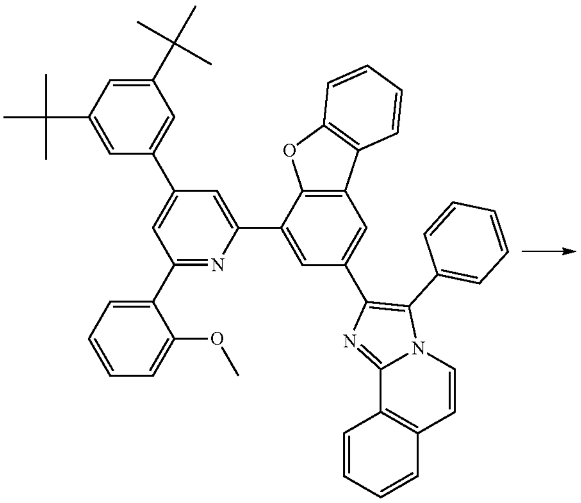

CPD 60-1

-continued

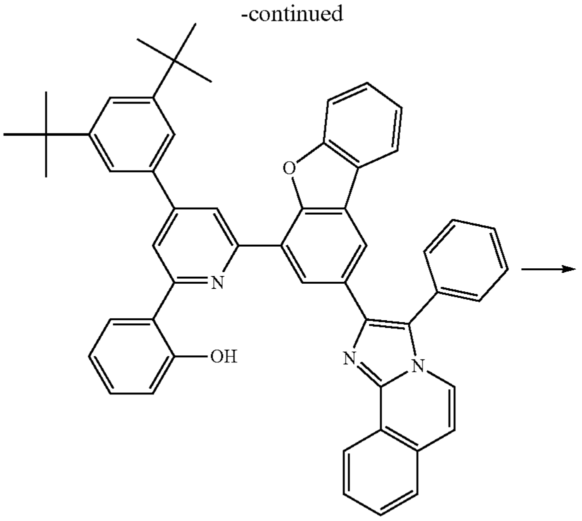

CPD 60-2

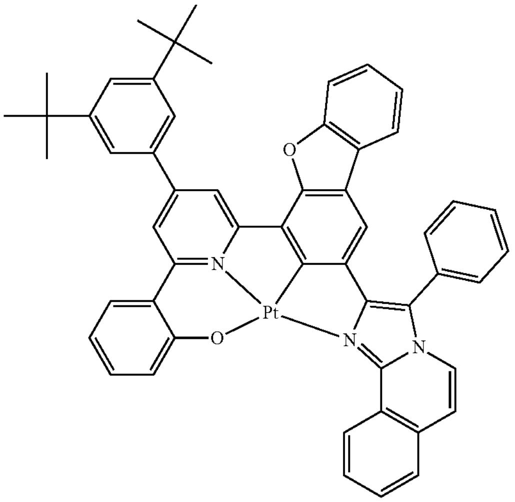

CPD 60

Synthesis of a Compound CPD60-1:

With reference to the synthesis process and post-treatment and purification methods of the compound CPD1-4, only the corresponding raw materials were required to be changed. Mass spectrometry was as follows: 783.0 (M+H).

Synthesis of a Compound CPD60-2:

With reference to the synthesis process and post-treatment and purification methods of the compound CPD1-5, only the corresponding raw materials were required to be changed. Mass spectrometry was as follows: 769.0 (M+H).

Synthesis of a Compound CPD60:

With reference to the synthesis process and post-treatment and purification methods of the compound CPD1, only the corresponding raw materials were required to be changed, and 3.95 g of an orange yellow compound CPD60 with a yield of 55.7% was obtained. 3.95 g of the crude product CPD60 was sublimated and purified to obtain 2.27 g of a sublimated pure product CPD60 with a yield of 57.4%. Mass spectrometry was as follows: 962.0 (M+H). $^1$HNMR (400 MHz, $CDCl_3$) δ 8.65 (m, 1H), 8.20 (s, 2H), 7.96 (m, J=20.0 Hz, 2H), 7.84 (m, 4H), 7.80-7.46 (m, 11H), 7.32 (m J=32.5, 22.5 Hz, 4H), 6.97 (m, 1H), 1.32 (s, 18H).

Example 9 Synthesis of a Compound CPD 85

Synthesis of an Intermediate A6:

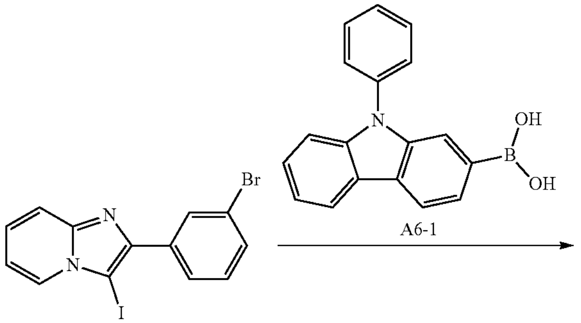

A6-1

A1-4

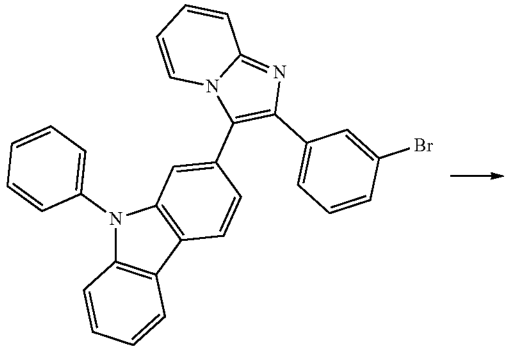

A6-2

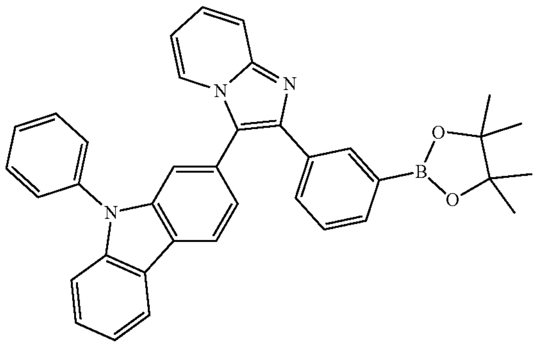

A6

Synthesis of a Compound A6-2:

With reference to the synthesis process and post-treatment and purification methods of the compound A1-5, only the corresponding raw materials were required to be changed. Mass spectrometry was as follows: 515.4 (M+H).

Synthesis of a Compound A6:

With reference to the synthesis process and post-treatment and purification methods of the compound A1, only the corresponding raw materials were required to be changed. Mass spectrometry was as follows: 562.5 (M+H).

Synthesis of a Compound CPD 85:
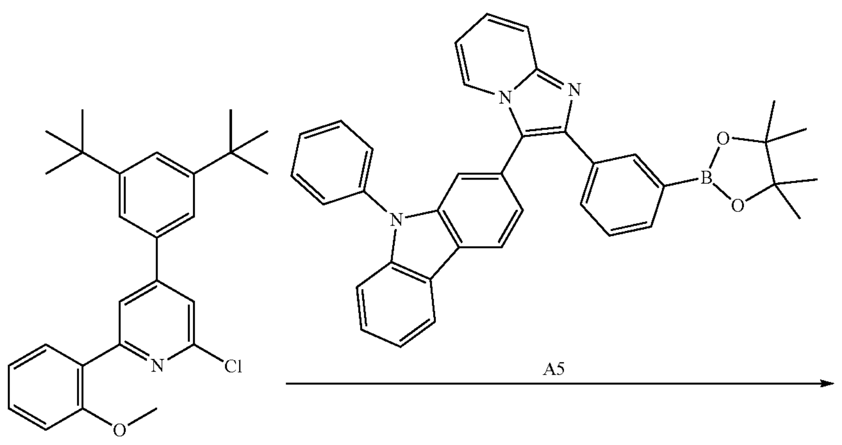
CPD 5-2
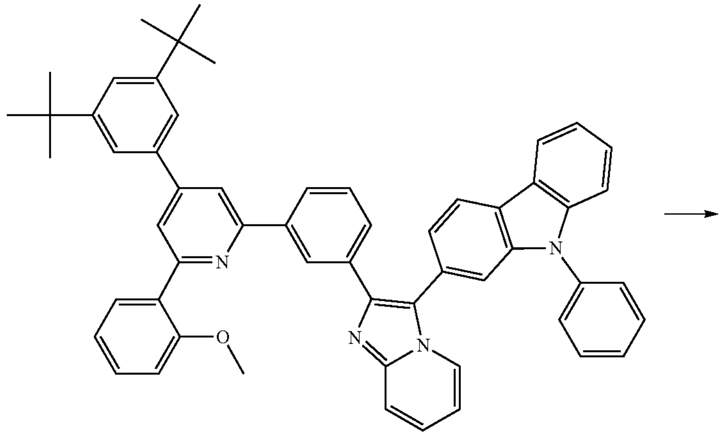
CPD 85-1
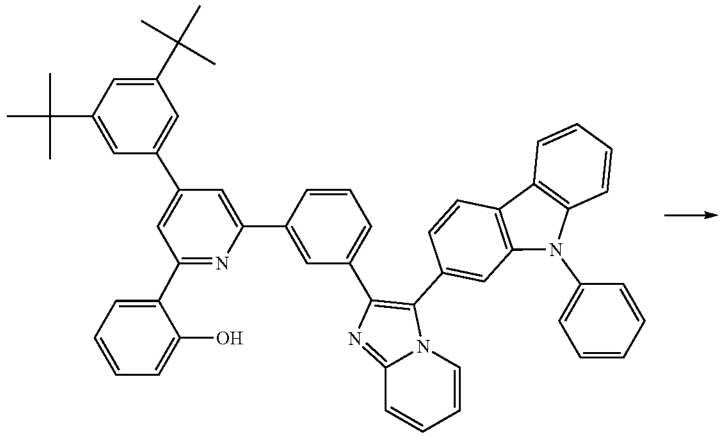
CPD 85-2

-continued

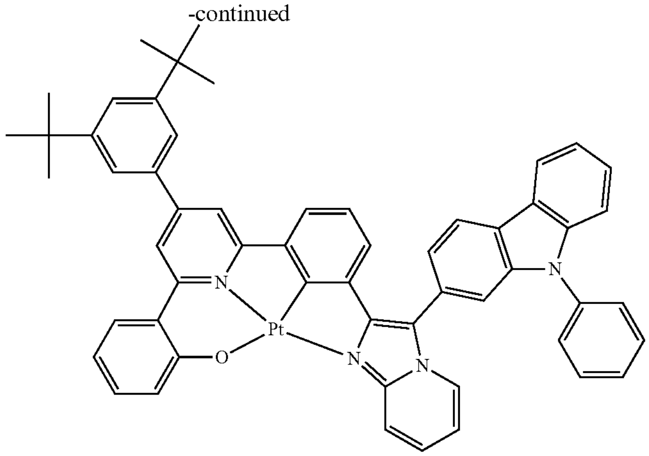

CPD 85

Synthesis of a Compound CPD85-1:

With reference to the synthesis process and post-treatment and purification methods of the compound CPD1-4, only the corresponding raw materials were required to be changed. Mass spectrometry was as follows: 808.0 (M+H).

Synthesis of a Compound CPD85-2:

With reference to the synthesis process and post-treatment and purification methods of the compound CPD1-5, only the corresponding raw materials were required to be changed. Mass spectrometry was as follows: 793.0 (M+H).

Synthesis of a Compound CPD85:

With reference to the synthesis process and post-treatment and purification methods of the compound CPD1, only the corresponding raw materials were required to be changed, and 4.02 g of an orange yellow compound CPD85 with a yield of 57.3% was obtained. 4.02 g of the crude product CPD85 was sublimated and purified to obtain 2.65 g of a sublimated pure product CPD85 with a yield of 65.9%. Mass spectrometry was as follows: 987.1 (M+H). $^1$HNMR (400 MHz, $CDCl_3$) δ8.65 (m, 1H), 8.51 (m, J=35.0 Hz, 2H), 8.26 (dd, 1H), 8.20 (s, 2H), 7.84 (m, J=25.0 Hz, 2H), 7.71 (t, J=15.0 Hz, 3H), 7.65-7.37 (m, 9H), 7.36-7.05 (m, 5H), 6.97 (m, 2H), 6.86 (m, 1H), 1.32 (s, 18H).

Example 10 Synthesis of a Compound CPD 110

Synthesis of a Compound CPD 110:

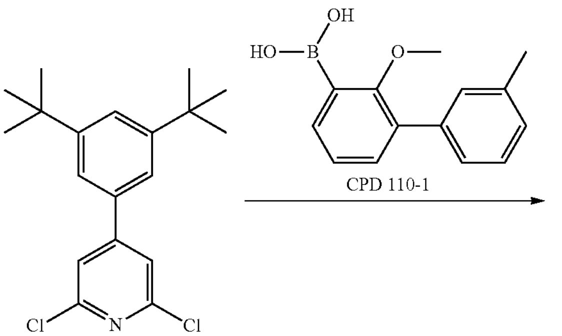

CPD 110-1

CPD 5-1

-continued

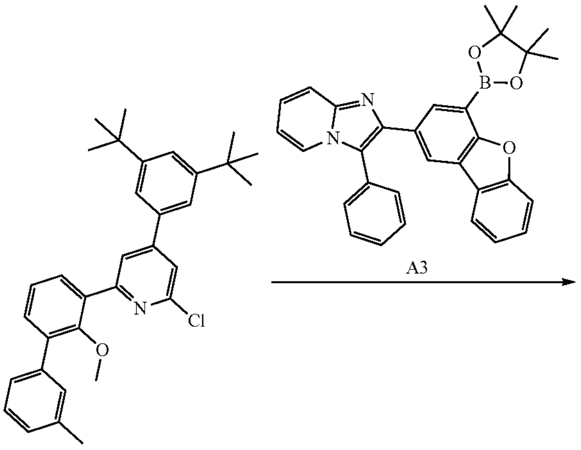

CPD 110-2

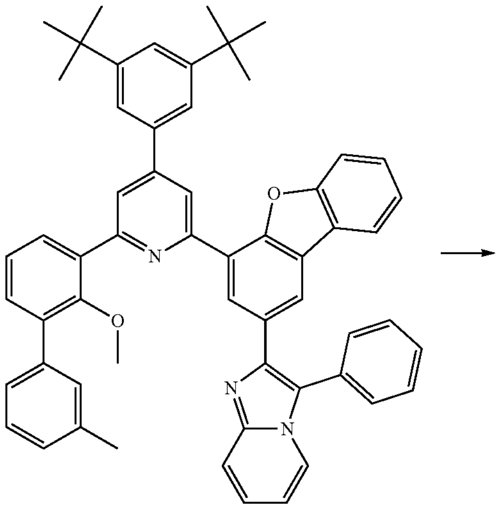

CPD 110-3

-continued

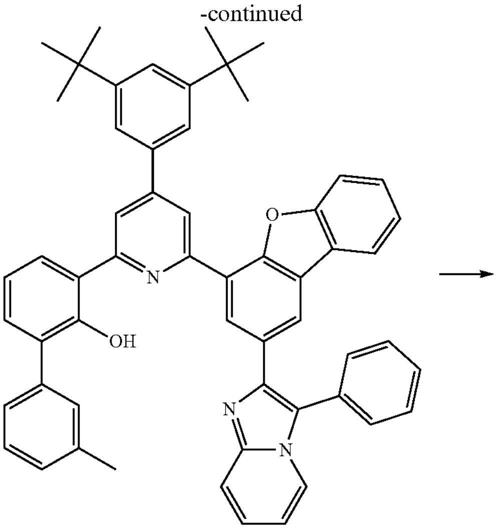

CPD 110-4

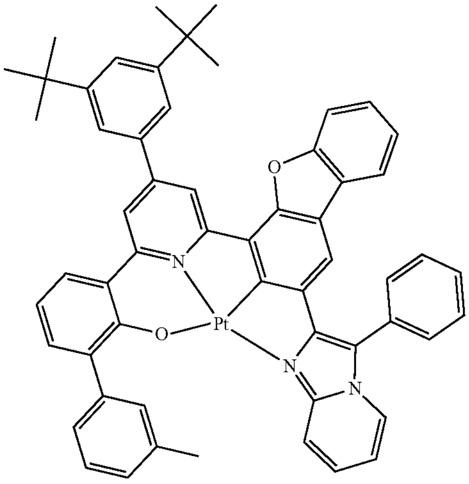

CPD 110

Synthesis of a Compound CPD110-2:

With reference to the synthesis process and post-treatment and purification methods of the compound CPD1-3, only the corresponding raw materials were required to be changed. Mass spectrometry was as follows: 499.1 (M+H).

Synthesis of a Compound CPD110-3:

With reference to the synthesis process and post-treatment and purification methods of the compound CPD1-4, only the corresponding raw materials were required to be changed. Mass spectrometry was as follows: 823.0 (M+H).

Synthesis of a Compound CPD110-4:

With reference to the synthesis process and post-treatment and purification methods of the compound CPD1-5, only the corresponding raw materials were required to be changed. Mass spectrometry was as follows: 808.0 (M+H).

Synthesis of a Compound CPD110:

With reference to the synthesis process and post-treatment and purification methods of the compound CPD1, only the corresponding raw materials were required to be changed, and 3.88 g of an orange yellow compound CPD110 with a yield of 57.1% was obtained. 3.88 g of the crude product CPD110 was sublimated and purified to obtain 2.2 g of a sublimated pure product CPD110 with a yield of 56.7%. Mass spectrometry was as follows: 1002.1 (M+H). $^{1}$HNMR (400 MHz, $CDCl_3$) δ 8.75 (dd, 1H), 8.48 (dd, 1H), 8.20 (s, 2H), 7.95 (m, J=30.0 Hz, 2H), 7.81 (m, J=30.0 Hz, 3H), 7.73 (d, 2H), 7.62-7.45 (m, 7H), 7.44-7.12 (m, 7H), 6.86 (s, 1H), 2.50 (s, 3H), 1.32 (s, 18H).

Application Example: Manufacture of an Organic Electroluminescent Device

A glass substrate with a size of 50 mm*50 mm*1.0 mm including an ITO (100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Next, a layer of HTM1 was evaporated to form a thin film with a thickness of 60 nm. Then, a layer of HTM2 was evaporated on the HTM1 thin film to form a thin film with a thickness of 10 nm. After that, a main material 1, a main material 2, and a doping compound (including reference compounds X and CPD X) were co-evaporated on the HTM2 film layer to obtain a film with a thickness of 30 nm, where a ratio of the main material 1 to the main material 2 to the doping material was 45%:45%:10%. An electron transport layer (ETL) film layer (25 nm) and a LiQ film layer (1 nm) was evaporated on a light-emitting layer in sequence. At last, a layer of metal Al (100 nm) was evaporated to serve as an electrode.

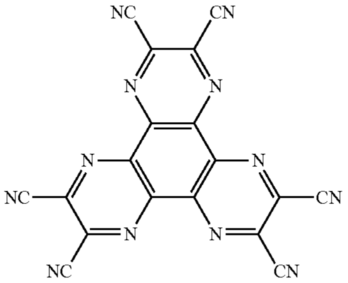

HATCN

HTM 1

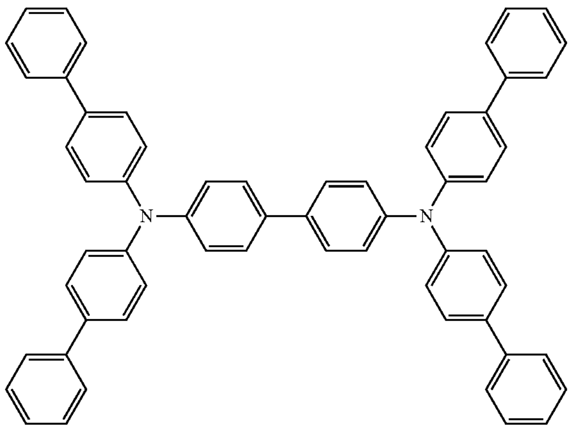

HTM 2
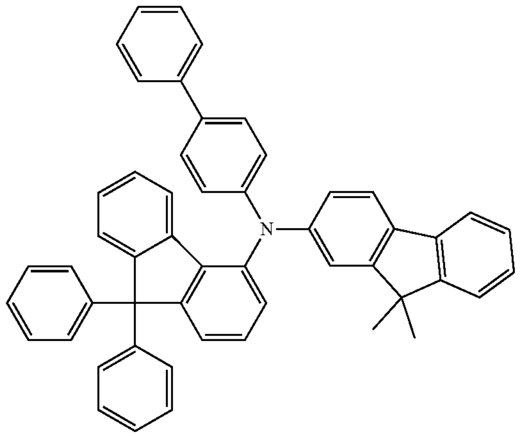
Main material 1
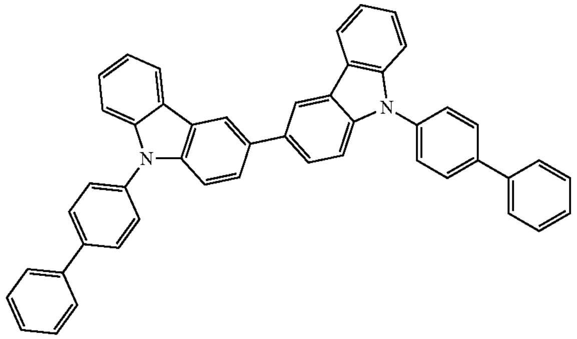
Main material 2
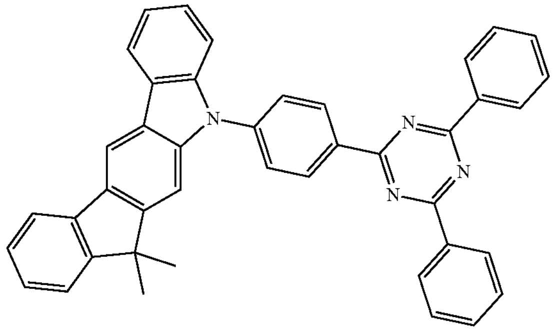
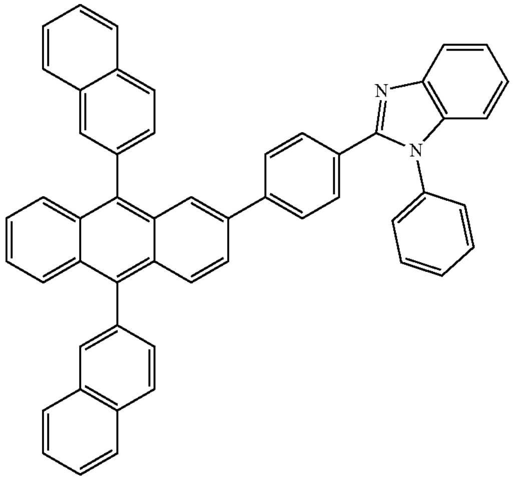
ETL
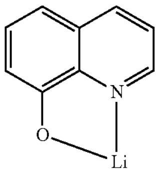
EIL
Reference 1
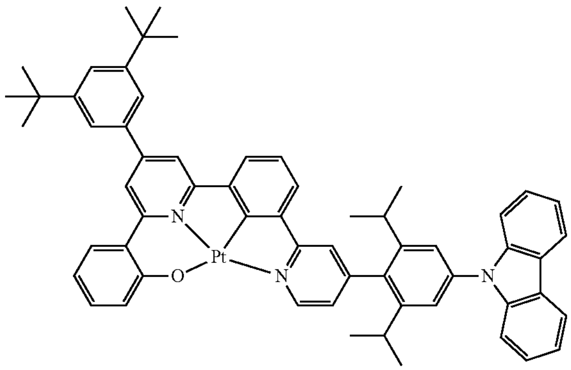
Reference 2
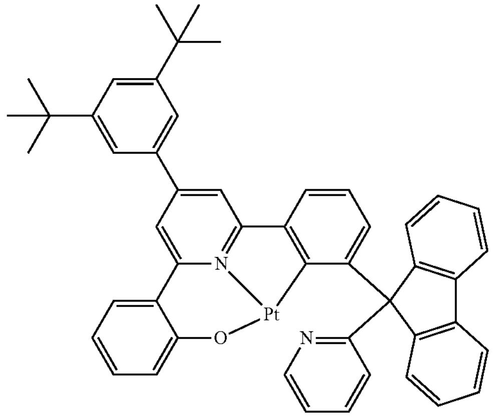

-continued

Reference 3

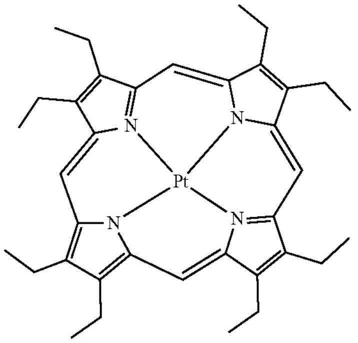

Reference 4

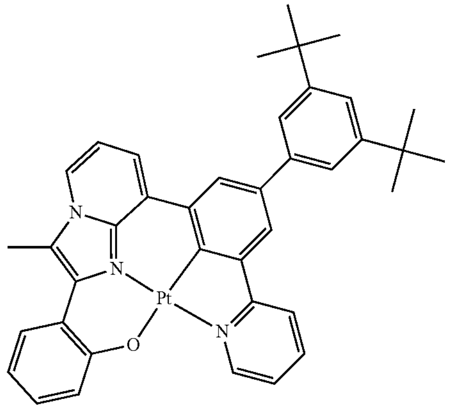

Evaluation:

Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT90) when the brightness was reduced to 90% of an initial brightness was tested. Results are shown as follows.

| | Doping material | Starting voltage V | Current efficiency Cd/A | Peak wavelength nm | LT90@ 3000 nits |
|---|---|---|---|---|---|
| Example 1 | CPD 1 | 4.78 | 38 | 525 | 138 |
| Example 2 | CPD 5 | 4.72 | 44 | 527 | 142 |
| Example 3 | CPD 10 | 4.68 | 45 | 528 | 158 |
| Example 4 | CPD 20 | 4.66 | 52 | 529 | 179 |
| Example 5 | CPD 35 | 4.76 | 46 | 563 | 192 |
| Example 6 | CPD 40 | 4.75 | 49 | 548 | 212 |
| Example 7 | CPD 55 | 4.69 | 47 | 528 | 173 |
| Example 8 | CPD 60 | 4.78 | 34 | 616 | 258 |
| Example 9 | CPD 85 | 4.71 | 52 | 528 | 243 |
| Example 10 | CPD 110 | 4.74 | 49 | 564 | 211 |
| Comparative Example 1 | Reference 1 | 4.82 | 32 | 515 | 117 |
| Comparative Example 2 | Reference 2 | 4.86 | 38 | 517 | 136 |
| Comparative Example 3 | Reference 3 | 5.6 | 21 | 648 | 90 |
| Comparative Example 4 | Reference 4 | 5.4 | 31 | 613 | 144 |

Through comparison of the data in the above table, it can be seen that compared with reference compounds, the compound of the present invention used as a dopant in an organic electroluminescent device has the advantages that more excellent properties, such as driving voltage, luminescence efficiency, and device service life, are achieved.

According to the above results, it is indicated that the compound of the present invention has the advantages of high optical and electrochemical stability, high color saturation, high luminescence efficiency, and long device service life, and can be used in organic electroluminescent devices. In particular, the metal complex has the potential for application in the OLED industry as a red light-emitting dopant, a yellow light-emitting dopant, or a green light-emitting dopant.

The invention claimed is:

1. A quadridentate metal complex, having a structure as shown in the following formula (1):

Formula (1)

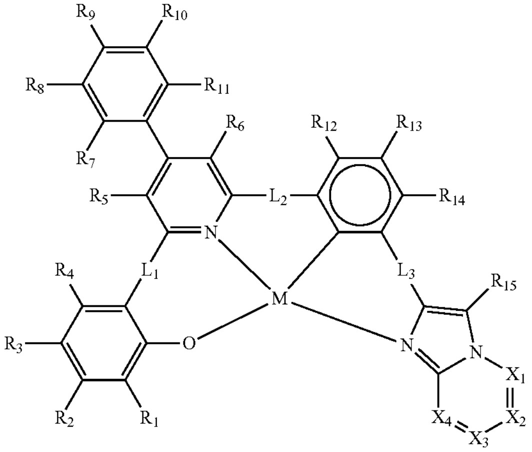

wherein

M is independently Pt or Pd;

each of $X_1$-$X_4$ is independently selected from N or CR0;

each of $L_1$ and $L_3$ is independently selected from a directly bonded single bond, O, S, Se, NRa, CRbRc, SO, $SO_2$, PO (Rd) (Re), SiRfRg, and GeRhRi; $L_2$ is a directly bonded single bond;

each of $R_0$, $R_1$-$R_{15}$, and Ra-Ri is independently selected from hydrogen, deuterium, halogen, cyano, nitrile, isonitrile, phosphino, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$_aralkyl, substituted or unsubstituted $C_1$-$C_{20}$ alkoxy, substituted or unsubstituted $C_6$-$C_{30}$_aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, or substituted or unsubstituted $C_0$-$C_{20}$ amino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

2. The quadridentate metal complex according to claim 1, having a structure as shown in the following formula (2):

Formula (2)

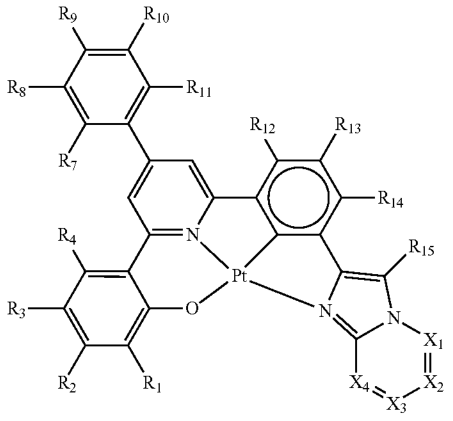

wherein $X_1$-$X_4$, $R_1$-$R_4$, and $R_7$-$R_{15}$ are defined the same as above.

3. The quadridentate metal complex according to claim 2, having a structure as shown in the following formula (3):

Formula (3)

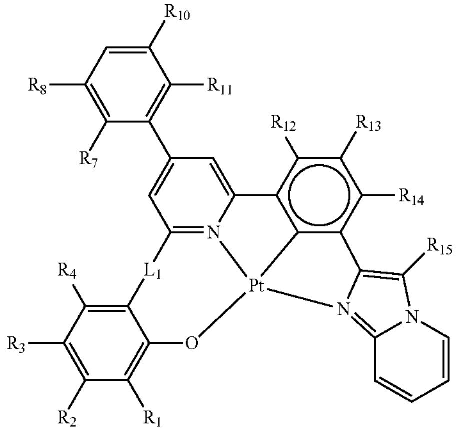

wherein $R_1$-$R_4$, $R_7$, $R_8$, and $R_{10}$-$R_{15}$ are defined the same as above.

4. The quadridentate metal complex according to claim 3, wherein the $R_7$, the $R_8$, the $R_{10}$, and the $R_{11}$ are independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$_heteroalkyl, substituted or unsubstituted $C_7$-$C_{10}$_aralkyl, substituted or unsubstituted $C_6$-$C_{10}$ aryl, or substituted or unsubstituted $C_3$-$C_{10}$ heteroaryl.

5. The quadridentate metal complex according to claim 4, wherein at least one of the $R_7$, the $R_8$, the $R_{10}$, and the $R_{11}$ is not hydrogen.

6. The quadridentate metal complex according to claim 3, wherein the $R_{15}$ is independently selected from substituted or unsubstituted $C_6$-$C_{30}$ aryl, or substituted or unsubstituted $C_3$-$C_{30}$ heteroaryl.

7. The quadridentate metal complex according to claim 6, wherein the $R_{15}$ is benzene, or is as shown in the following structural formula (9) or formula (10):

Formula (9)

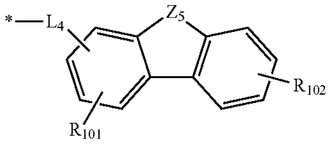

Formula (10)

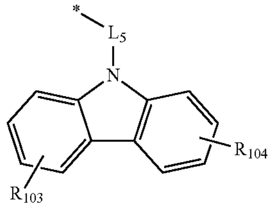

wherein * refers to a connection position;

$Z_5$ is O, S, Se, $NR_{105}$, $CR_{106}R_{107}$, SO, $SO_2$, $PO(R_{108})(R_{109})$, $SiR_{110}R_{111}$, or $GeR_{112}R_{113}$;

the number of $R_{101}$-$R_{104}$ is a maximum substitution number;

$L_4$ and $L_5$ are independently selected from a single bond, substituted or unsubstituted $C_1$-$C_{20}$ alkylene, substituted or unsubstituted $C_3$-$C_{30}$ cycloalkylene, substituted or unsubstituted $C_1$-$C_{20}$ heteroalkylene, substituted or unsubstituted $C_7$-$C_{30}$ aralkylene, substituted or unsubstituted $C_2$-$C_{20}$ alkenylene, substituted or unsubstituted $C_3$-$C_{30}$ alkylene silyl, substituted or unsubstituted $C_6$-$C_{30}$ arylidene, substituted or unsubstituted $C_3$-$C_{30}$ heteroarylidene, substituted or unsubstituted $C_3$-$C_{30}$ arylidene silyl, and substituted or unsubstituted $C_0$-$C_{20}$ imino;

each of $R_{101}$-$R_{113}$ is independently selected from hydrogen, deuterium, halogen, cyano, nitrile, isonitrile, phosphino, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$arylsilyl, or substituted or unsubstituted $C_0$-$C_{20}$ amino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

8. The quadridentate metal complex according to claim 7, wherein the $Z_5$ is O, $NR_{105}$, or $CR_{106}R_{107}$;

the $L_4$ and the $L_5$ are a single bond;

and each of the $R_{101}$-$R_{107}$ is independently selected from hydrogen, deuterium, halogen, substituted or unsubstituted $C_1$-$C_8$ alkyl, substituted or unsubstituted $C_3$-$C_{10}$cycloalkyl, substituted or unsubstituted $C_1$-$C_8$ heteroalkyl, substituted or unsubstituted $C_7$-$C_{10}$aralkyl, substituted or unsubstituted $C_6$-$C_{10}$ aryl, and substituted or unsubstituted $C_3$-$C_{10}$ heteroaryl.

9. The quadridentate metal complex according to claim 1, wherein the $R_{12}$ and the $R_{13}$, or the $R_{13}$ and the $R_{14}$ are connected to form one of fused ring structures as shown in the following formula (4) to formula (7):

Formula (4)

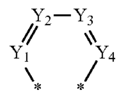

Formula (5)

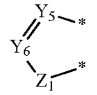

Formula (6)

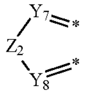

Formula (7)

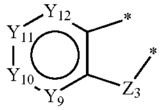

wherein

* refers to a connection position;

$Z_1$-$Z_3$ are selected from O, S, Se, NRx, or CRyRz;

$Y_1$-$Y_{12}$ are, identically or differently on each occurrence, $CR_0$ or N;

each of $R_0$, Rx, Ry, and Rz is independently selected from hydrogen, deuterium, halogen, cyano, nitrile, isonitrile, phosphino, substituted or unsubstituted $C_1$-$C_{20}$ alkyl, substituted or unsubstituted $C_3$-$C_{30}$_cycloalkyl, substituted or unsubstituted $C_1$-$C_{20}$ heteroalkyl, substituted or unsubstituted $C_7$-$C_{30}$_aralkyl, substituted or unsubstituted $C_1$-$C_{20}$ alkoxy, substituted or unsubstituted $C_6$-$C_{30}$_aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, or substituted or unsubstituted $C_0$-$C_{20}$ amino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

10. The quadridentate metal complex according to claim 9, wherein the $Z_1$-$Z_3$ are selected from O, NRx, or CRyRz;

$Y_1$-$Y_{12}$ are, identically or differently on each occurrence, $CR_0$ or N;

and each of the $R_0$, the Rx, the Ry, and the Rz is independently selected from hydrogen, halogen, substituted or unsubstituted $C_1$-$C_8$ alkyl, substituted or unsubstituted $C_3$-$C_{10}$ cycloalkyl, substituted or unsubstituted $C_1$-$C_8$ heteroalkyl, substituted or unsubstituted $C_7$-$C_{10}$_aralkyl, substituted or unsubstituted $C_6$-$C_{10}$ aryl, and substituted or unsubstituted $C_3$-$C_{10}$ heteroaryl.

11. The metal complex according to claim 9, wherein at least one of the R1 and the R2 is not hydrogen.

12. The quadridentate metal complex according to claim 9, wherein the $R_1$ and the $R_2$, or the $R_2$ and the $R_3$, or the $R_3$ and the $R_4$ are connected to form a fused ring structure as shown in the following formula (8):

Formula (8)

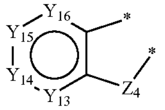

wherein* refers to a connection position;

$Z_4$ refers to O, S, Se, $NR_{201}$, $CR_{202}R_{203}$, SO, $SO_2$, $PO(R_{204})$ $(R_{205})$, $SiR_{206}R_{207}$, or $GeR_{208}R_{209}$;

$Y_{13}$-$Y_{16}$ are, identically or differently on each occurrence, $CR_0$ or N;

each of $R_0$ and $R_{201}$-$R_{209}$ is independently selected from hydrogen, deuterium, halogen,, cyano, nitrile, isonitrile, phosphino, substituted or unsubstituted $C_1$-$C_{20}$ alkyl, substituted or unsubstituted $C_3$-$C_{30}$_cycloalkyl, substituted or unsubstituted $C_1$-$C_{20}$ heteroalkyl, substituted or unsubstituted $C_7$-$C_{30}$_aralkyl, substituted or unsubstituted $C_1$-$C_{20}$ alkoxy, substituted or unsubstituted $C_6$-$C_{30}$_aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, or substituted or unsubstituted $C_0$-$C_{20}$ amino; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

13. The quadridentate metal complex according to claim 12, wherein the $Z_4$ refers to O, $NR_{201}$, or $CR_{202}R_{203}$;

$Y_{13}$-$Y_{16}$ are, identically or differently on each occurrence, $CR_0$ or N;

and each of the $R_0$ and the $R_{201}$-$R_{209}$ is independently selected from hydrogen, deuterium, halogen, substituted or unsubstituted $C_1$-$C_8$ alkyl, substituted or unsubstituted $C_3$-$C_{10}$ cycloalkyl, substituted or unsubstituted $C_1$-$C_8$_heteroalkyl, substituted or unsubstituted $C_7$-$C_{10}$_aralkyl, substituted or unsubstituted $C_1$-$C_8$ alkoxy, substituted or unsubstituted $C_6$-$C_{10}$ aryloxy, substituted or unsubstituted $C_6$-$C_{10}$ aryl, and substituted or unsubstituted $C_3$-$C_{10}$ heteroaryl.

14. The quadridentate metal complex according to claim 1, having one of the following structural formulas:

CPD 1

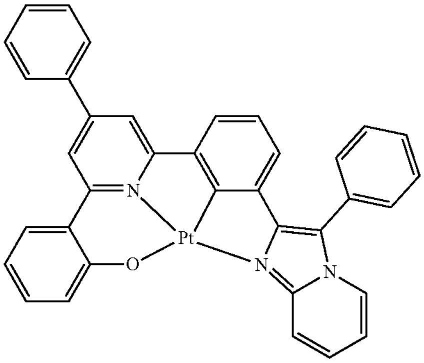

-continued
CPD 2
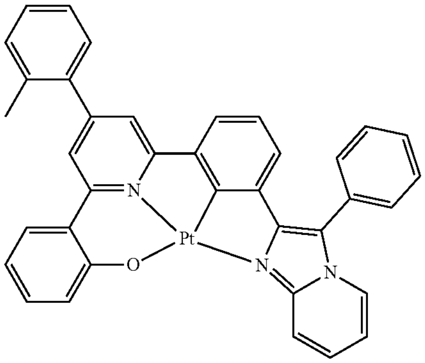
CPD 3
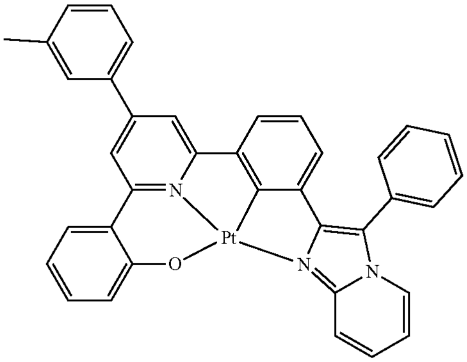
CPD 4
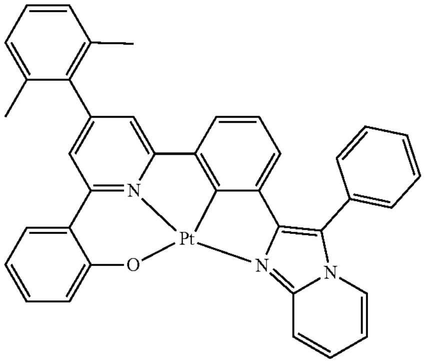
CPD 5
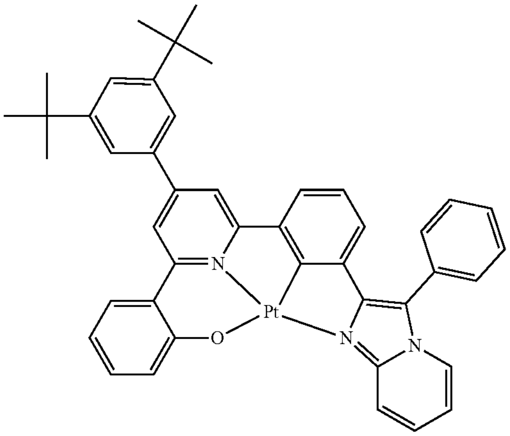
-continued
CPD 6
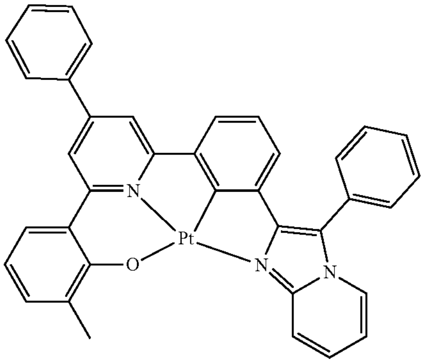
CPD 7
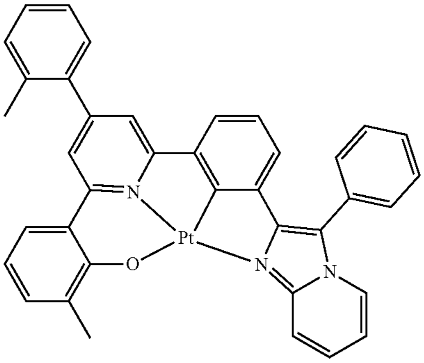
CPD 8
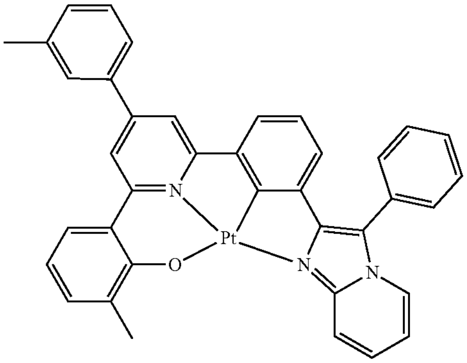
CPD 9
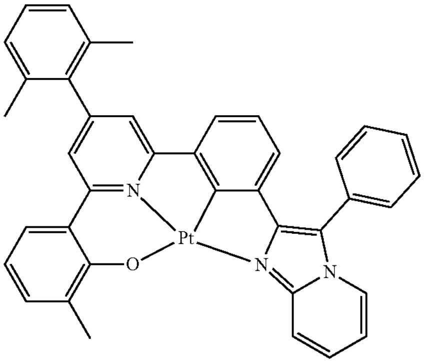

-continued
CPD 10
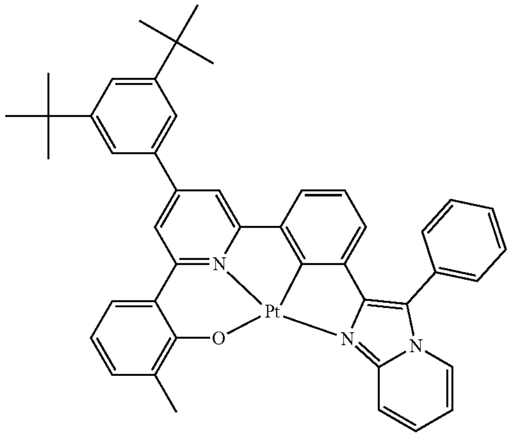
CPD 11
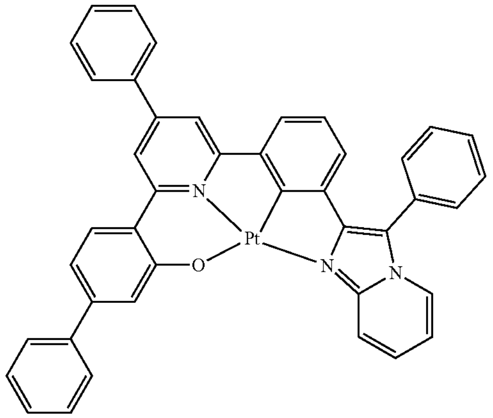
CPD 12
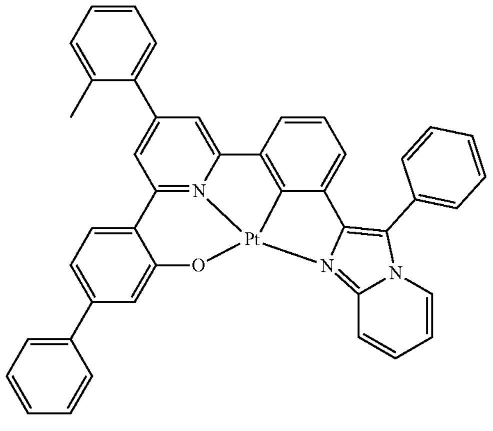
-continued
CPD 13
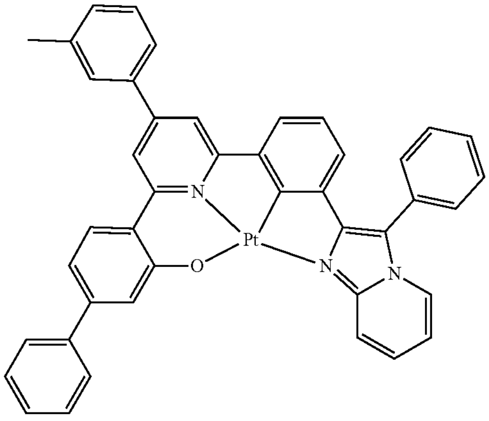
CPD 14
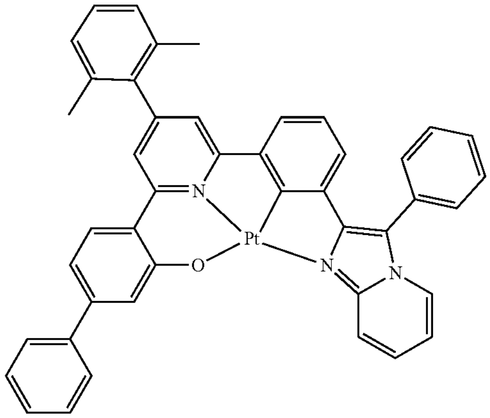
CPD 15
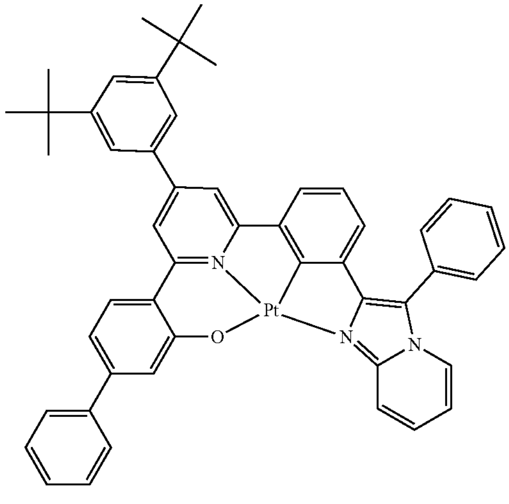

-continued
CPD 16
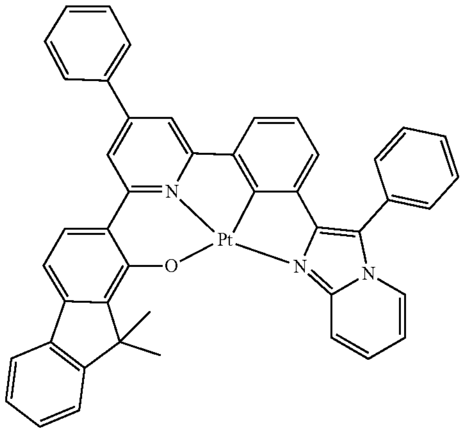
CPD 17
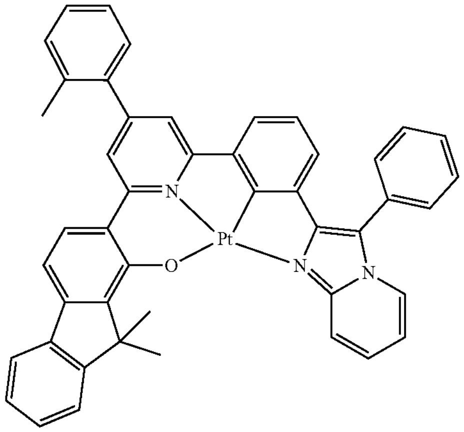
CPD 18
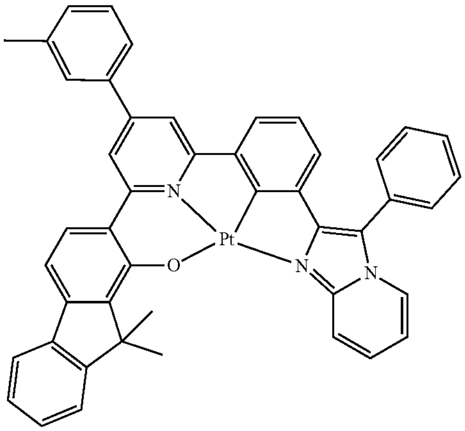
-continued
CPD 19
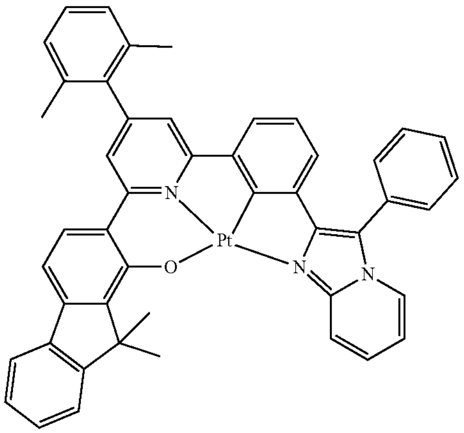
CPD 20
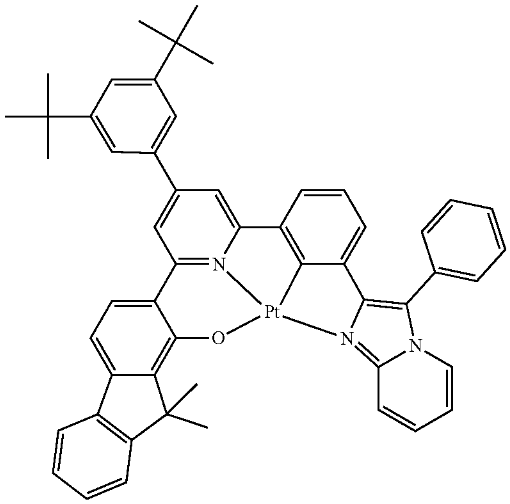
CPD 21
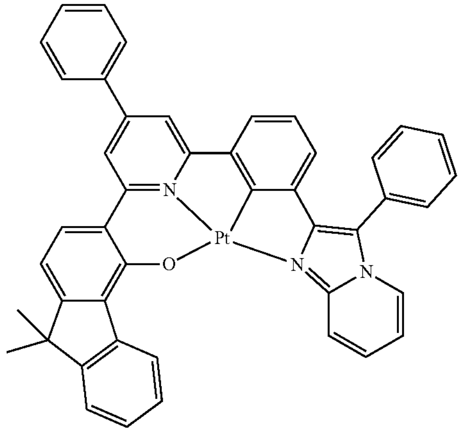

-continued
CPD 22
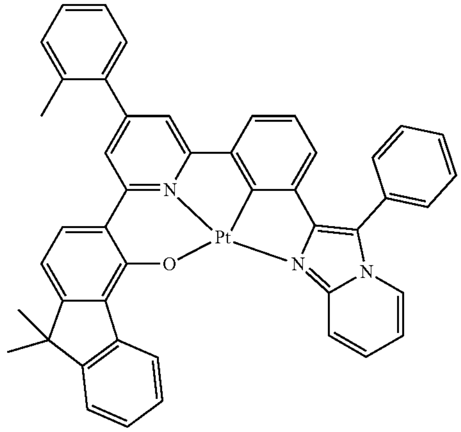
CPD 23
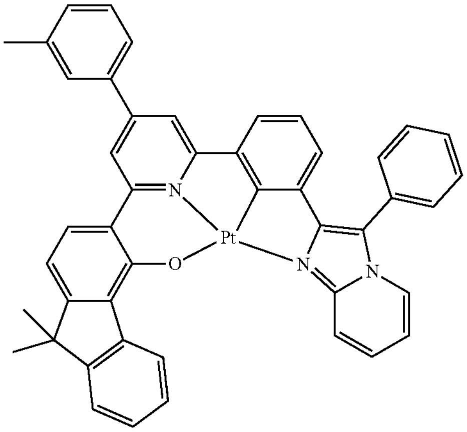
CPD 24
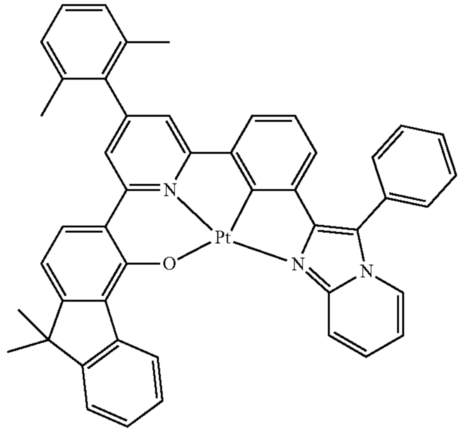
-continued
CPD 25
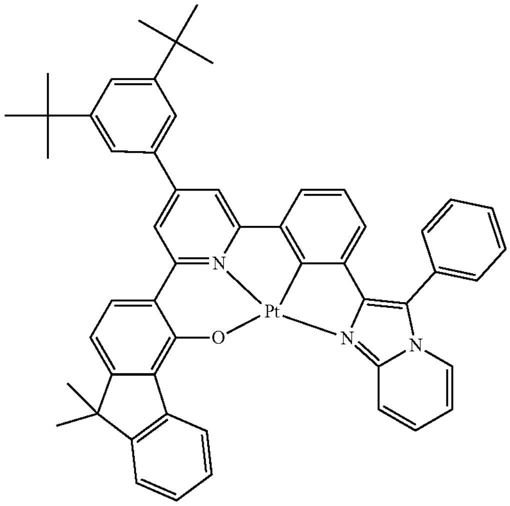
CPD 26
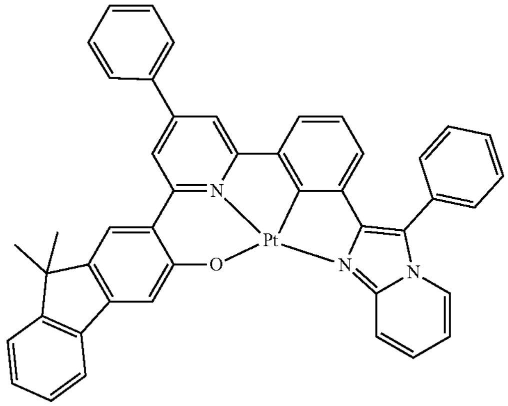
CPD 27
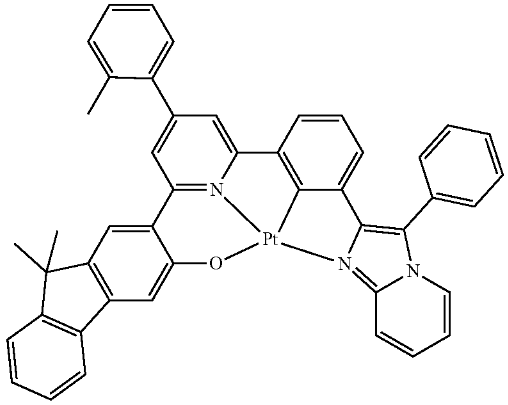

-continued
CPD 28
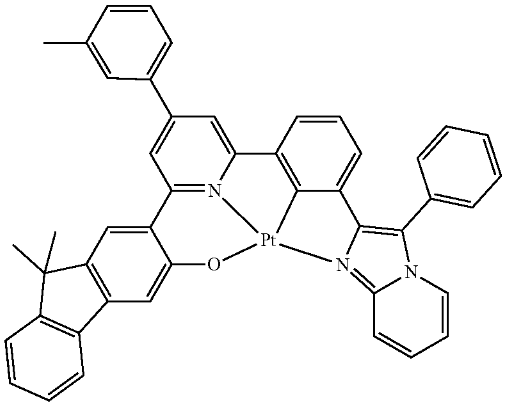
CPD 29
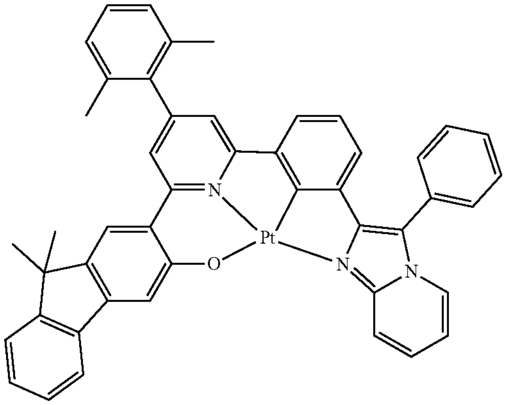
CPD 30
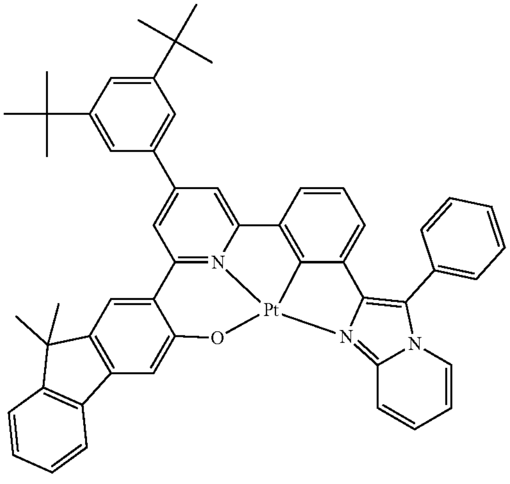
-continued
CPD 31
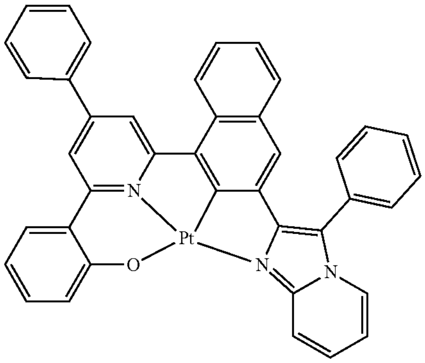
CPD 32
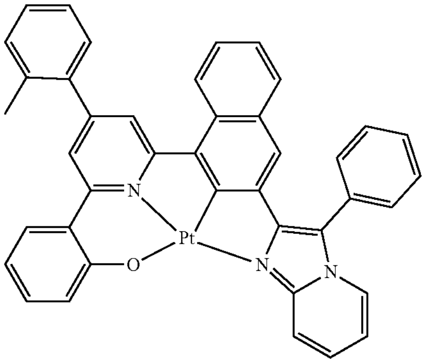
CPD 33
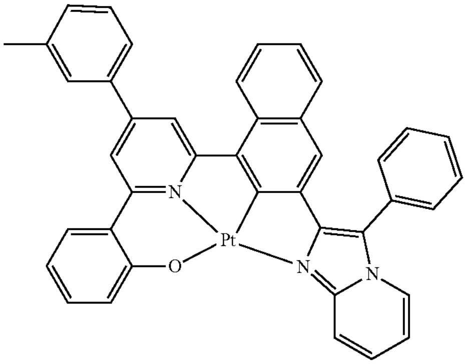
CPD 34
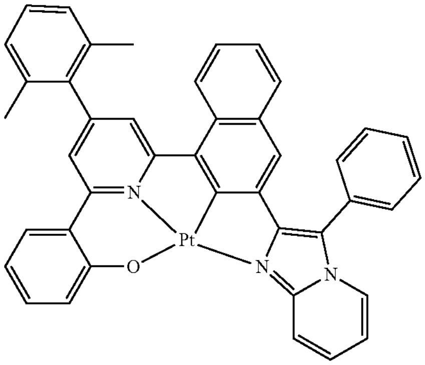

-continued
CPD 35
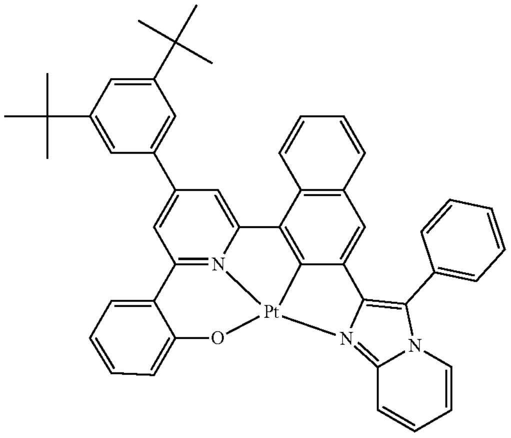
CPD 36
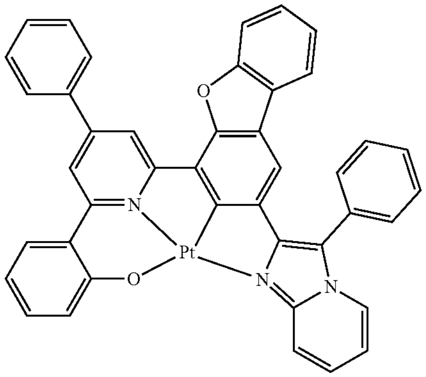
CPD 37
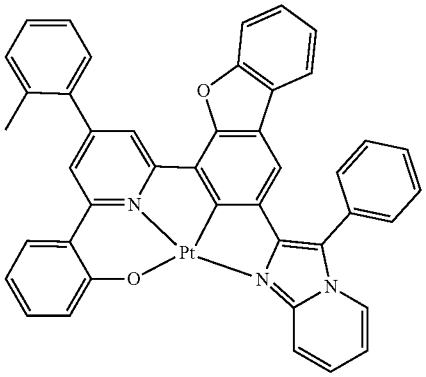
CPD 38
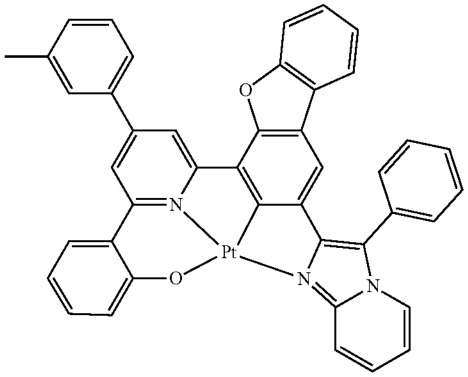
-continued
CPD 39
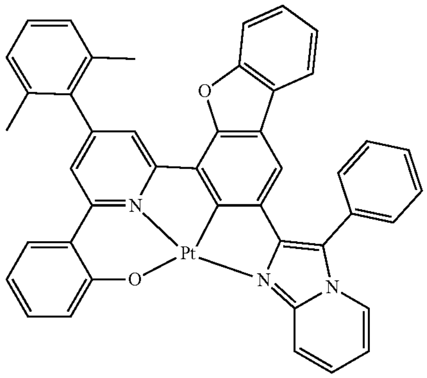
CPD 40
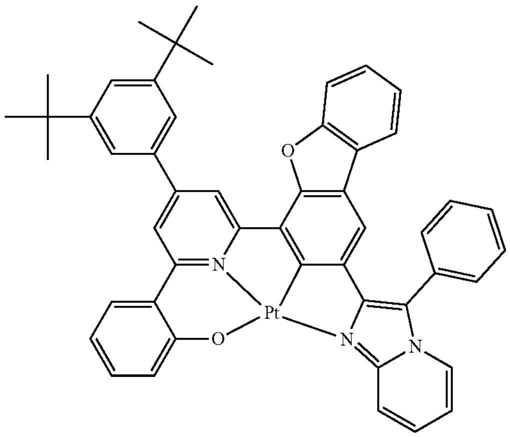
CPD 41
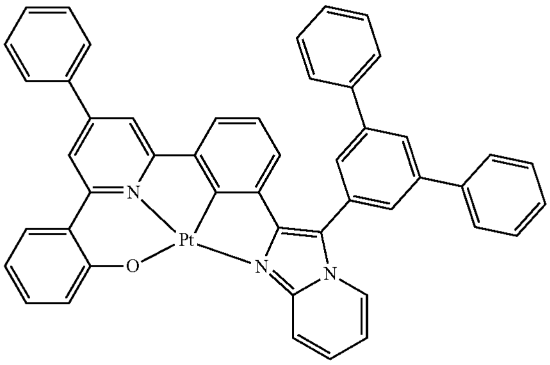
CPD 42
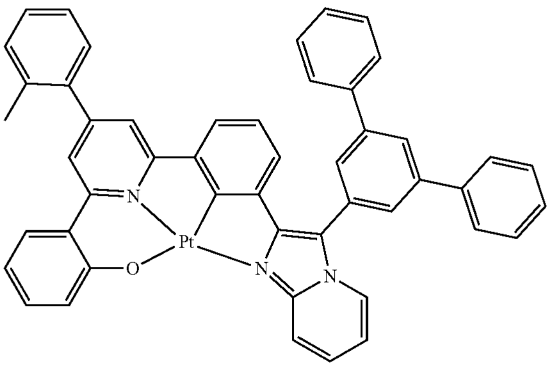

-continued
CPD 43
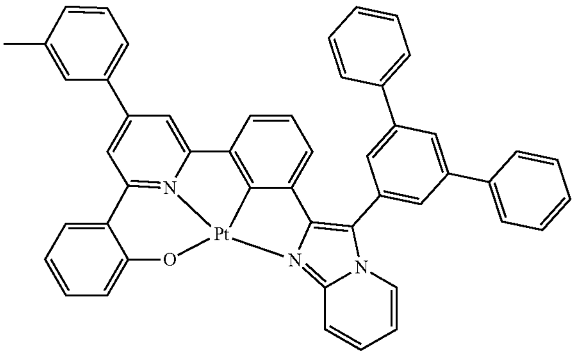
CPD 44
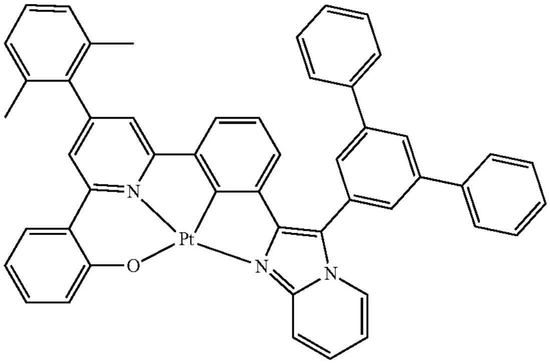
CPD 45
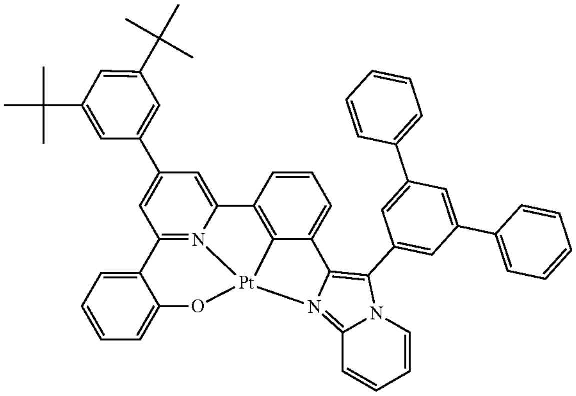
CPD 46
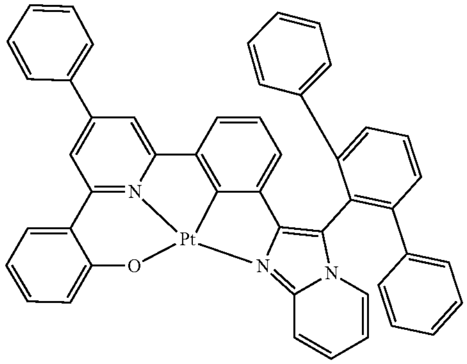
-continued
CPD 47
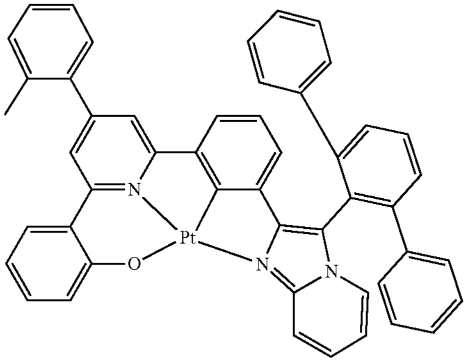
CPD 48
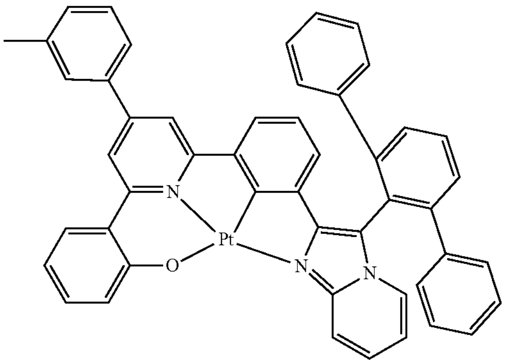
CPD 49
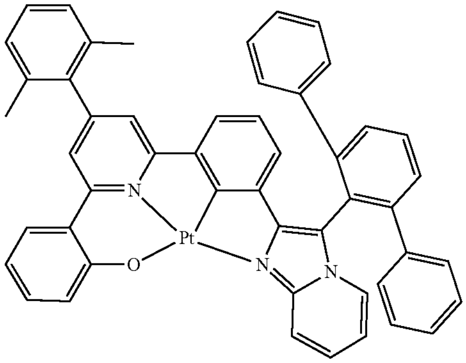
CPD 50
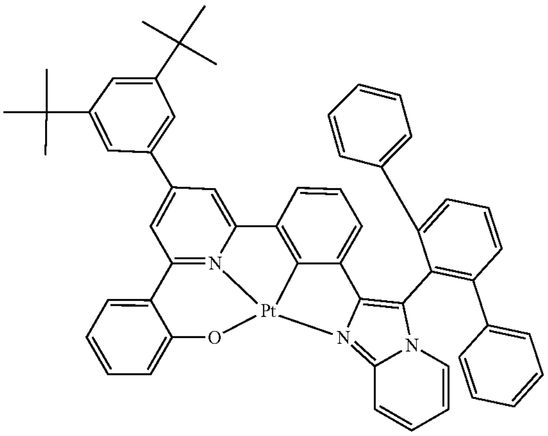

CPD 51
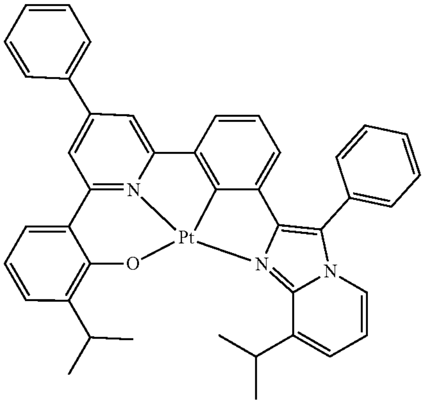
CPD 52
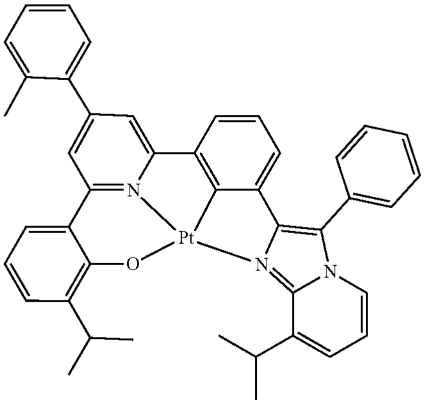
CPD 53
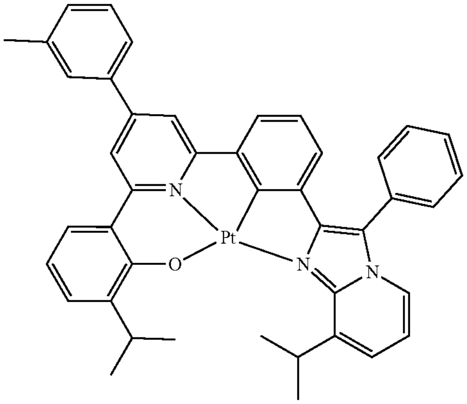
CPD 54
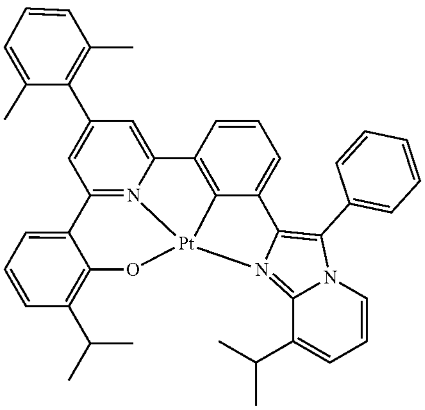
CPD 55
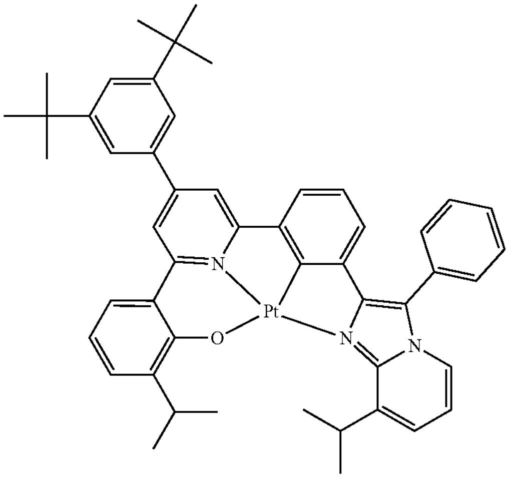
CPD 56
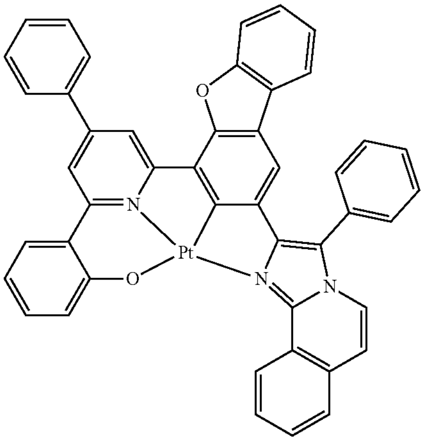
CPD 57
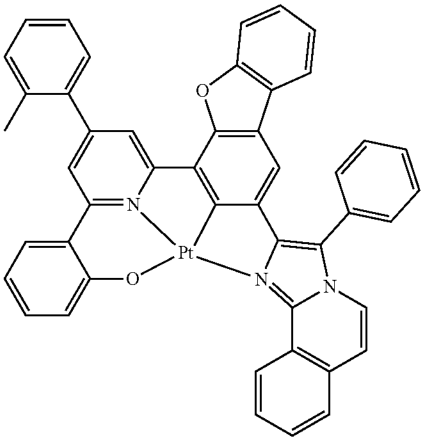

-continued
CPD 58
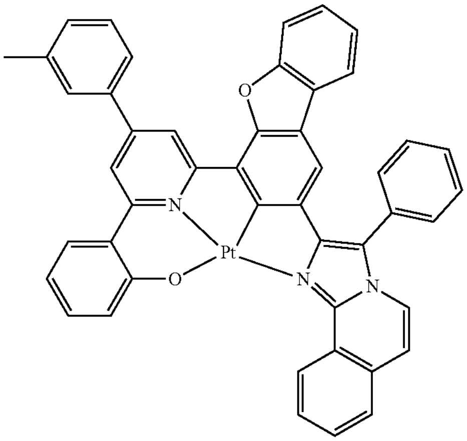
CPD 59
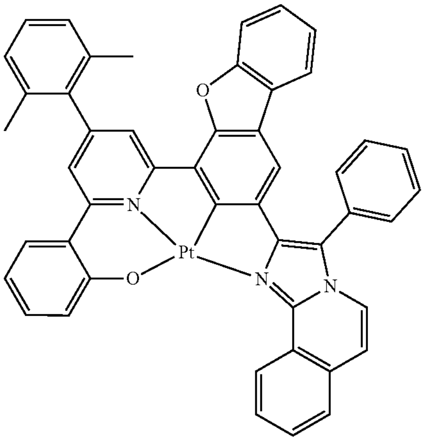
CPD 60
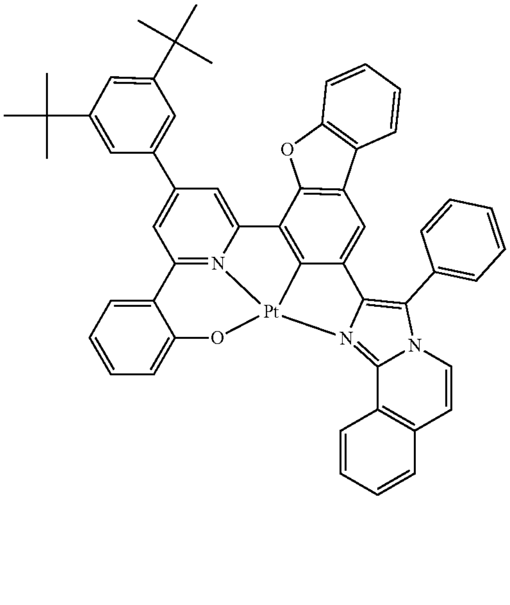
-continued
CPD 61
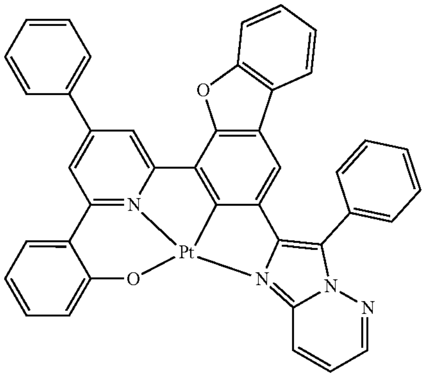
CPD 62
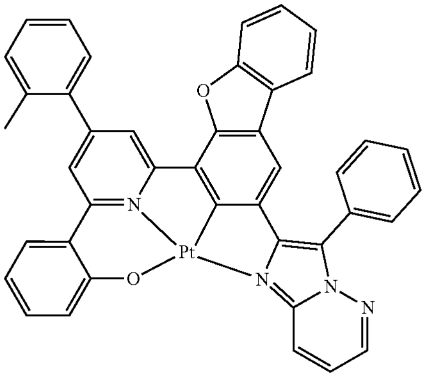
CPD 63
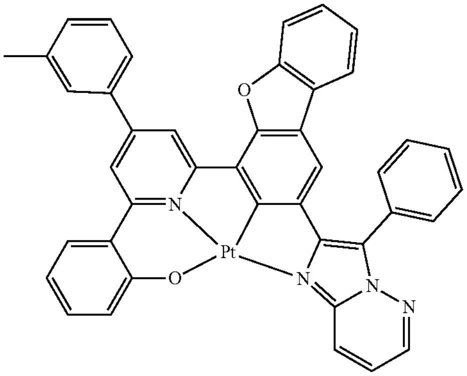
CPD 64
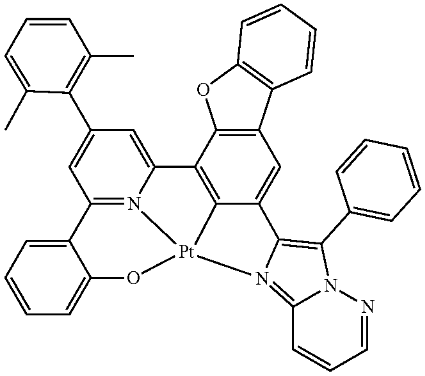

-continued
CPD 65
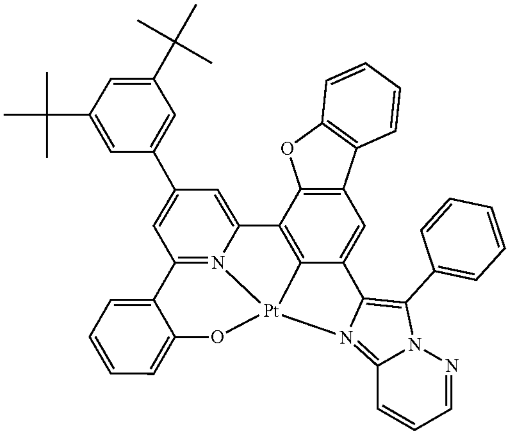
CPD 66
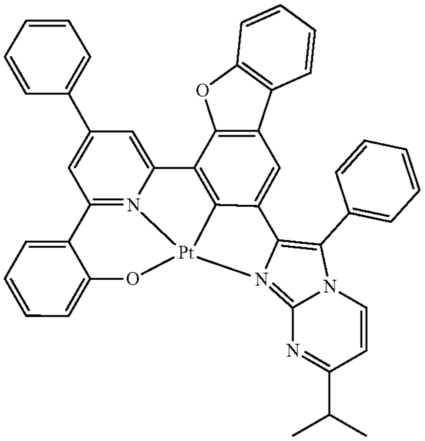
CPD 67
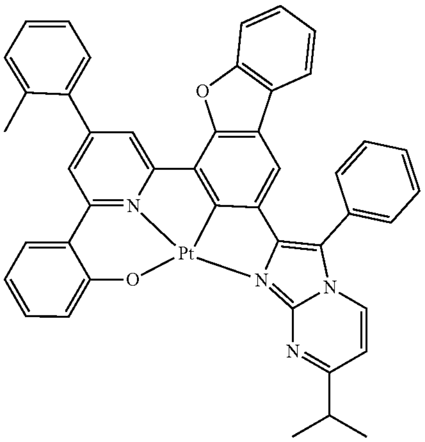
-continued
CPD 68
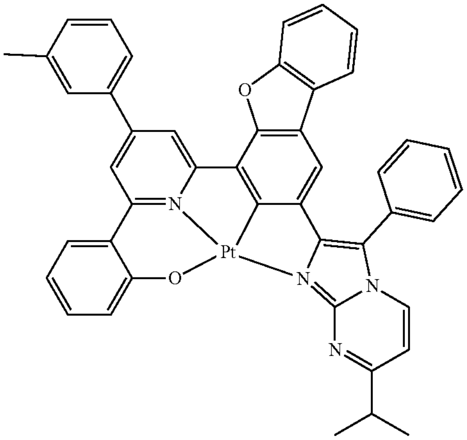
CPD 69
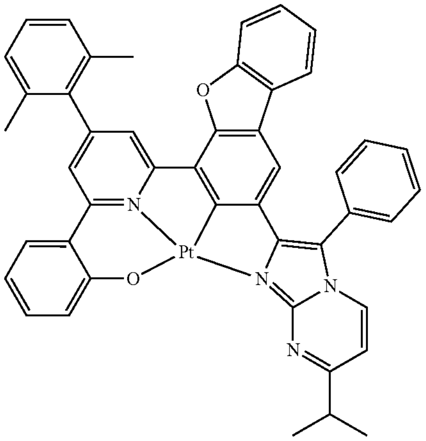
CPD 70
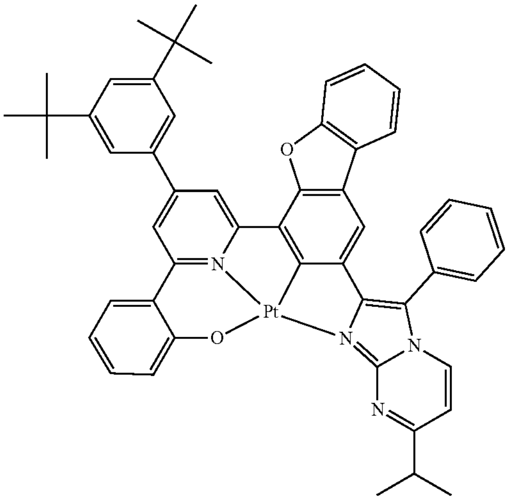

-continued
CPD 71
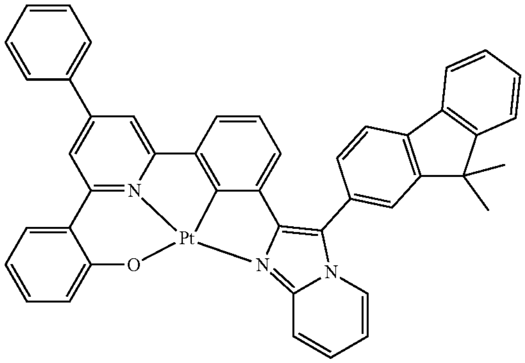
CPD 72
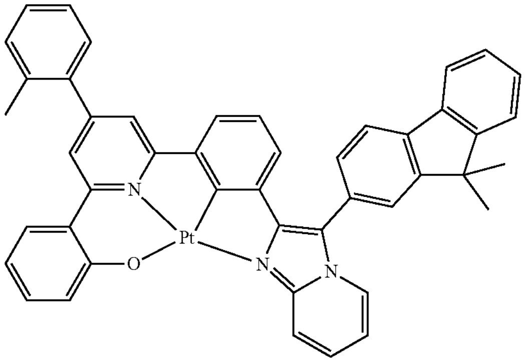
CPD 73
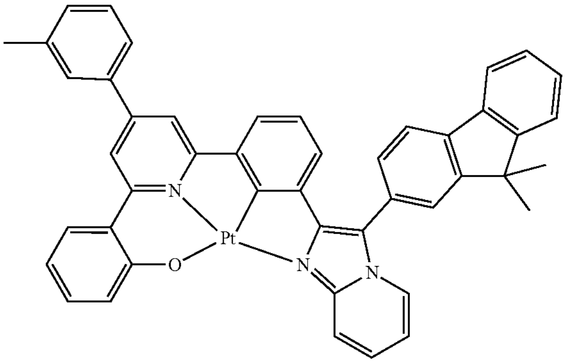
CPD 74
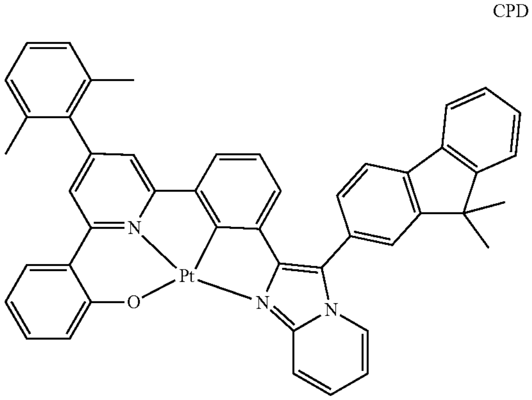
-continued
CPD 75
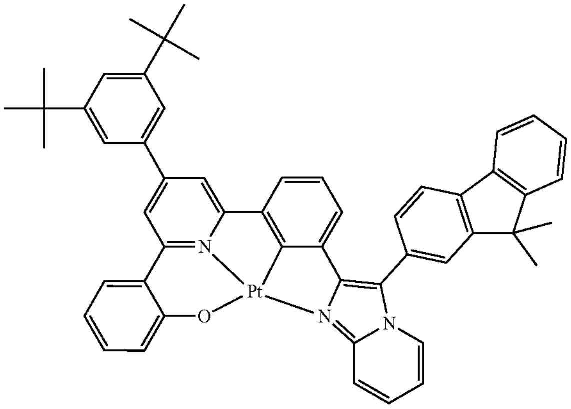
CPD 76
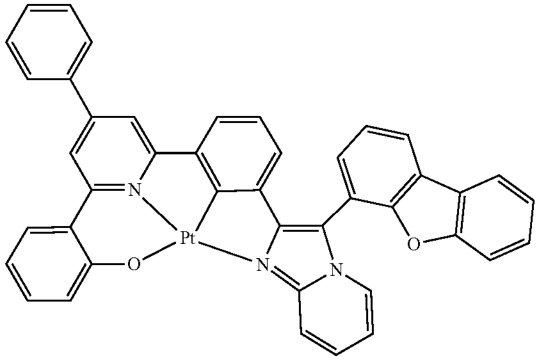
CPD 77
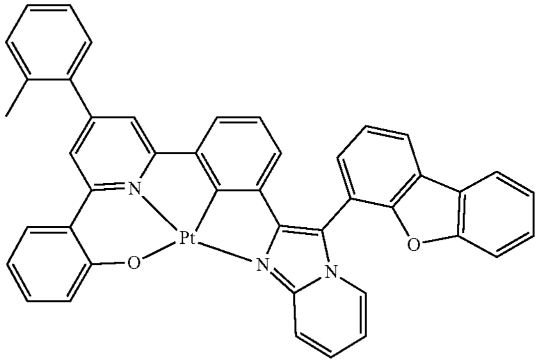
CPD 78
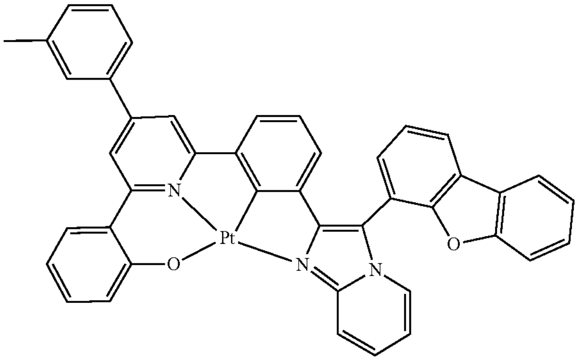

-continued
CPD 79
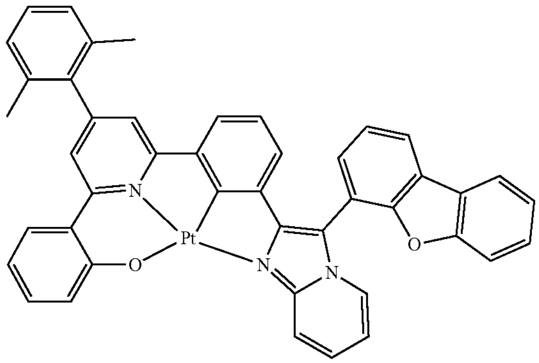
CPD 80
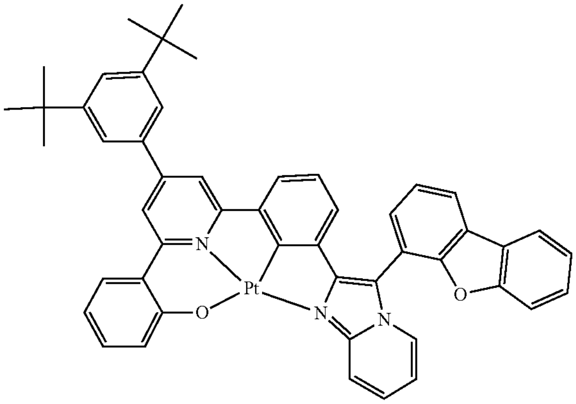
CPD 81
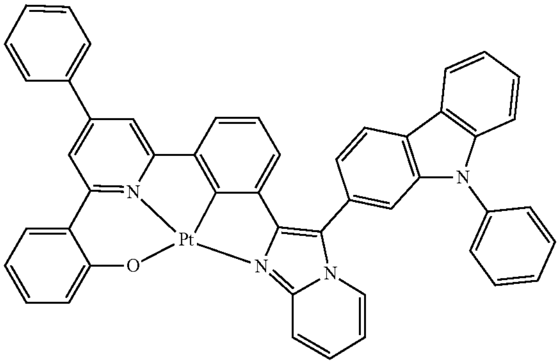
CPD 82
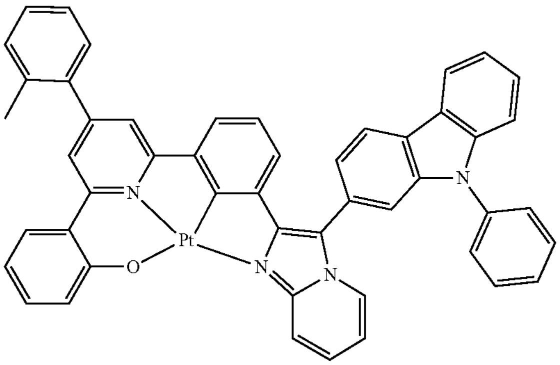
-continued
CPD 83
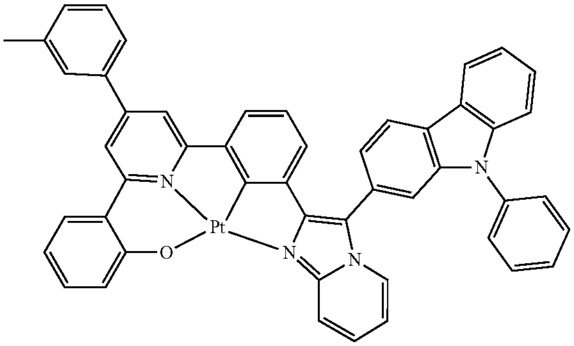
CPD 84
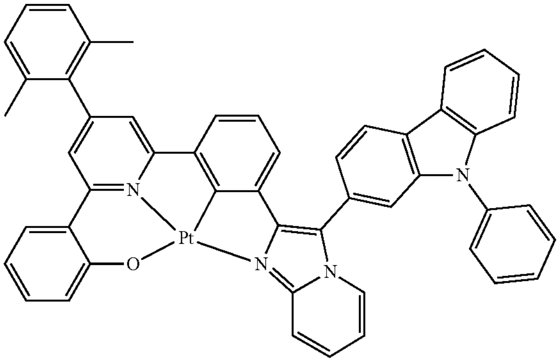
CPD 85
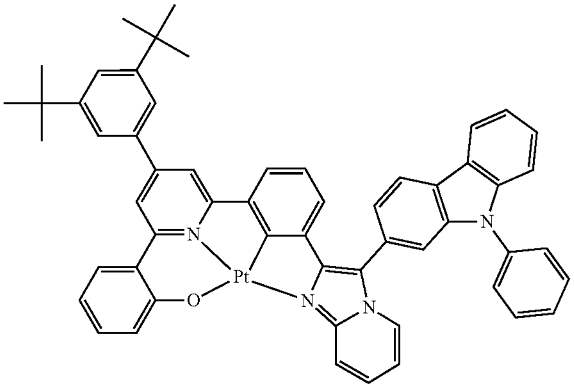
CPD 86
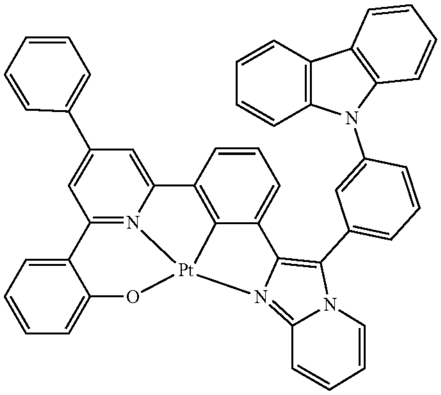

-continued
CPD 87
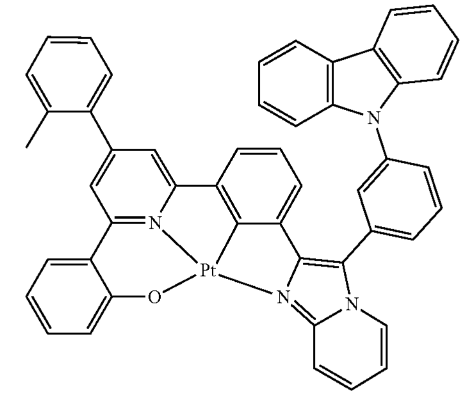
CPD 88
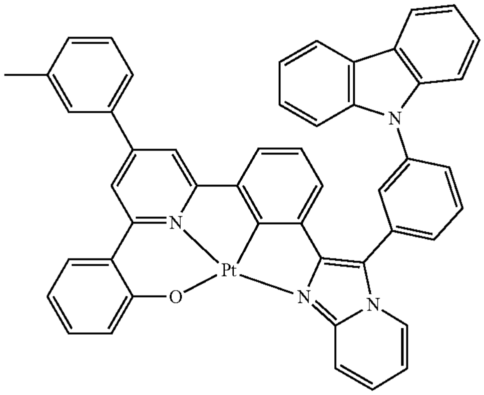
CPD 89
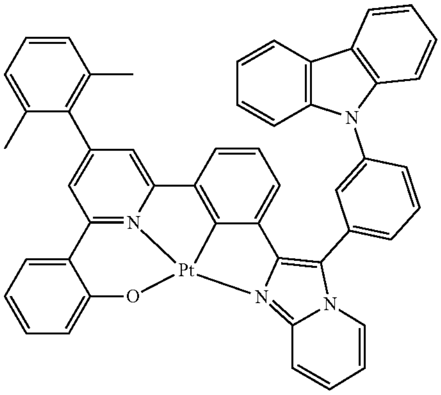
CPD 90
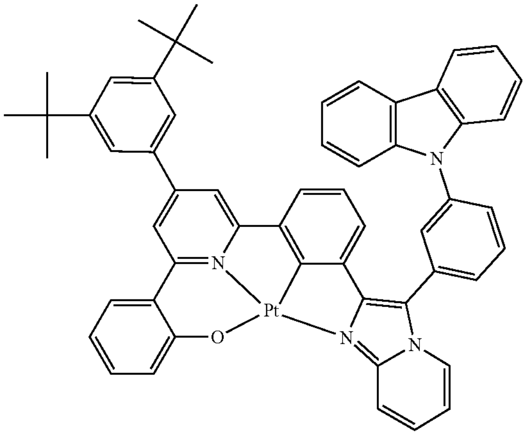
-continued
CPD 91
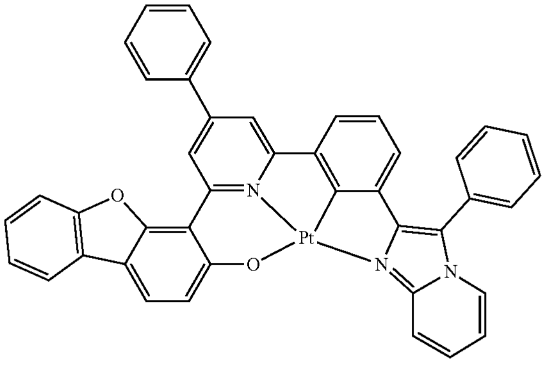
CPD 92
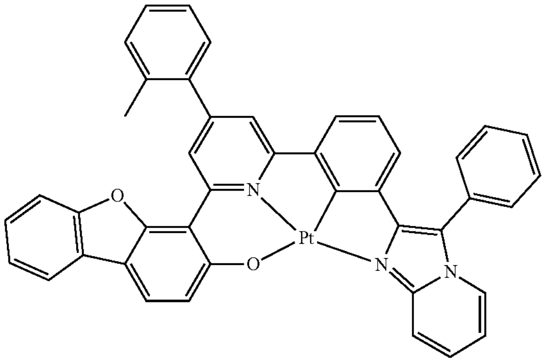
CPD 93
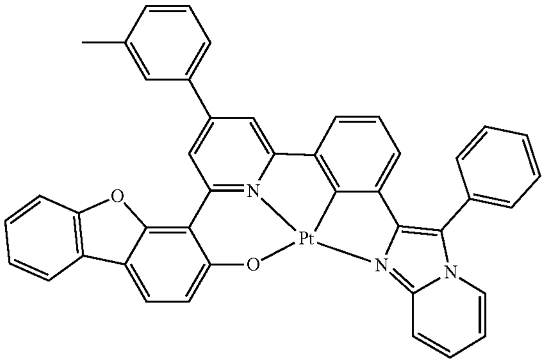
CPD 94
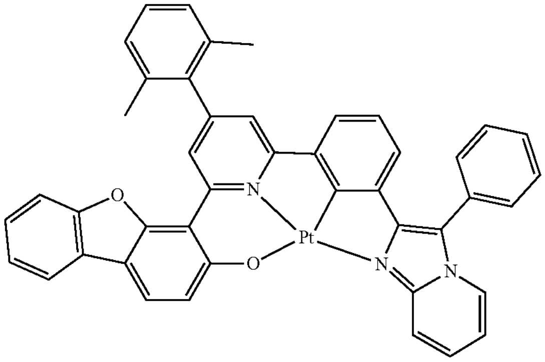

-continued
CPD 95
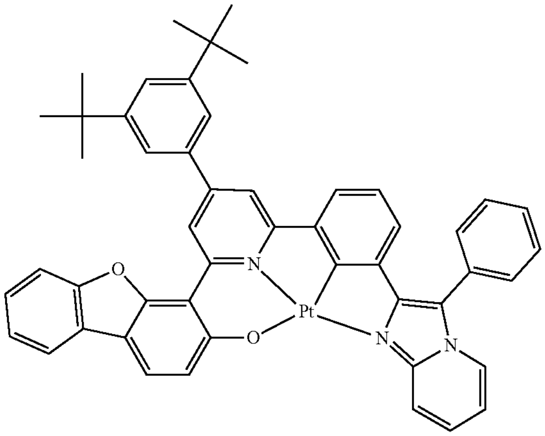
CPD 96
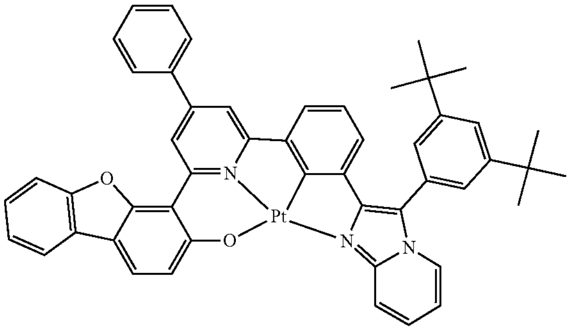
CPD 97
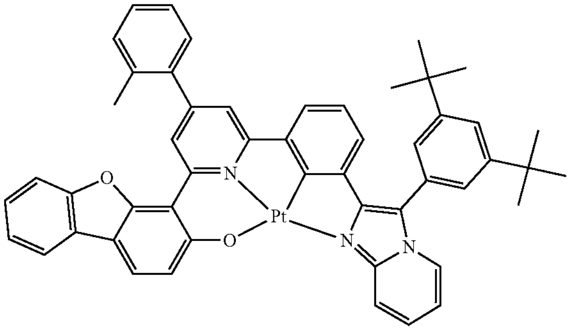
CPD 98
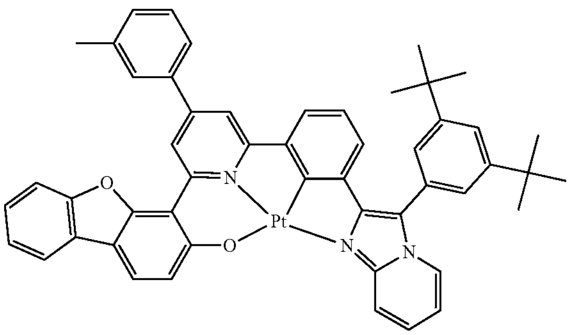
-continued
CPD 99
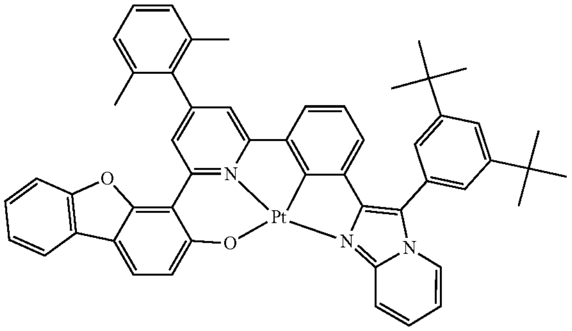
CPD 100
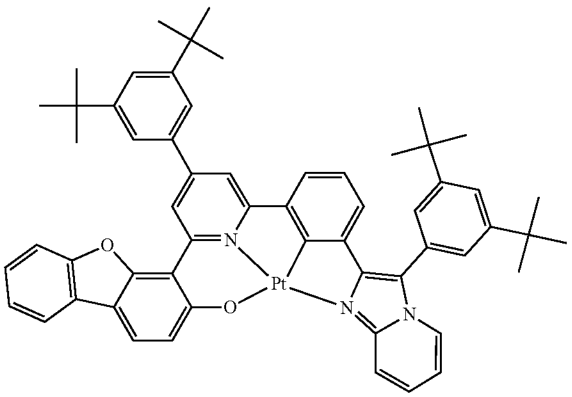
CPD 101
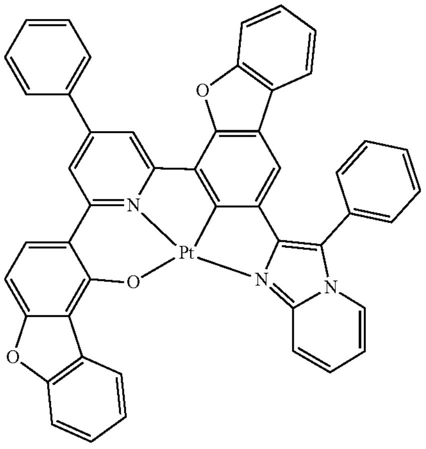

-continued
CPD 102
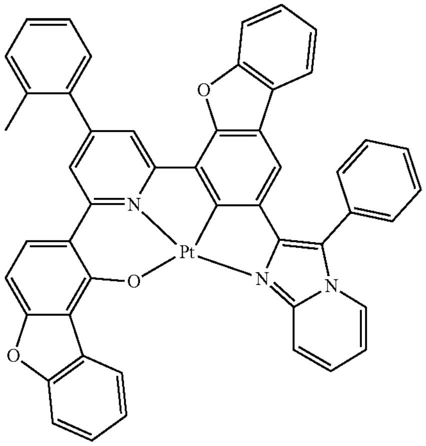
CPD 103
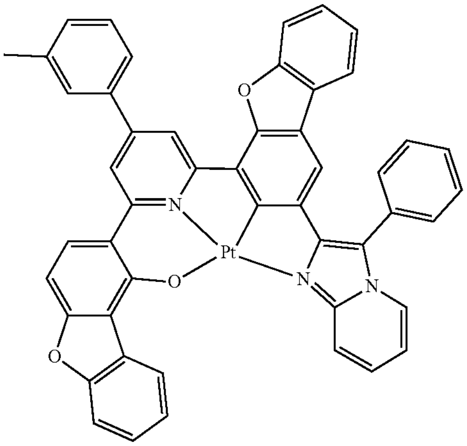
CPD 104
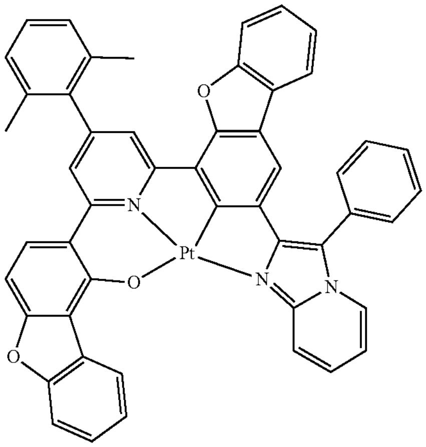
-continued
CPD 105
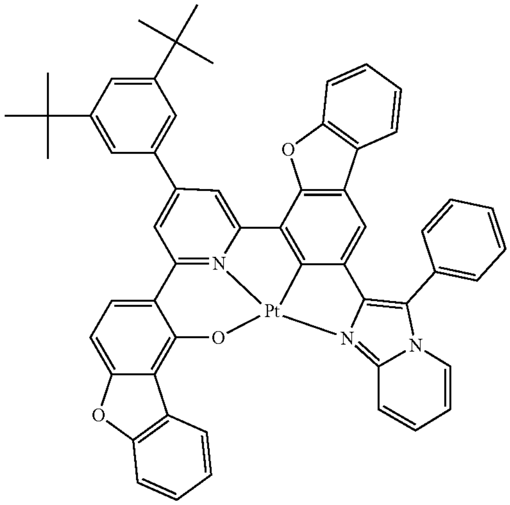
CPD 106
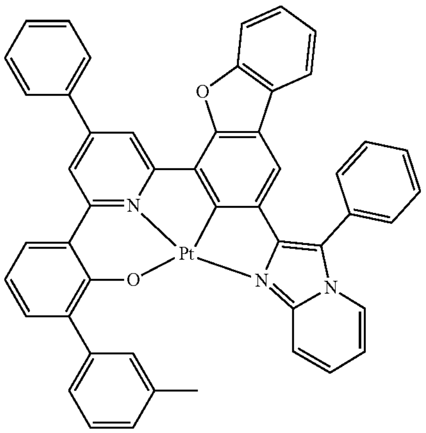
CPD 107
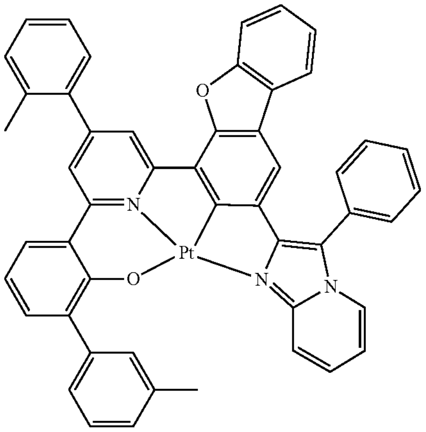

-continued

CPD 108

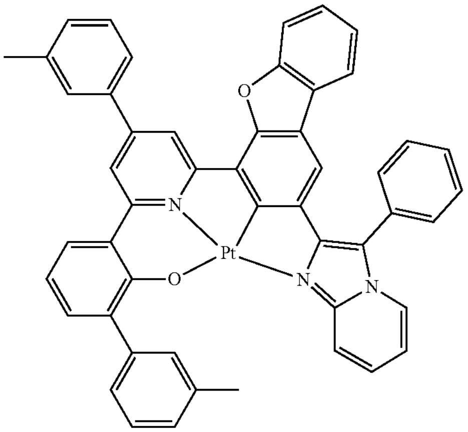

CPD 109

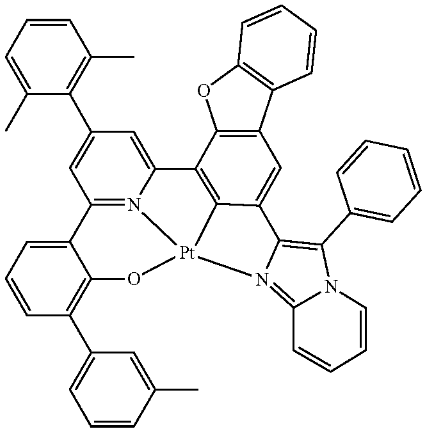

CPD 110

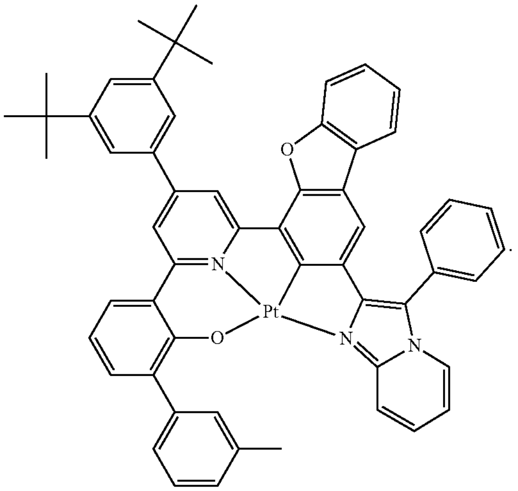

15. An electroluminescent device, comprising a cathode, an anode, and organic layers arranged between the cathode and the anode, wherein at least one of the organic layers comprises the quadridentate metal complex according to claim 1.

16. The electroluminescent device according to claim 15, wherein the organic layers comprise a light-emitting layer, and the quadridentate metal complex is used a doping material for a light-emitting material in the light-emitting layer; or the organic layers comprise a hole injection layer, and the quadridentate metal complex is used as a hole injection material for the hole injection layer.

17. The electroluminescent device according to claim 16, wherein the light-emitting material is a green light-emitting material, a yellow light-emitting material, or a red light-emitting material.

18. An electroluminescent device, comprising a cathode, an anode, and organic layers arranged between the cathode and the anode, wherein at least one of the organic layers comprises the quadridentate metal complex according to claim 2.

19. The quadridentate metal complex according to claim 2, wherein the $R_{12}$ and the $R_{13}$, or the $R_{13}$ and the $R_{14}$ are connected to form one of fused ring structures as shown in the following formula (4) to formula (7):

Formula (4)

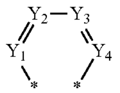

Formula (5)

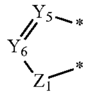

Formula (6)

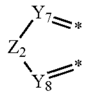

Formula (7)

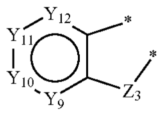

wherein

* refers to a connection position;

$Z_1$-$Z_3$ are selected from O, S, Se, NRx, or CRyRz;

$Y_1$-$Y_{12}$ are, identically or differently on each occurrence, $CR_0$ or N;

each of $R_0$, Rx, Ry, and Rz is independently selected from hydrogen, deuterium, halogen, cyano, nitrile, isonitrile, phosphino, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_1$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, or substituted or unsubstituted $C_0$-$C_{20}$ amino,; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

20. The quadridentate metal complex according to claim 3, wherein the $R_{12}$ and the $R_{13}$, or the $R_{13}$ and the $R_{14}$ are connected to form one of fused ring structures as shown in the following formula (4) to formula (7):

Formula (4)

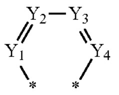

Formula (5)

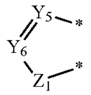

Formula (6)

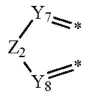

Formula (7)

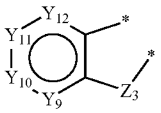

wherein

* refers to a connection position;

$Z_1$-$Z_3$ are selected from O, S, Se, NRx, or CRyRz;

$Y_1$-$Y_{12}$ are, identically or differently on each occurrence, $CR_0$ or N;

each of $R_0$, Rx, Ry, and Rz is independently selected from hydrogen, deuterium, halogen, cyano, nitrile, isonitrile, phosphino, substituted or unsubstituted $C_1$-$C_{20}$ alkyl, substituted or unsubstituted $C_3$-$C_{30}$ cycloalkyl, substituted or unsubstituted $C_1$-$C_{20}$ heteroalkyl, substituted or unsubstituted $C_7$-$C_{30}$ aralkyl, substituted or unsubstituted $C_1$-$C_{20}$ alkoxy, substituted or unsubstituted $C_6$-$C_{30}$ aryloxy, substituted or unsubstituted $C_2$-$C_{20}$ alkenyl, substituted or unsubstituted $C_3$-$C_{30}$ silyl, substituted or unsubstituted $C_6$-$C_{30}$ aryl, substituted or unsubstituted $C_3$-$C_{30}$ heteroaryl, substituted or unsubstituted $C_3$-$C_{30}$ arylsilyl, or substituted or unsubstituted $C_0$-$C_{20}$ amino,; or any two adjacent substituents may be connected to each other to form a ring structure or a fused ring structure; the "substituted" refers to substitution with deuterium, halogen, or $C_1$-$C_4$ alkyl; and a heteroatom in the heteroalkyl or heteroaryl comprises any one or more of S, O, and N.

* * * * *